United States Patent
Kimura

(10) Patent No.: US 10,008,547 B2
(45) Date of Patent: Jun. 26, 2018

(54) SEMICONDUCTOR DEVICE, DISPLAY DEVICE, AND ELECTRONIC DEVICE

(71) Applicant: Semiconductor Energy Laboratory Co., Ltd., Atsugi-shi, Kanagawa-ken (JP)

(72) Inventor: Hajime Kimura, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 70 days.

(21) Appl. No.: 14/945,726

(22) Filed: Nov. 19, 2015

(65) Prior Publication Data
US 2016/0155370 A1 Jun. 2, 2016

(30) Foreign Application Priority Data
Nov. 28, 2014 (JP) .................. 2014-240703

(51) Int. Cl.
*G09G 3/04* (2006.01)
*H01L 27/32* (2006.01)
*G09G 3/3258* (2016.01)

(52) U.S. Cl.
CPC .......... *H01L 27/32* (2013.01); *G09G 3/3258* (2013.01); *G09G 2300/043* (2013.01); *G09G 2300/0408* (2013.01); *G09G 2300/0413* (2013.01); *G09G 2320/045* (2013.01); *G09G 2360/16* (2013.01); *G09G 2380/02* (2013.01); *H01L 27/3262* (2013.01)

(58) Field of Classification Search
CPC combination set(s) only.
See application file for complete search history.

(56) References Cited

U.S. PATENT DOCUMENTS

| 6,229,508 B1 | 5/2001 | Kane |
| 7,088,052 B2 | 8/2006 | Kimura |
| 7,429,985 B2 | 9/2008 | Kimura et al. |
| 7,768,485 B2 | 8/2010 | Uchino et al. |

(Continued)

FOREIGN PATENT DOCUMENTS

| JP | H11-219146 A | 8/1999 |
| JP | 2003-195813 A | 7/2003 |

(Continued)

OTHER PUBLICATIONS

Seto Yasuhiro JP2009265459 English machine translation Apr. 28, 2009.*

(Continued)

*Primary Examiner* — Van N Chow
(74) *Attorney, Agent, or Firm* — Fish & Richardson P.C.

(57) ABSTRACT

A display device which can perform external correction in parallel with display operation is provided. The display device includes pixels arranged in a matrix and a reading circuit provided outside the pixels. The pixels each include a light-emitting element and a transistor that supplies a current to the light-emitting element. In this display device, in the case where all of a plurality of specific pixels are displayed in black, variation in current characteristics of a driving transistor is corrected by reading out data on current characteristics of the driving transistor included in a predetermined pixel among the plurality of pixels in an address period.

19 Claims, 40 Drawing Sheets

(56) References Cited

U.S. PATENT DOCUMENTS

| | | |
|---|---|---|
| 7,889,159 B2 | 2/2011 | Nathan et al. |
| 7,924,249 B2 | 4/2011 | Nathan et al. |
| 8,026,876 B2 | 9/2011 | Nathan et al. |
| 8,497,825 B2 | 7/2013 | Nathan et al. |
| 2014/0198092 A1 | 7/2014 | Azizi et al. |
| 2015/0187818 A1 | 7/2015 | Miyake et al. |
| 2015/0310793 A1 | 10/2015 | Kawashima et al. |
| 2015/0317028 A1 | 11/2015 | Takahashi et al. |
| 2015/0325172 A1 | 11/2015 | Koyama |
| 2016/0071446 A1 | 3/2016 | Miyake |
| 2016/0071447 A1 | 3/2016 | Takemura et al. |
| 2016/0071463 A1 | 3/2016 | Takahashi et al. |
| 2016/0093263 A1 | 3/2016 | Kimura et al. |
| 2016/0117020 A1 | 4/2016 | Takemura |
| 2016/0232834 A1 | 8/2016 | Kimura et al. |

FOREIGN PATENT DOCUMENTS

| | | |
|---|---|---|
| JP | 2007-310311 A | 11/2007 |
| JP | 2008-233933 A | 10/2008 |
| JP | 2009-265459 A | 11/2009 |

OTHER PUBLICATIONS

Yoon.J et al., "55-inch OLED TV using Optimal Driving Method for Large-Size Panel based on InGaZnO TFTs", SID Digest '14 : SID International Symposium Digest of Technical Papers, Jun. 3, 2014, pp. 849-852.

\* cited by examiner

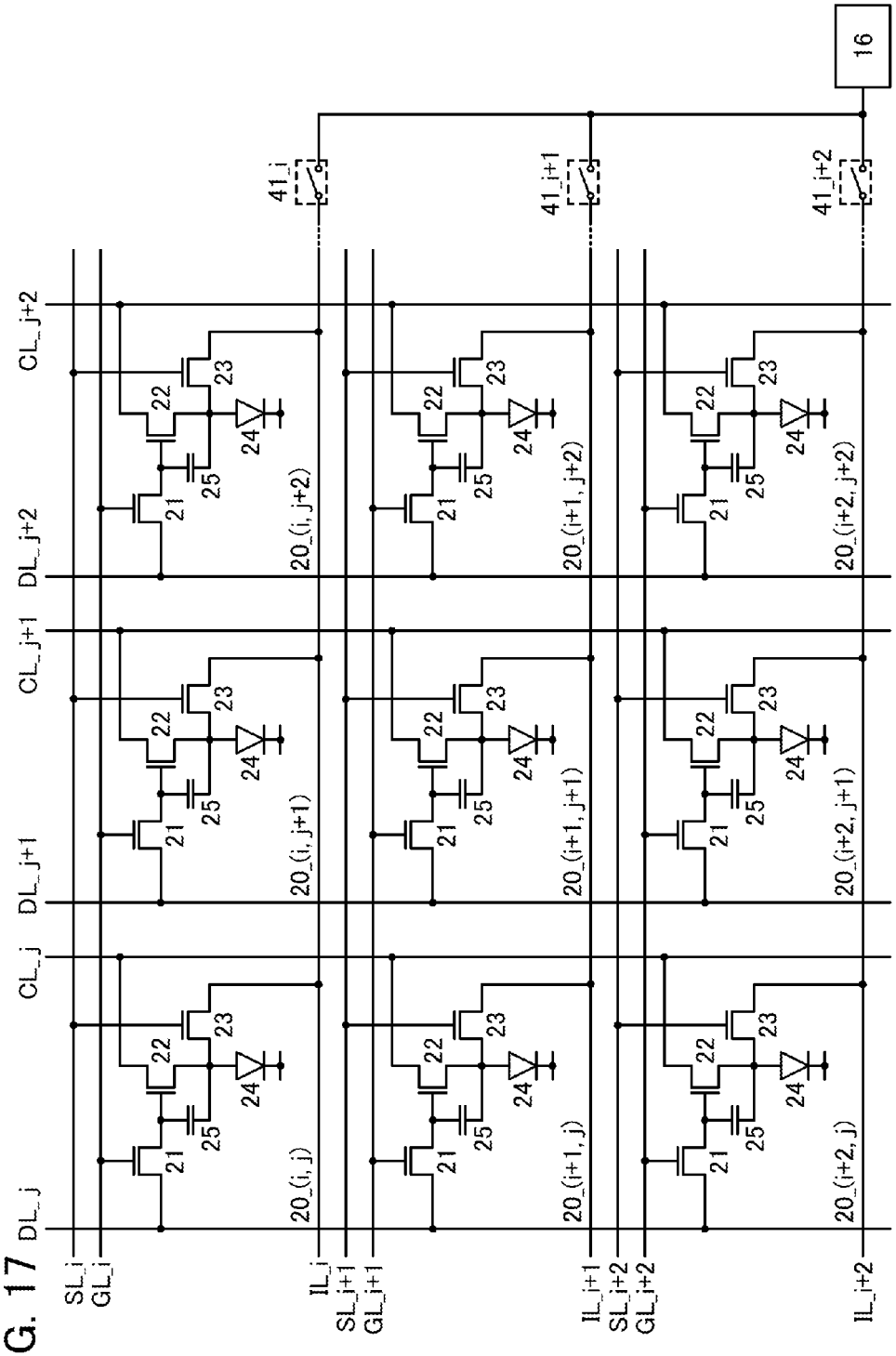

SEMICONDUCTOR DEVICE, DISPLAY DEVICE, AND ELECTRONIC DEVICE

BACKGROUND OF THE INVENTION

1. Field of the Invention

One embodiment of the present invention relates to a semiconductor device, a display device, an electronic device, a driving method thereof, or a manufacturing method thereof.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specific examples of the technical field of one embodiment of the present invention disclosed in this specification include a light-emitting device, a power storage device, an imaging device, a memory device, a method for driving any of them, and a method for manufacturing any of them.

2. Description of the Related Art

In recent years, display devices have been used for various electronic devices such as television receivers, personal computers, and smartphones, and higher performance of the display devices in various aspects such as higher definition and lower power consumption has been achieved.

As such display devices, active matrix display devices in each of which a plurality of pixels are arranged in a matrix and are controlled by transistors provided in the pixels have been often used. In the active matrix display device, each pixel is controlled by a transistor, so that variation in transistor characteristics among pixels or deterioration in transistor characteristics causes variation in display among the pixels. Thus, display unevenness and image burn-in may be caused.

In an active matrix display device in which a light-emitting element is used as a display element, a driving transistor which controls a current to be supplied to the light-emitting element in accordance with an image signal is provided. If at least one of the threshold voltage, the mobility, the channel length, the channel width, and the like of the driving transistor varies among pixels, luminance of a light-emitting element varies among the pixels.

As a method for preventing such variation in luminance of light-emitting elements, a method for correcting variation in the threshold voltages of driving transistors in pixels (hereinafter also referred to as internal correction) has been suggested (Patent Document 1).

Furthermore, another method has been suggested in which the threshold voltage of a driving transistor is read out to the outside of a pixel and a signal for correcting variation in the threshold voltage is input (hereinafter also referred to as external correction) (Patent Document 2).

REFERENCE

Patent Document

[Patent Document 1] Japanese Published Patent Application No. 2008-233933
[Patent Document 2] Japanese Published Patent Application No. 2003-195813

SUMMARY OF THE INVENTION

In the case of performing external correction, there is a case in which a current flowing through a transistor is output to the outside of a pixel. Alternatively, there is a case in which a potential of a terminal of a transistor is output to the outside of a pixel. When the external correction is performed while display operation is performed, a current supplied to a light-emitting element often changes. Thus, when the external correction is performed while the display operation is performed, display changes unintentionally, in some cases. For this reason, it is sometimes difficult to perform the external correction in parallel with the display operation of a display device. Furthermore, in the case where the external correction is performed in a period during which the display operation of the display device is not performed, there has been a problem in that a period for the correction is increased because the correcting operation needs to be performed for a considerable number of pixels.

An object of one embodiment of the present is to provide a novel semiconductor device, a novel display device, a driving method of the novel semiconductor device, a driving method of the novel display device, or the like.

An object of one embodiment of the present invention is to provide a display device or the like which can perform external correction in parallel with display operation. An object of one embodiment of the present invention is to provide a driving method of the display device or the like which can perform external correction in parallel with display operation. An object of one embodiment of the present invention is to provide a display device in which display unevenness is suppressed, and a driving method thereof. An object of one embodiment of the present invention is to provide a display device capable of high definition display, and a driving method thereof. An object of one embodiment of the present invention is to provide a semiconductor device which can reduce adverse effects due to variation in transistor characteristics, and a driving method thereof. An object of one embodiment of the present invention is to provide a semiconductor device which can reduce adverse effects due to variation in the threshold voltages of transistors, and a driving method thereof. An object of one embodiment of the present invention is to provide a semiconductor device which can reduce adverse effects due to variation in the motilities of transistors, and a driving method thereof.

Note that the objects of one embodiment the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention solves at least one of the aforementioned objects and the other objects.

One embodiment of the present invention is a semiconductor device including a first pixel and a second pixel. The first pixel includes a first transistor and a first light-emitting element, the second pixel includes a second transistor and a second light-emitting element, the first light-emitting element is electrically connected to the first transistor, the second light-emitting element is electrically connected to the second transistor, the semiconductor device is configured to perform a first operation of inputting a signal for reading out data on current characteristics of the first transistor to the first pixel, and the semiconductor device is configured to perform a second operation of reading out the data on current characteristics of the first transistor and inputting a data signal (a video signal) to the second pixel.

One embodiment of the present invention is a semiconductor device including a first pixel, a second pixel, and a third pixel. The first pixel includes a first transistor and a first light-emitting element, the second pixel includes a second transistor and a second light-emitting element, the third pixel includes a third transistor and a third light-emitting element, the first light-emitting element is electrically connected to the first transistor, the second light-emitting element is electrically connected to the second transistor, the third light-emitting element is electrically connected to the third transistor, the first pixel and the third pixel are electrically connected to a same selection line, the semiconductor device is configured to perform a first operation of inputting a signal for reading out data on current characteristics of the first transistor to the first pixel and inputting a signal for making a non-display state of the third pixel to the third pixel, and the semiconductor device is configured to perform a second operation of reading out the data on current characteristics of the first transistor and inputting a data signal (a video signal) to the second pixel.

One embodiment of the present invention is the semiconductor device having the above-described structure, in which the first transistor and the third transistor are electrically connected to a same wiring, and the reading out of the data on current characteristics is performed through the wiring.

One embodiment of the present invention is the semiconductor device having the above-described structure, in which the inputting of the data signal (the video signal) to the second pixel is performed in a period in which the reading out of the data on current characteristics of the first transistor is performed.

One embodiment of the present invention is the semiconductor device having the above-described structure, in which the reading out of the data on current characteristics is performed from a period when the second operation is performed until the first pixel is selected in a next frame period (not including the time when the first pixel is selected in the next frame period).

One embodiment of the present invention is the semiconductor device having the above-described structure, in which the data on current characteristics is a current that flows through the first transistor or a threshold voltage of the first transistor.

One embodiment of the present invention is a display device including the above-described semiconductor device and a CPU, an image processing circuit, or a memory.

One embodiment of the present invention is an electronic device including the above-described semiconductor device or the above-described display device; and a housing, a microphone, a speaker, or an operation key.

Note that other embodiments of the present invention will be shown in the description of embodiments below and the drawings.

With one embodiment of the present invention, a novel semiconductor device, a novel display device, a driving method of the novel semiconductor device, a driving method of the novel display device, or the like can be provided.

With one embodiment of the present invention, a display device or the like which can perform external correction in parallel with display operation, can be provided. With one embodiment of the present invention, a driving method of the display device or the like which can perform external correction in parallel with display operation, can be provided. With one embodiment of the present invention, a display device in which display unevenness is suppressed and a driving method thereof can be provided. With one embodiment of the present invention, a display device capable of high definition display and a driving method thereof can be provided. With one embodiment of the present invention, a semiconductor device which can reduce adverse effects due to variation in transistor characteristics and a driving method thereof can be provided. With one embodiment of the present invention, a semiconductor device which can reduce adverse effects due to variation in the threshold voltages of transistors and a driving method thereof can be provided. With one embodiment of the present invention, a semiconductor device which can reduce adverse effects due to variation in the mobilities of transistors and a driving method thereof can be provided.

Note that the effects of one embodiment of the present invention are not limited to the above effects. The effects described above do not disturb the existence of other effects. The other effects are not described above and will be described below. The other effects will be apparent from and can be derived from the description of the specification, the drawings, and the like by those skilled in the art. One embodiment of the present invention has at least one of the aforementioned effects and the other effects. Accordingly, in some cases, one embodiment of the present invention does not have the aforementioned effects.

BRIEF DESCRIPTION OF THE DRAWINGS

In the accompanying drawings:

FIG. 17 is a circuit diagram for explaining one embodiment of the present invention;

DETAILED DESCRIPTION OF THE INVENTION

Figure 1A:
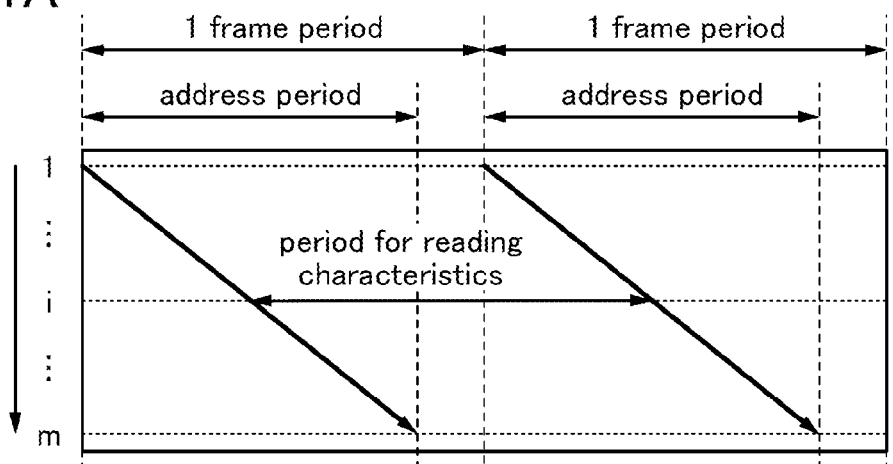
FIGS. 1A to 1D are timing charts for explaining one embodiment of the present invention.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In this specification and the like, ordinal numbers such as first, second, and third are used in order to avoid confusion among components. Thus, the terms do not limit the number or order of components. For example, in the present specification and the like, a "first" component in one embodiment can be referred to as a "second" component in other embodiments or claims. Furthermore, in the present specification and the like, a "first" component in one embodiment can be referred to without the ordinal number in other embodiments or claims.

The same elements or elements having similar functions, elements formed using the same material, elements formed at the same time, or the like in the drawings are denoted by the same reference numerals, and the description thereof is not repeated in some cases.

In this specification and the like, when it is explicitly described that X and Y are connected, the case where X and Y are electrically connected, the case where X and Y are functionally connected, and the case where X and Y are directly connected are included therein. Accordingly, another element may be provided between elements having a connection relation illustrated in drawings and texts, without limitation to a predetermined connection relation, for example, the connection relation illustrated in the drawings and the texts.

Here, X and Y each denote an object (e.g., a device, an element, a circuit, a wiring, an electrode, a terminal, a conductive film, a layer, or the like).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that a switch is controlled to be on or off That is, a switch has a function of becoming conducting or not conducting (being turned on or off) to determine whether a current flows therethrough or not. Alternatively, the switch has a function of selecting and changing a current path. The case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y, even when another circuit is provided between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X the source (or the first terminal or the like) of the transistor, the drain (or the second terminal or the like) of the transistor, and Y are electrically connected to each other in this order", "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case in which one conductive film has functions of a plurality of components.

Embodiment 1

In this embodiment, a configuration of a semiconductor device according to one embodiment of the disclosed invention and a driving method thereof will be described with reference to FIGS. 1A to 1D to FIGS. 23A and 23B.

<Method of External Correction>

A display device of this embodiment includes a plurality of pixels arranged in a matrix with m rows and n columns (m and n are each an integer greater than or equal to 2). Furthermore, each of the pixels includes a light-emitting element and a transistor which supplies a current to the light-emitting element (hereinafter also referred to as a driving transistor). Furthermore, the display device includes a circuit (also referred to as a reading circuit) which is configured to read out data on current characteristics of the driving transistor to the outside of a pixel portion provided with the pixels. Examples of the data on current characteristics include a current value at the time when a predetermined voltage is supplied to the driving transistor, the threshold voltage of the driving transistor, and a voltage determined in accordance with the threshold voltage. Note that the reading circuit may be provided in a display device, a flexible printed circuit (FPC) connected to a display device, or a display module.

Note that the reading circuit has, for example, a function of reading out data from a pixel (e.g., a potential or a current). Note that the reading circuit may have another function. For example, the reading circuit may have a function of supplying a predetermined potential to a pixel. The reading circuit may have a function of holding data. The reading circuit may have a function of converting an analog signal into a digital signal. Thus, the reading circuit is simply referred to as a circuit in some cases. For example, the reading circuit is referred to as a first circuit, a second circuit, or the like in some cases.

The transistor such as the driving transistor has, for example, a function of driving a display element such as a light-emitting element. The transistor such as the driving transistor has, for example, a function of controlling the amount of current flowing through a display element such as a light-emitting element. The transistor such as the driving transistor has, for example, another function in some cases. Thus, the transistor such as the driving transistor is simply referred to as a transistor in some cases. For example, the transistor such as the driving transistor is referred to as a first transistor, a second transistor, or the like in some cases.

As shown in FIGS. 1A to 1D, in the display device of this embodiment, an image is displayed by sequentially scanning pixels row by row from the first row to the m-th row and repeating this scanning operation. FIGS. 1A to 1D show the operation of the display device over two frame periods. The period of time from the start of the scanning in a predetermined row through the scanning of the m-th row up to but not including the next scanning of the predetermined row is referred to as one frame period. In the one frame period, there may be a period during which scanning for displaying an image is not performed (hereinafter also referred to as a blanking period). The period of time for scanning from the first row to the m-th row is sometimes called an address period or a writing period. That is, one frame period may include the address period and the blanking period. However, one frame period may include a plurality of sub-frame periods. In that case, each sub-frame period may include an address period. Furthermore, a period from an input of a signal for controlling light emission of a light-emitting element (hereinafter also referred to as a data signal) to a selected pixel belonging to a certain row up to but not including an input of a new data signal to the same pixel in the next frame period may be referred to as a display period. That is, in a pixel, a period during which one gray scale level is substantially displayed may be referred to as a display period. Note that the selection of a pixel can be performed by supplying a signal for selecting the pixel (hereinafter also referred to as a selection signal) to a wiring connected to the pixel (hereinafter also referred to as a selection line). The length of the display period is the same in all the rows; however, timing of the start and the end of the display period may vary depending to the row.

When current characteristics of the driving transistor are read out while scanning for displaying an image is performed, display of the image may be disturbed by an input of a signal for reading out data. However, in the case where all the pixels in m rows and n columns, all the pixels for a specific color among the pixels in m rows and n columns, or all of a plurality of specific pixels are displayed in black, by selecting a pixel displayed in black and reading out data on current characteristics, the data on current characteristics can be read out without disturbing the black display of the pixels. Note that the case where all of a plurality of specific pixels are displayed in black specifically refers to a case in which all the pixels connected to the same selection line are displayed in black, a case in which all the pixels arranged in the same row are displayed in black, a case in which all the pixels for a specific color among the pixels arranged in the same row are displayed in black, or the like. A case where all the pixels belonging to the same row and connected to the same selection line are displayed in black is an example thereof.

Note that a black display state may be referred to as a non-display state. Alternatively, the black display state may be referred to as a state of a zero gray level. The state where display is performed with any gray level except black may be referred to as a display state. Alternatively, the state where display is performed with any gray levels except black may be referred to as a state where the gray level is higher than zero. The state where display is performed with the brightest gray level may be referred to as a white display state. Alternatively, the state where display is performed with the brightest gray level may be referred to as a state where display is performed with the highest gray level.

In this embodiment, as an example, description is made on a driving method of a display device, in which in the case where all of a plurality of specific pixels are displayed in black, variation in current characteristics of a driving transistor is corrected by reading out data on current characteristics of the driving transistor included in a predetermined pixel among the plurality of pixels in an address period.

Figure 2:
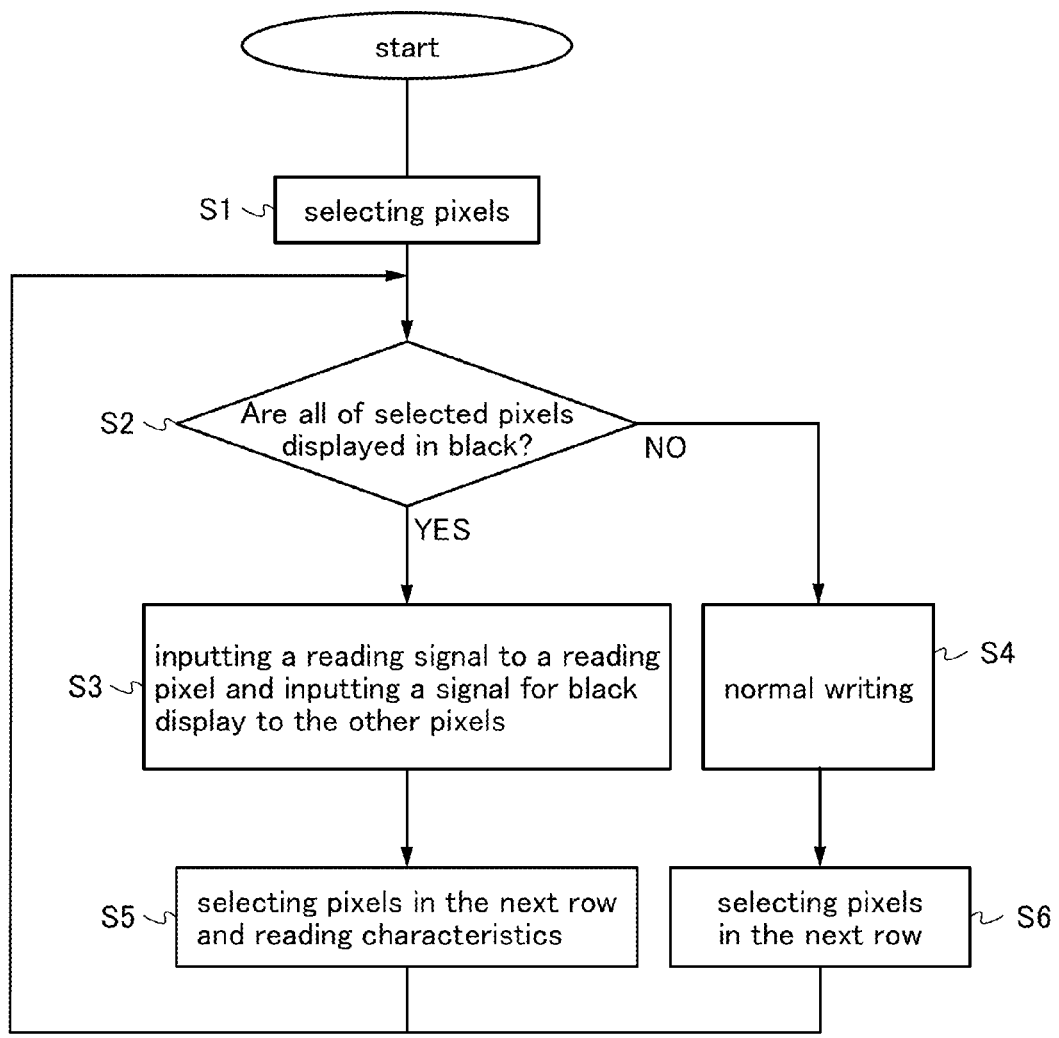
FIG. 2 is a flow chart for explaining one embodiment of the present invention.

FIG. 2 shows an example of a flow chart of a driving method of the display device described in this embodiment. As shown in FIG. 2, the driving method of the display device in Steps S1 to S6 will be described.

First, when an address period starts, specific pixels are selected (Step S1). This selection can be made by a gate line driver circuit or the like. In the case where all of the selected plurality of specific pixels are displayed in black ("Yes" in Step S2), a signal for reading out data on current characteristics (hereinafter also referred to as a reading signal) is input to a predetermined pixel from which data on current characteristics is read out (hereinafter also referred to as a reading pixel), among the plurality of specific pixels. In addition, a signal for performing black display is input to the pixels other than the reading pixel, among the plurality of specific pixels (Step S3). Here, as a specific example, a case in which the plurality of specific pixels are n pixels connected to the same selection line and belonging to the same row is described. By reading out data only from the reading pixel in this manner, the data can avoid being mixed with other data.

By inputting the reading signal in Step S3, data on current characteristics of a driving transistor can be read out from the reading pixel with the use of a reading circuit. Note that the data on current characteristics may be read out in a period when the operation in Step S3 is performed or after the operation in Step S3 is performed.

As the data on current characteristics, any data as long as it is data on variation in current characteristics of the driving transistor is available. For example, it may be data on the current value of the driving transistor, or may be data on the threshold voltage of the driving transistor. By reading out the current value, how at least one of the threshold voltage, the motility, the channel length, and the channel width varies or deteriorates can be known from the current value. For example, in the case where the current value is read out as the data, the amount of current corresponds to the level of the input reading signal.

Note that in Step S3, it is preferable that, when the reading signal is input, reverse bias be applied to a light-emitting element in the reading pixel so that the light-emitting element can maintain black display. Furthermore, in order to maintain the black display state, even if forward bias is applied, a potential difference is suppressed to extremely small. The extremely small potential difference is preferably approximately several volts or lower, for example, 2 volts or lower, further preferably 1 volt or lower. Alternatively, for example, it is preferable that no current flow through the light-emitting element; this condition can be made, for example, by turning off the transistor connected to the light-emitting element.

In the case where at least one of the n pixels belonging to the same row is not displayed in black ("NO" in Step S2), the input of the reading signal is not performed and signals for performing display with predetermined gray levels are input to the n pixels, so that normal writing operation is performed (Step S4).

In the case where the gate line driver circuit includes a shift register circuit, scanning can be sequentially performed from the first row to the m-th row. In the case where a decoder circuit or the like is used as the gate line driver circuit, an arbitrary row can be selected in an arbitrary order. Thus, in that case, sequential scanning of all the rows from the first to the m-th rows is not necessarily performed in the gate line driver circuit. Without the scanning, only a predetermined row (the row in black display) may be instantly selected, and a reading signal may be input to the pixels. Here, one row or a plurality of rows may be selected.

After Step S3 of inputting the reading signal and the signal for black display is performed, pixels in the next row are selected and data on current characteristics of the driving transistor in the reading pixel is read out (Step S5). At this time, for example, in the reading pixel, the switch or transistor for reading out the current characteristics of the transistor is in an on state. For writing in the next row, the input of signals to the pixels may be performed by determining whether specific pixels are displayed in black, in the same manner as that in Step S2.

Note that data on current characteristics can be read out freely within a period from Step S3 to the next selection of the reading pixel in the next frame period. Therefore, data on current characteristics can be read out also when selection of a row is performed in an address period, for example in Step S5.

Figure 1B:
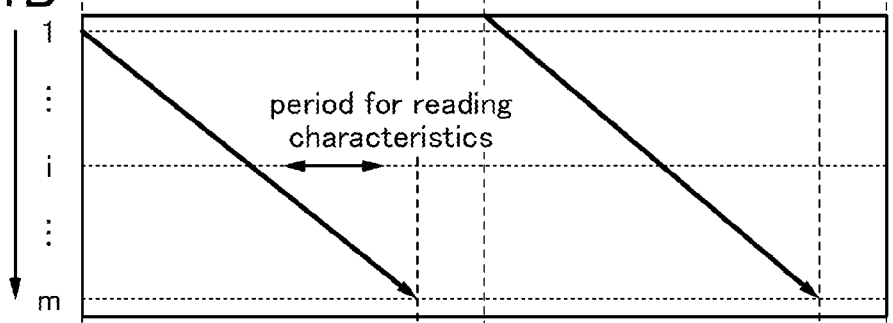
Figure 1C:
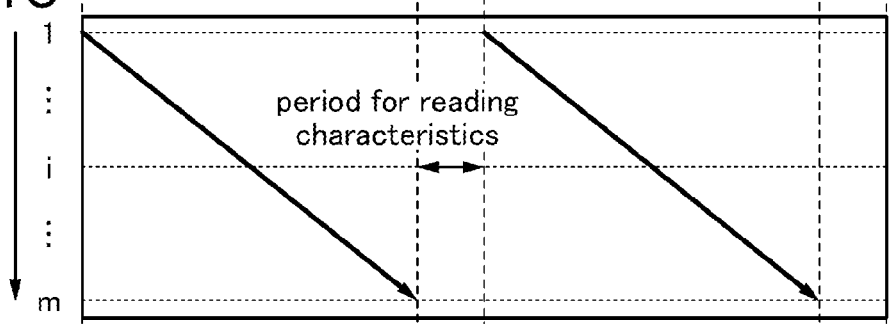
Figure 1D:
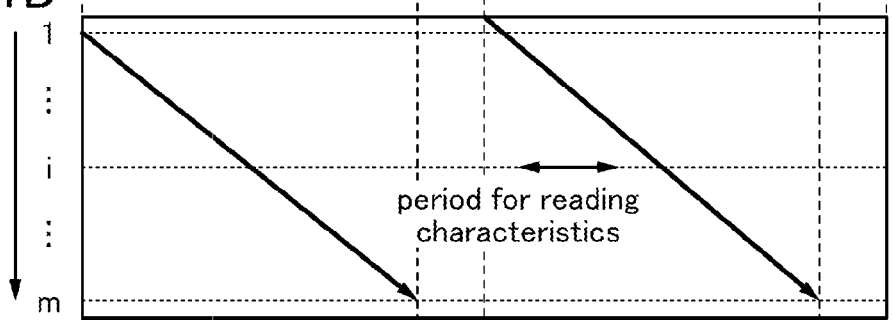

For example, as shown in FIG. 1A, in the i-th row (i is an integer greater than or equal to 1 and smaller than or equal to m), data on current characteristics of the driving transistor in the reading pixel can be read out over the entire display period, that is, over one frame period. Alternatively, data on current characteristics of the driving transistor in the reading pixel can be read out within a period that is shorter than one frame period. For example, reading may be performed in part or the whole of the address period after the reading pixel is selected as shown in FIG. 1B, in part or the whole of the blanking period as shown in FIG. 1C, or in part or the whole of the period until a reading pixel is selected in the next address period as shown in FIG. 1D (not including the time when the reading pixel is selected in the next address period). Note that in the case where characteristics are not read out from the i-th row pixels, display operation is performed over the entire display period, that is, over one frame period.

In Step S5, if the reading signal is held in the reading pixel, the reading signal need not keep being input to the reading pixel.

After normal writing operation is performed in Step S4, pixels in the next row are selected (Step S6).

After the pixels in the next row are selected in Step S5 or Step S6, operation from Step S3 to Step S6 is similarly performed depending on whether all of the pixels in the next row are displayed in black (Step S2). Note that in the case where the pixels to which the signal is input in Step S3 belong to the last row (the m-th row), a blanking period may exist between Step S3 and Step S5, and data on current characteristics may be read out in the blanking period.

In one frame period, there may be more than one row from which data on current characteristics is read out. The reading operation may be performed in a plurality of rows in one frame period. For example, a reading operation may be performed in the i-th row, the (i+A)-th row, and the (i+A+B)-th row in FIG. 1. Here, A and B are natural numbers. In this case, the operation from Step S2 to Step S6 is repeated the same number of times as the number of rows where the reading operation is performed, in one frame period.

Then, in the next frame period, in accordance with the data on current characteristics that is read out after Step S3, a signal for correcting variation in the current characteristics is produced and input to the reading pixel.

Note that the reading of the data on current characteristics can be finished, for example, by turning off the switch or transistor for reading out the current characteristics of the transistor in the reading pixel.

Accordingly, external correction can be performed in parallel with display operation. Accordingly, a display device in which display unevenness is suppressed can be obtained. Accordingly, a display device capable of high definition display can be obtained. Accordingly, a semiconductor device capable of reducing adverse effects due to variation in transistor characteristics can be obtained. Accordingly, a semiconductor device capable of reducing adverse effects due to variation in the threshold voltages of transistors can be provided. Accordingly, a semiconductor device capable of reducing adverse effects due to variation in the mobilities of transistors can be provided.

As for a row in which all the pixels have never been displayed in black since display of an image was started, for example, it is preferable that data on current characteristics of the driving transistors in that row be read out on at least one of the following occasions: when the power of the display device is turned off; just after the power of the display device is input; when the display device is not used in a predetermined period; at late-night; at early-morning; and the like. In the case where there is a period when all the pixels are displayed in black in a frame period or a sub-frame period, in the case where there is a period when all the pixels are displayed in black between a frame period and another frame period, or in the case where there is a period when all the pixels are displayed in black between a sub-frame period and another sub-frame period, data on current characteristics of the driving transistors can be read out in these periods.

The variation in current characteristics of the driving transistors among pixels of the display device can be corrected by the above-described driving method. In this driving method, the variation in current characteristics of the driving transistors can be corrected in parallel with the display operation of the display device.

Accordingly, in a product including the display device according to one embodiment of the disclosed invention, variation in luminance of pixels of the product can be corrected while display inspection of the product is performed in pre-shipment inspection. Thus, the period of the pre-shipment inspection of the product can be shortened, resulting in cost reduction of the product.

With regard also to a product that has been shipped, the above-described driving method of the display device is performed each time the power is turned on and an image is displayed. Thus, variation in luminance due to deterioration over time and the like after the shipment of the product can be automatically corrected. This enables a longer product lifetime.

Note that in the above-described driving method of the display device, data on current characteristics is read out while display in the other rows is performed; however, the driving method of the display device of this embodiment is not necessarily limited thereto. For example, the data on current characteristics may be read out when the display screen becomes dark and all the pixels are displayed in black, or when a black picture is inserted so as to improve moving image characteristics.

<Structural Example of Semiconductor Device>

Figure 3:
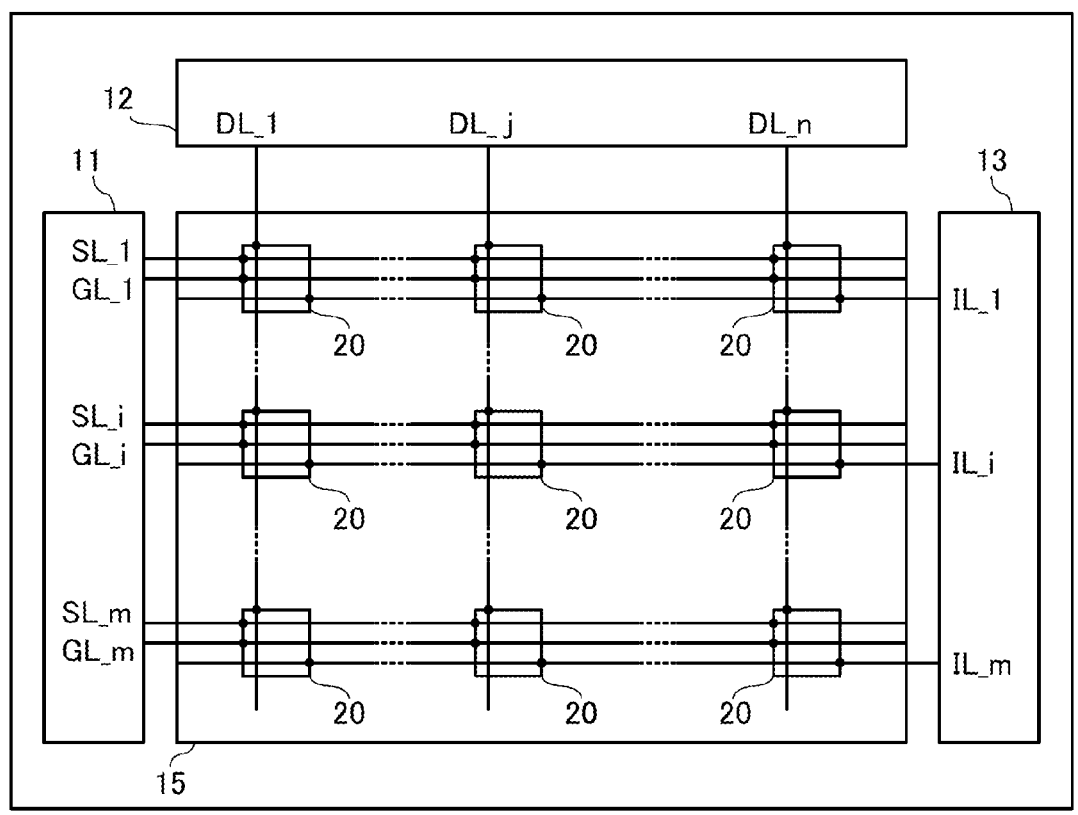
FIG. 3 is a block diagram for explaining one embodiment of the present invention.

Next, a specific structure example of the semiconductor device according to one embodiment of the disclosed invention is described with reference to the block diagram in FIG. 3 and the circuit diagram in FIG. 4. FIG. 3 is an example of a block diagram of a pixel portion 15 including (m×n) pixels 20 and peripheral circuits.

The display device in FIG. 3 includes a driver circuit 11, a driver circuit 12, a circuit portion 13, the pixel portion 15 including (m×n) pixels 20 (m rows and n columns) arranged in a matrix, wirings SL_1 to SL_m which extend in the row direction, wirings GL_1 to GL_m which extend in the row direction, wirings DL_1 to DL_n which extend in the column direction, and wirings IL_1 to IL_m which extend in the row direction. Since the wirings IL_1 to IL_m are provided to extend in the row direction, the wirings IL can be driven independently of the other rows. Accordingly, data on current characteristics can be read out independently of the other rows. This enables data on current characteristics to be read out from a plurality of rows in one frame period.

The driver circuit 11 is connected to the wirings SL_1 to SL_m and the wirings GL_1 to GL_m. The driver circuit 11 is configured to select a pixel or a row. The driver circuit 11 is configured to sequentially select a pixel or a row, row by row. The driver circuit 11 is configured to select a specific pixel or a specific row. The driver circuit 11 is configured to output a selection signal or a non-selection signal to a pixel. Thus, the driver circuit 11 has a function of a gate line driver circuit or a scan line driver circuit.

The driver circuit 12 is connected to the wirings DL_1 to DL_n. The driver circuit 12 is configured to supply a data signal to a pixel or a column. The driver circuit 12 is configured to supply a reading signal to a pixel or a column. Thus, the driver circuit 12 has a function of a source line driver circuit, a data line driver circuit, or a video signal line driver circuit. Note that an example of the data signal is a signal corresponding to an image displayed in a pixel (hereinafter also referred to as a video signal).

The circuit portion 13 (hereinafter also referred as a reading circuit portion) is connected to the wirings IL_1 to IL_m. The circuit portion 13 is configured to read data that is output from a pixel. The circuit portion 13 is configured to read a potential of a terminal in a pixel. The circuit portion 13 is configured to select whether to read data that is output from a pixel.

Note that the driver circuit 12 and the circuit portion 13 can be integrally formed as one circuit.

Thus, the driver circuit 11, the driver circuit 12, the circuit portion 13, and the like have a variety of functions, in some cases. Therefore, the driver circuit 11, the driver circuit 12, the circuit portion 13, and the like might be simply referred to as circuits. For example, the driver circuit 11, the driver circuit 12, the circuit portion 13, and the like might be referred to as a first circuit, a second circuit, and the like.

Figure 4:
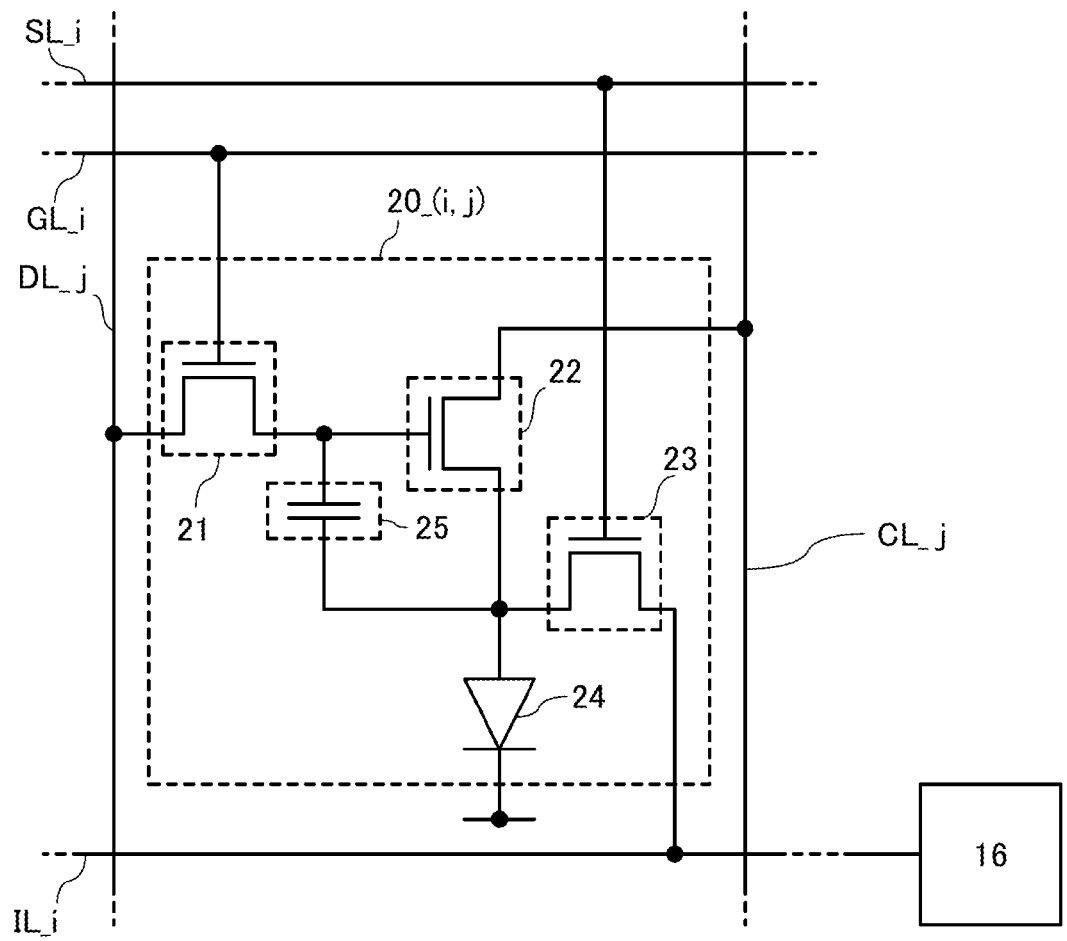
FIG. 4 is a circuit diagram for explaining one embodiment of the present invention.

FIG. 4 shows a structure of a pixel 20_(i, j) in the i-th row and the j-th column (j is an integer greater than or equal to 1 and less than or equal to n). The pixel 20_(i, j) includes a transistor 21, a transistor 22, a transistor 23, a light-emitting element 24, and a capacitor 25. Note that each of the transistors may have a multi-gate structure, that is, a structure in which a plurality transistors are connected in series. Note that each of the transistors may have a structure in which gate electrodes are formed above and below a channel. These elements included in the pixel 20_(i, j) are connected to the wirings GL_i, SL_i, DL_j, CL_j, and IL_i.

Wirings CL_1 to CL_n are not shown in FIG. 3; however, they can be provided so as to extend in the column direction, for example. The wiring CL extends in the column direction in FIG. 4; however, the present invention is not limited thereto, and the direction in which the wiring CL extends may be changed as appropriate. For example, the wiring CL may be formed by connection of a wiring provided in the column direction and a wiring provided in the row direction.

The pixels 20 other than the pixel 20_(i, j) can have a structure similar to that of the pixel 20_(i, j).

A specific connection relation in the pixel 20_(i, j) is as follows. A gate of the transistor 21 is connected to the wiring GL_i, one of a source and a drain thereof is connected to the wiring DL_j, the other of the source and the drain thereof is connected to a gate of the transistor 22. One of a source and a drain of the transistor 22 is connected to the wiring CL_j, and the other of the source and the drain thereof is connected to one of a source and a drain of the transistor 23 and one of electrodes (hereinafter also referred to as a pixel electrode) of the light-emitting element 24. A gate of the transistor 23 is connected to the wiring SL_i and the other of the source and the drain thereof is connected to the wiring IL_j. A predetermined potential (hereinafter also referred to as a common potential) is supplied to the other of the electrodes (hereinafter also referred to as a common electrode) of the light-emitting element 24.

Figure 5:
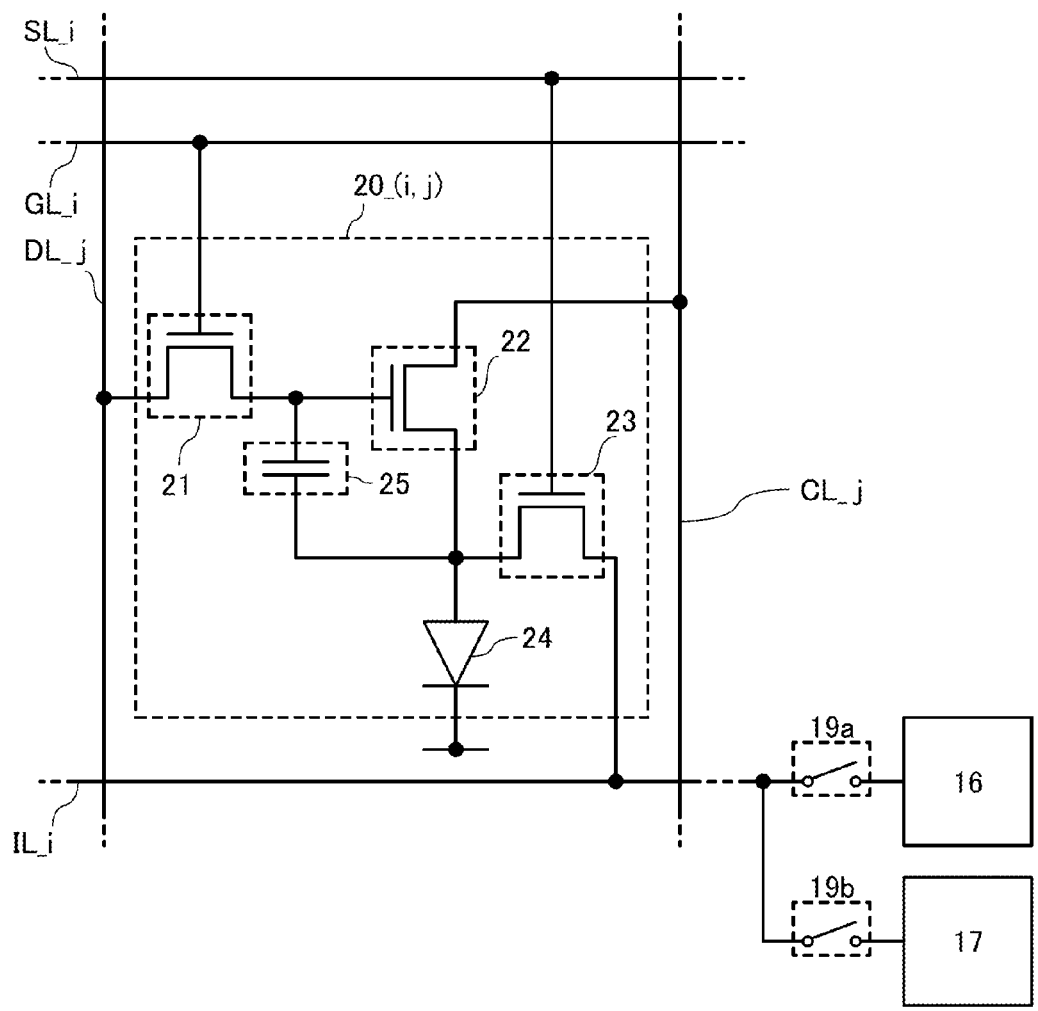
FIG. 5 is a circuit diagram for explaining one embodiment of the present invention.

The wiring IL_i is connected to a reading circuit 16 included in the circuit portion 13. The wiring IL_i may be connected to another circuit, for example, a circuit having a function of supplying a certain potential, in a period when data on current characteristics is not read out or in a period when a video signal or a reading signal is supplied to the pixel. For example, the wiring IL_i may be connected to a wiring to which a certain potential is supplied. Note that in the case where the wiring IL_i is connected to the reading circuit 16 and another circuit 17 as shown in FIG. 5, a switch 19a and a switch 19b may be provided between the wiring IL_i and the reading circuit 16 and between the wiring IL_i and the circuit 17, respectively. By switching the switches, the wiring IL_i and one of the reading circuit 16 and the circuit 17 can be brought into electrical contact with each other. Note that the circuit 17 may be a circuit provided inside the circuit portion 13 in FIG. 3 or outside the circuit portion 13.

One of electrodes of the capacitor 25 is connected to the other of the source and the drain of the transistor 21 and the gate of the transistor 22, and the other electrode thereof is connected to the other of the source and the drain of the transistor 22, the one of the source and the drain of the transistor 23, and the pixel electrode of the light-emitting element 24. With the capacitor 25 provided as described above, more charges can be held in the gate of the transistor 22, and a holding period of image data can be made longer.

Note that the capacitor 25 is not necessarily provided. For example, a high parasitic capacitance generated between the gate of the transistor 22 and the other of the other of the source and the drain of the transistor 22 can be an alternative to the capacitor 25.

The driver circuit 11 can control the on/off states of the transistor 21 via the wiring GL, and the on/off states of the transistor 23 via the wiring SL.

The driver circuit 12 can supply a video signal or a reading signal to the gate of the transistor 22 via the wiring DL.

The circuit portion 13 includes one or a plurality of reading circuits 16 corresponding to the wirings IL_1 to IL_m. The reading circuits 16 can read out data on current characteristics from the transistor 22 of each pixel 20. The reading circuits 16 can supply a predetermined voltage to the wirings IL_1 to IL_m.

The wiring CL, for example, can function as a high potential power supply line which supplies a current to the light-emitting element 24.

However, the structures of the driver circuit 11, the driver circuit 12, and the circuit portion 13 are not limited to those described above. The positions of the driver circuit 11, the driver circuit 12, and the circuit portion 13 may be changed; alternatively, functions of some of them may be combined into one driver circuit. For example, in FIG. 3, the driver circuit 11 and the circuit portion 13 are provided on only one side of the pixel portion 15; however, the driver circuit 11 and the circuit portion 13 may be divided and provided on both sides of the pixel portion 15. Furthermore, in FIG. 3, the driver circuit 11 and the pixel portion 13 are separately provided; however, they may be combined as one driver circuit portion.

Figure 6:
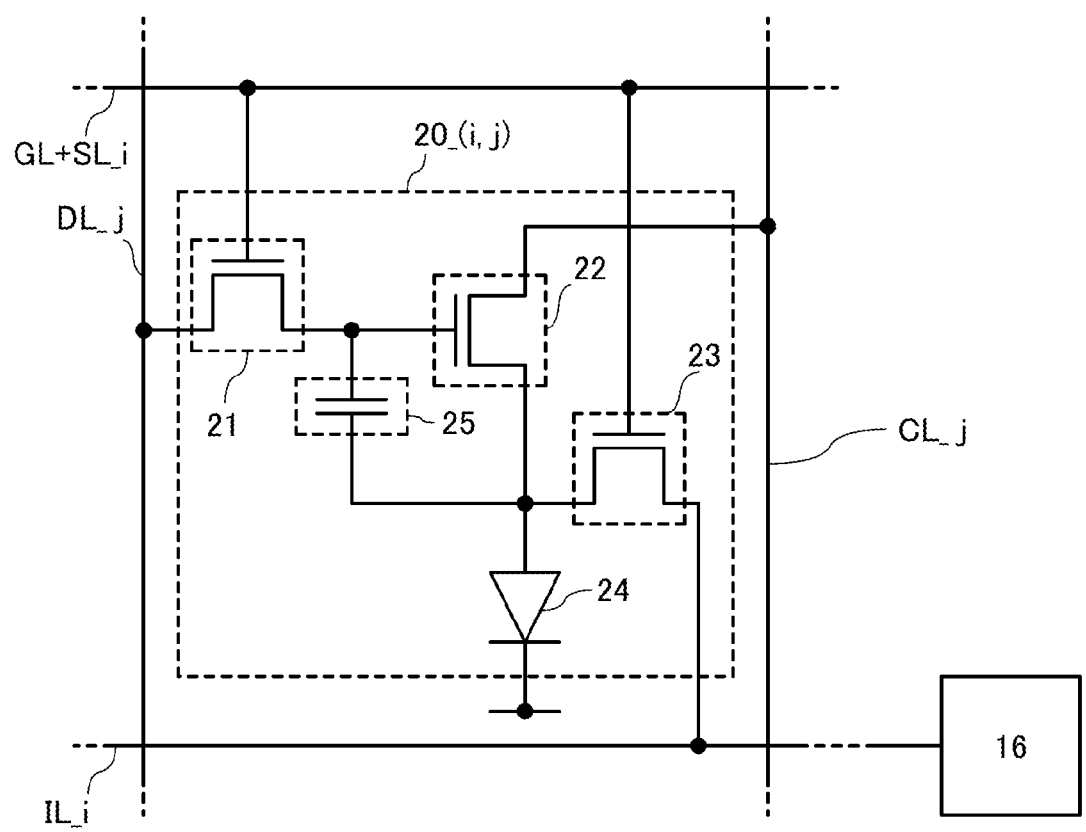
FIG. 6 is a circuit diagram for explaining one embodiment of the present invention.

The directions in which the wiring GL, the wiring SL, the wiring DL, the wiring IL, and the wiring CL extend, the number of the wirings, and the like can be appropriately changed in accordance with changes in structures such as the positions and functions of the driver circuit 11, the driver circuit 12, and the circuit portion 13. For example, the wiring IL may extend in the column direction. Alternatively, for example, the wiring GL and the wiring SL may be combined into one wiring. FIG. 6 shows a circuit diagram in that case. In the case where the wiring GL and the wiring SL are combined into one wiring, the transistor 21 and the transistor 23 are turned on/off at the same time. Thus, in the case where a driving method in which the transistor 21 and the transistor 23 are turned on/off at the same time is employed, the wiring GL and the wiring SL can be combined into one wiring.

The amount of current that flows through the light-emitting element 24 is controlled by the transistor 22 that is controlled in accordance with the level of a video signal input to the pixel 20. The luminance of the light emitting element 24 depends on the amount of current flowing between the pixel electrode and the common electrode. For example, in the case where an OLED (an organic light-emitting diode) is used as the light-emitting element 24, one of an anode and a cathode serves as the pixel electrode and the other thereof serves as the common electrode. FIG. 4 illustrates a configuration of the pixel 20 in which the anode of the light-emitting element 24 is used as the pixel electrode and the cathode of the light-emitting element 24 is used as the common electrode.

Figure 7:
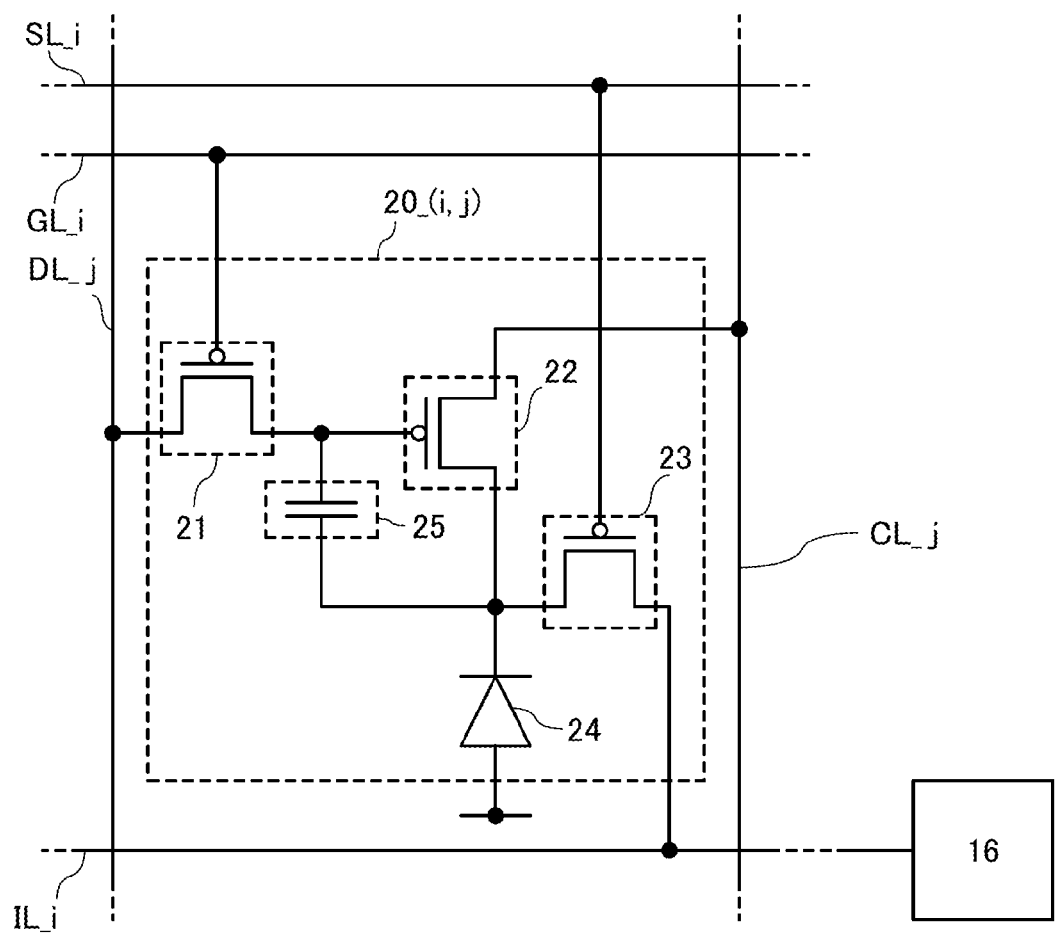
FIG. 7 is a circuit diagram for explaining one embodiment of the present invention.

Operation is possible with a circuit configuration in which the polarity of the transistors, the orientation of the light-emitting element, the potential of the wirings, the potential of the signals, or the like is changed. FIG. 7 illustrates a variation example of the structure in FIG. 4. In FIG. 7, the transistors 21 to 23 are p-channel transistors, and the direction of the light-emitting element 24 is opposite to that in FIG. 4. Without limitation to the pixel circuit in FIG. 4, a circuit can be formed similarly.

As at least one of the transistors 21 to 23 and another transistor included in the pixel 20, a transistor including an oxide semiconductor in its channel formation region (hereinafter also referred to as an OS transistor) can be used. When the OS transistor is particularly used as the transistor 21, the off-state current of the transistor 21 can be extremely low. Furthermore, when the transistor 21 having this structure is used in the pixel 20, leakage of electric charges accumulated in the gate of the transistor 22 or the capacitor 25 can be prevented effectively as compared with the case where a transistor including a normal semiconductor such as silicon or germanium is used as the transistor 21.

Accordingly, for example, in the case where video signals each having the same image data are written to the pixel portion 15 over some consecutive frame periods, like a still image, display of an image can be maintained even when the driving frequency is low, in other words, the number of writing operations of a video signal to the pixel portion 15 for a certain period is reduced. For example, a purified oxide semiconductor in which impurities serving as electron donors (donors), such as moisture or hydrogen, are reduced and oxygen vacancies are reduced is used for a semiconductor film of the transistor 21, whereby the interval between video signal writing operations can be set to 10 seconds or longer, preferably 30 seconds or longer, or further preferably one minute or longer. As the interval between video signal writing operations is longer, power consumption can be further reduced.

In addition, since the potential of the video signal can be held for a longer period, the quality of a displayed image can be prevented from being lowered even when the capacitor 25 for holding the potential of the gate of the transistor 22 is not provided in the pixel 20.

Note that details on the structure of the OS transistor and the off-state current are described in Embodiment 4.

The transistors 21 to 23 and another transistor are not limited to OS transistors. For example, they can be transistors each of whose channel formation region is formed in part of a substrate including a single crystal semiconductor. As the substrate including a single crystal semiconductor, a single crystal silicon substrate, a single crystal germanium substrate, or the like can be used. Since the transistor including a single crystal semiconductor in its channel formation region has a high current supply capability, when such a transistor is used in the pixel 20, the operation speed of the pixel 20 can be increased.

Without being limited to the OS transistors, the transistors 21 to 23 and another transistor can be transistors including a channel formation region in a semiconductor film. For example, the transistors can include a non-single-crystal semiconductor in the channel formation regions. As the non-single-crystal semiconductor, non-single-crystal silicon such as amorphous silicon, microcrystalline silicon or polycrystalline silicon, non-single-crystal germanium such as amorphous germanium, microcrystalline germanium or polycrystalline germanium, or the like can be used. In particular, when a crystalline semiconductor film is used, the operation speed of the pixel 20 can be increased.

The transistors have the gate on at least one side of a semiconductor film; alternatively, the transistors may have a pair of gates with a semiconductor film positioned therebetween.

When a transistor T includes a pair of gates between which a semiconductor film is sandwiched, one of the gates may be supplied with a signal A and the other of the gates may be supplied with a fixed potential Vb.

The signal A is, for example, a signal for controlling the on/off state. The signal A may be a digital signal with two kinds of potentials, V1 and V2 (V1>V2). For example, the potential V1 may be a high power supply potential and the potential V2 may be a low power supply potential. The signal A may be an analog signal.

The fixed potential Vb is, for example, a potential for controlling a threshold voltage VthA of the transistor T. The fixed potential Vb may be the potential V1 or the potential V2. In that case, a potential generator circuit for generating the fixed potential Vb is not necessary, which is preferable. The fixed potential Vb may be different from the potential V1 or the potential V2. When the fixed potential Vb is low, the threshold voltage VthA can be increased in some cases. As a result, a drain current of when a voltage Vgs between the gate and a source is 0 V can be reduced and a leakage current of the circuit including the transistor T can be reduced in some cases. The fixed potential Vb may be, for example, lower than the low power supply potential. When the fixed potential Vb is high, the threshold voltage VthA may be decreased in some cases. As a result, a drain current of when the voltage Vgs between the gate and the source is VDD can be increased and operation speed of the circuit including the transistor T can be increased in some cases. The fixed potential Vb may be, for example, higher than the low power supply potential.

The signal A and a signal B may be applied to one gate and the other gate of the transistor T, respectively. The signal B is, for example, a signal for controlling the on/off state of the transistor T. The signal B may be a digital signal with two kinds of potentials, V3 and V4 (V3>V4). For example, the potential V3 may be the high power supply potential and the potential V4 may be the low power supply potential. The signal B may be an analog signal.

When both the signal A and the signal B are digital signals, the signal B may have the same digital value as the signal A. In that case, an on-state current of the transistor T may be increased and operation speed of the circuit including the transistor T may be increased in some cases. Here, the potential V1 of the signal A may be different from the potential V3 of the signal B, and the potential V2 of the signal A may be different from the potential V4 of the signal B. For example, if a gate insulating film for the gate to which the signal B is input is thicker than a gate insulating film for the gate to which the signal A is input, the potential amplitude of the signal B (V3-V4) may be larger than the potential amplitude of the signal A (V1-V2). In this way, influence of the signal A and that of the signal B on the on/off state of the transistor T can be approximately the same in some cases.

When both the signal A and the signal B are digital signals, the signal B may be a signal with a different digital value from that of the signal A. In that case, the signal A and the signal B can separately control the transistor T, and thus higher performance may be achieved. For example, if the transistor T is an n-channel transistor, the transistor T may be turned on only when the signal A has the potential V1 and the signal B has the potential V3, or may be turned off only when the signal A has the potential V2 and the signal B has the potential V4, in which case the transistor T, a single transistor, may function as a NAND circuit, a NOR circuit, or the like. In addition, the signal B may be a signal for controlling the threshold voltage VthA. For example, the potential of the signal B in a period when the circuit including the transistor T operates may be different from the potential of the signal B in a period when the circuit does not operate. The potential of the signal B may vary depending on operation modes of the circuit. In that case, the potential of the signal B is not switched so often as that of the signal A in some cases.

When both the signal A and the signal B are analog signals, the signal B may be an analog signal with the same potential as that of the signal A, an analog signal with a potential that is a constant multiple of the potential of the signal A, an analog signal with a potential that is higher or lower than the potential of the signal A by a constant, or the like. In that case, an on-state current of the transistor T may be increased and operation speed of the circuit including the transistor T may be increased in some cases. The signal B may be an analog signal different from the signal A. In that case, the signal A and the signal B can separately control the transistor T, and thus higher performance may be achieved.

The signal A and the signal B may be a digital signal and an analog signal, respectively. The signal A and the signal B may be an analog signal and a digital signal, respectively.

A fixed potential Va and a fixed potential Vb may be applied to one gate and the other gate of the transistor T, respectively. When both of the gates of the transistor T are supplied with the fixed potentials, the transistor T can serve as an element equivalent to a resistor in some cases. For example, when the transistor T is an n-channel transistor, effective resistance of the transistor can be decreased (increased) by heightening (lowering) the fixed potential Va or the fixed potential Vb in some cases. When both the fixed potential Va and the fixed potential Vb are heightened (lowered), effective resistance lower (higher) than that obtained by the transistor provided with one gate can be obtained in some cases.

FIG. 4 illustrates the case where the transistors are all n-channel transistors. When the transistors in the pixel 20 all have the same channel type, it is possible to omit some of steps for fabricating the transistors, for example, a step of adding an impurity element imparting one conductivity type to the semiconductor film. Note that in the display device, not all the transistors in the pixel 20 are necessarily n-channel transistors. For example, the transistor 21 and the transistor 23 may be p-channel transistors.

Instead of the transistors 21 and 23, an electrical switch, a mechanical switch, a MEMS element, or the like can be used.

<Driving Method of Semiconductor Device>

Next, an example of a driving method of the semiconductor device illustrated in FIG. 3 and FIG. 4 will be described. Here, an operation of nine pixels including the pixel 20_(i, j) in the i-th row and the j-th column is specifically described with reference to FIG. 8 to FIG. 14. Note that a case in which the pixels selected in Step S1 in FIG. 2 are the pixels 20 in the i-th row which are connected to the same wiring GL_i and the same wiring SL_i is described below. In the case described below, all the pixels 20 in the i-th row are displayed in black, and data on current characteristics is read from the pixel 20_(i, j) in the i-th row and the j-th column. The reading circuit 16 connected to the wiring IL_i, the reading circuit 16 connected to the wiring IL_i+1, and the reading circuit 16 connected to the wiring IL_i+2 are represented by the reading circuit 16_i, the reading circuit 16_i+1, and the reading circuit 16_i+2, respectively.

Figure 8:
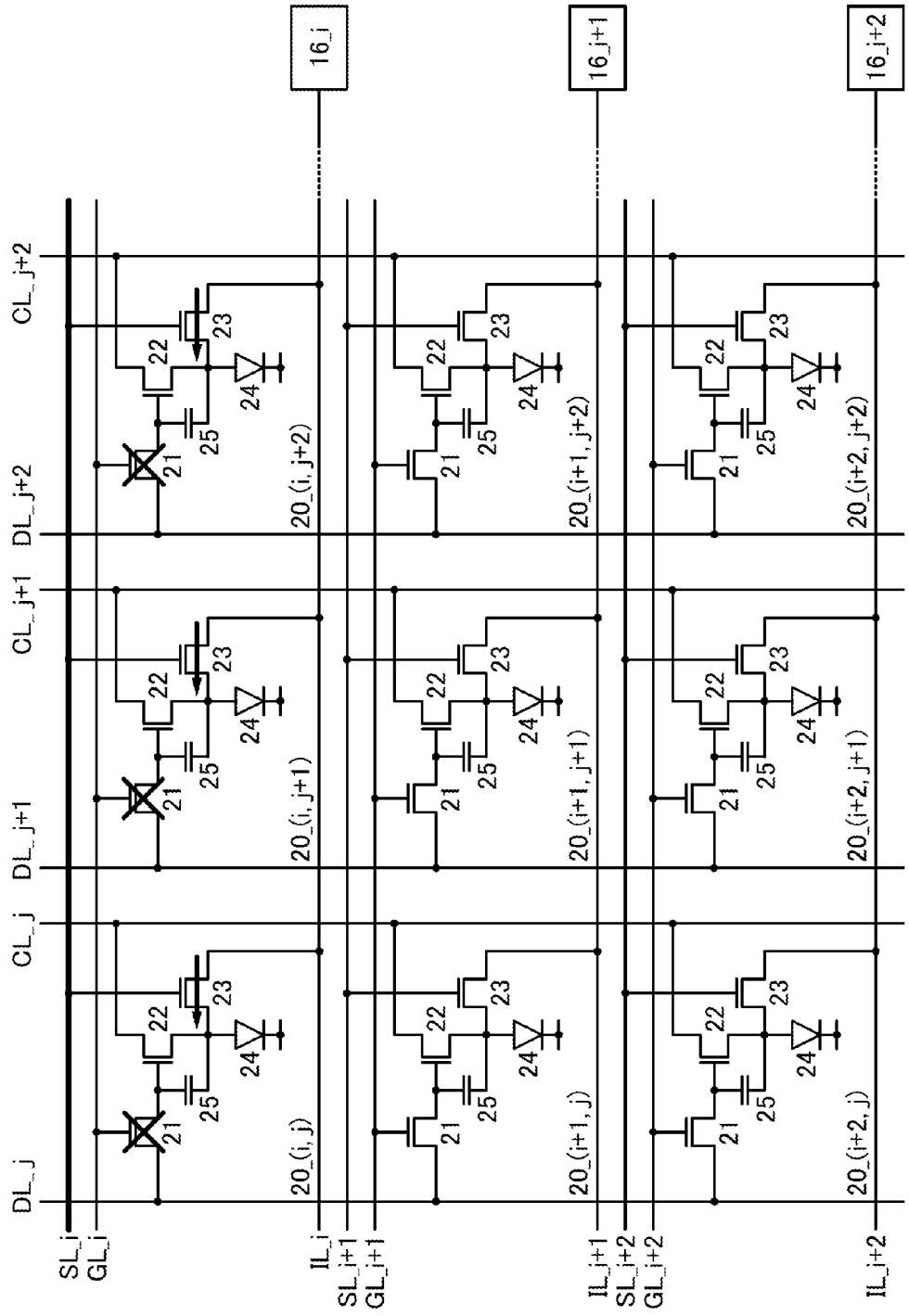
FIG. 8 is a circuit diagram for explaining operation of one embodiment of the present invention.

First, when an address period of one frame period starts, pixels 20 are sequentially scanned row by row from the first row to the m-th row. As shown in FIG. 8, when the pixels 20 in the i-th row are selected, a selection signal is input to the wiring SL_i and the transistors 23 in the pixels 20 in the i-th row are turned on. When the transistor 23 is turned on, the wiring IL_i and the other of the source and the drain of the transistor 22 (hereinafter also referred to as the source electrode of the transistor 22) are brought into electrical contact with each other, and the potential of the wiring IL_i is supplied to the source electrode of the transistor 22. Note that as the selection signal input to the wiring SL_i, a high-level potential can be used in the case where the transistor 23 is an n-channel transistor, and a low-level potential can be used in the case where the transistor 23 is a p-channel transistor.

At that time, the potential of the wiring IL_i is a potential that does not bring the light-emitting element 24 into a light-emitting state. Specifically, the potential of the wiring IL_i is preferably lower than the common potential of the light-emitting element 24, or approximately at the same level as that of the common potential. The potential of the wiring IL_i is set as described above, so that reverse bias is applied to the light-emitting element 24 or bias is not applied to the light-emitting element 24. Thus, the black display state of the pixels in the i-th row can be maintained. Furthermore, even if forward bias is applied to the light-emitting element 24, in order to maintain the black display state, it is preferable that the potential difference between the wiring IL_i and the common potential be suppressed to extremely small. The extremely small potential difference is preferably a potential difference of approximately several volts or lower, for example, 2 volts or lower, further preferably 1 volt or lower.

Note that the operation shown in FIG. 8 need not necessarily be performed.

Figure 9:
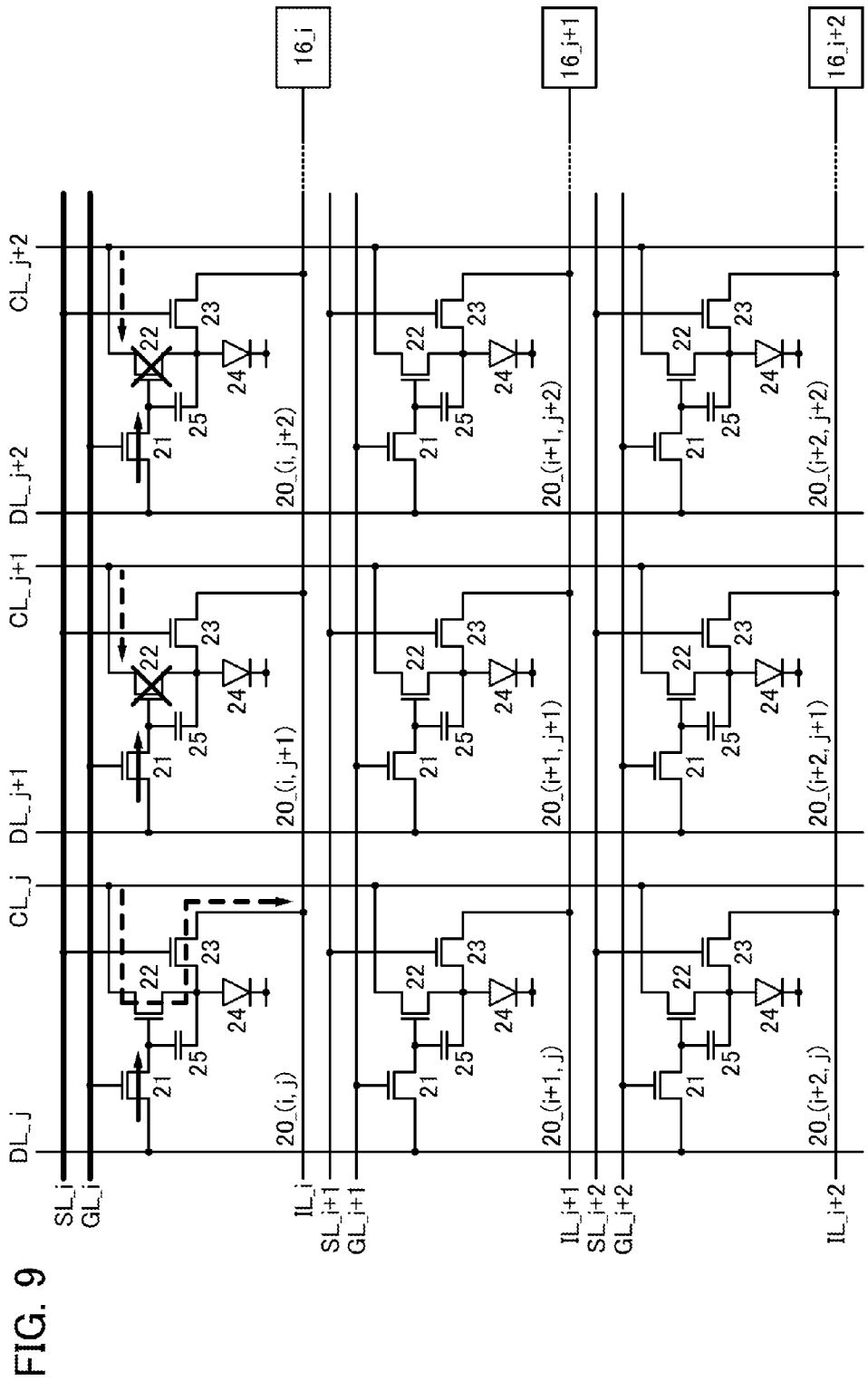
FIG. 9 is a circuit diagram for explaining operation of one embodiment of the present invention.

Then or at the same time as the selection signal is input to the wiring SL_i, a selection signal is input to the wiring GL_i, so that the transistors 21 in the pixels 20 in the i-th row are turned on (FIG. 9). When the transistor 21 is turned on, the wiring DL is brought into electrical contact with the gate electrode of the transistor 22. Here, video signals (here, video signals for black display) for the pixel 20_(i, j+1) and the pixel 20_(i, j+2) are supplied to the wiring DL_j+1 and the wiring DL_j+2, respectively. Accordingly, a potential corresponding to the video signal for the pixel 20_(i, j+1) is supplied to the gate electrode of the transistor 22 in the pixel 20_(i, j+1), and a potential corresponding to the video signal for the pixel 20_(i, j+2) is supplied to the gate electrode of the transistor 22 in the pixel 20_(i, j+2). That is, a voltage between the potential of the wiring DL_j+1 and the potential of the wiring IL_i is supplied between the gate and the source of the transistor 22 of the pixel 20_(i, j+1). In addition, a voltage between the potential of the wiring DL_j+2 and the potential of the wiring IL_i is supplied between the gate and the source of the transistor 22 of the pixel 20_(i, j+2). Accordingly, a potential difference between the gate and the source of the transistor 22 is stabilized, and a current corresponding to the video signal held in the gate electrode of the transistor 22 or the capacitor 25 can be supplied to the light-emitting element 24 via the wiring CL_j. In FIG. 9, the transistors 22 in the pixel 20_(i, j+1) and the pixel 20_(i, j+2) are in an off state since the video signals for black display are supplied to the gates of the transistors 22 in the pixels. As the selection signal input to the wiring GL_i, a high-level potential can be used in the case where the transistor 21 is an n-channel transistor, and a low-level potential can be used in the case where the transistor 21 is a p-channel transistor.

At this time, a reading signal is supplied to the wiring DL_j. When the transistor 21 in the pixel 20_(i, j) is turned on upon the input of the selection signal to the wiring GL_i, the reading signal is supplied to the gate electrode of the transistor 22 to turn on the transistor 22. Here, since the transistor 23 is in an on state by the input of the selection signal to the wiring SL_i, the wiring IL_i and the source electrode of the transistor 22 are brought into electrical contact and the potential of the wiring IL_i is supplied to the source electrode of the transistor 22. As a result, the wiring CL_j is brought into electrical contact with the reading circuit 16_i through the transistors 22 and 23. Note that the potential of the wiring IL_i is controlled by the reading circuit 16_i. Therefore, a current does not flow through the light-emitting element. In this way, in the pixel 20_(i, j), data on current characteristics of the transistor 22 can be read out while the black display state is maintained. Note that the potential of the wiring IL_i can be set by the reading circuit 16_i.

As the data on the current characteristics of the transistor 22, any data on variation in current characteristics of the transistors 22 among pixels may be taken. For example, it may be the current value of the transistor 22, or may be the threshold voltage of the transistor 22.

Here, the signal with which the transistor 21 can be kept in an off state is input to the wiring GL so that the reading signal is not input to the rows other than the i-th row.

In the case where the wiring GL_i and the wiring SL_j are combined into one wiring, the wiring operates similarly to the case when the wiring GL_i and the wiring SL_j are selected at the same time.

Figure 10:
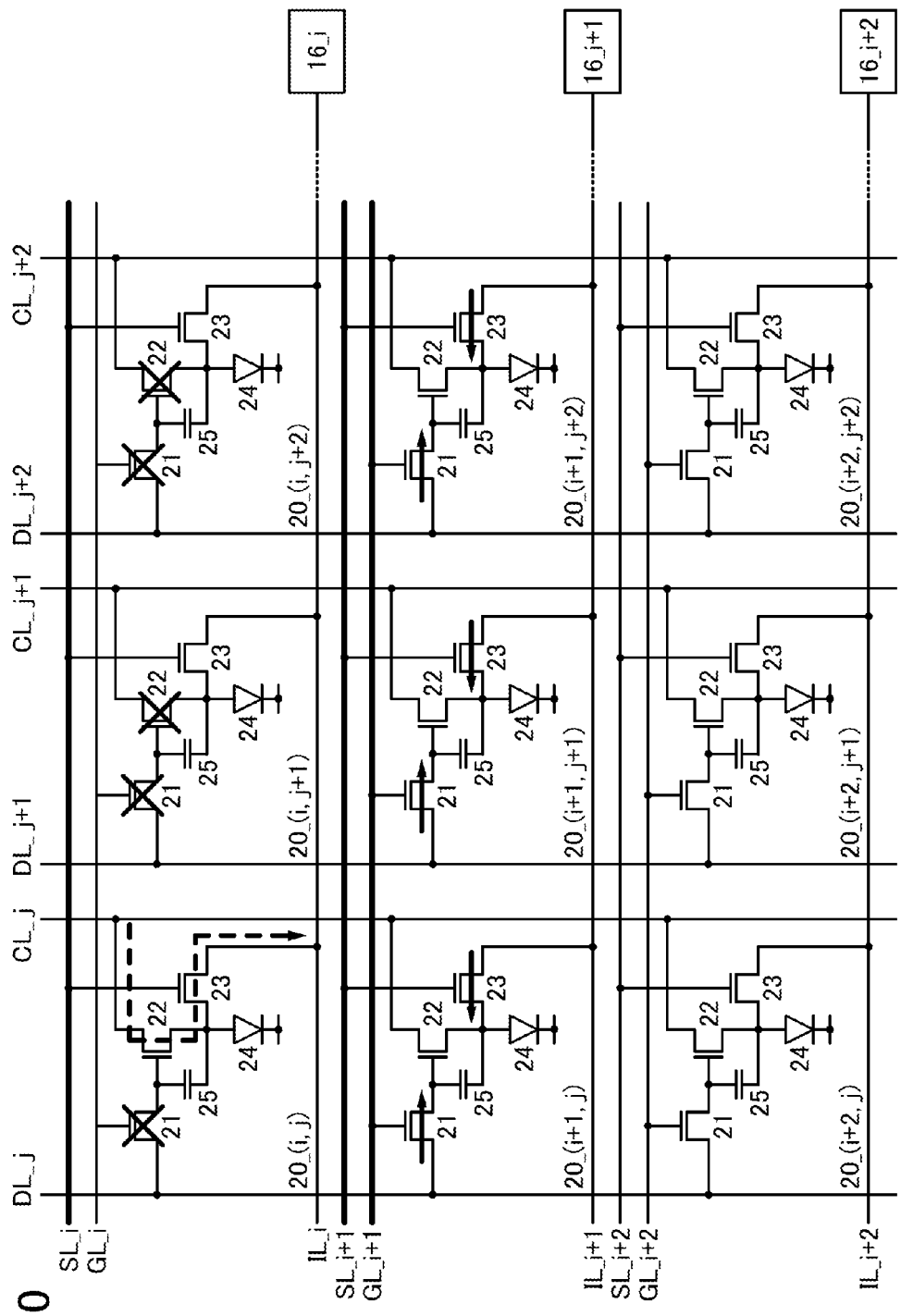
FIG. 10 is a circuit diagram for explaining operation of one embodiment of the present invention.

Next, as shown in FIG. 10, after the selection of the pixels 20 in the i-th row is finished, the pixels 20 in the (i+1)-th row are selected. When the pixels 20 in the (i+1)-th row are selected, selection signals are supplied to the wiring GL_i+1 and the wiring SL_i+1. In addition, the supply of the selection signal input to the wiring GL_i is stopped and a non-selection signal is input to the wiring GL_i. Consequently, the transistors 21 in the i-th row are turned off. Note that the supply of the selection signal to the wiring GL_i+1 and the supply of the selection signal to the wiring SL_i+1 may be performed in different periods in the same manner as that shown in FIG. 8 and FIG. 9.

In the pixel 20_(i, j+1) and the pixel 20_(i, j+2), since a potential difference between the gate and the source of the transistor 22 is maintained, a current does not flow through the transistor 22 and the light-emitting element 24 in the pixel 20_(i, j+1) and the pixel 20_(i, j+2). As a result, the light-emitting elements 24 in the pixel 20_(i, j+1) and the pixel 20_(i, j+2) are maintained in the state of black display or the non-display state. Furthermore, the wiring CL_j+1 and the reading circuit 16_i are brought out of electrical contact with each other, and the wiring CL_j+2 and the reading circuit 16_i are brought out of electrical contact with each other.

In the pixel 20_(i, j), since the reading signal is held in the gate of the transistor 22, the transistor 22 is maintained in the on state. Since the selection signal is supplied to the wiring SL_i, the transistor 23 is maintained in the on state. Accordingly, in the period during which the pixels in the (i+1)-th row are selected, data on current characteristics of the transistor 22 in the pixel 20_(i, j) can be read out by the reading circuit 16_i. At this time, the potential of the wiring IL_i is controlled by the reading circuit 16_i. Therefore, a current does not flow through the light-emitting element.

As described above, the transistor 23 in the pixel 20_(i, j) is preferably in an on state after the selection of the pixels in the i-th row is finished. This enables data on current characteristics to be read out not only at the time of selection of the pixels in the i-th row but also after the selection of the pixels 20 in the (i+1)-th row. In other words, a data signal can be input to the other pixels 20 in the (i+1)-th row or the like within the period during which reading of data on current characteristics of the pixels 20 in the i-th row is performed. In this case, a signal that makes the transistor 23 in an on state needs to keep being input to the wiring SL_i after the selection of the pixels 20 in the (i+1)-th row. This can, for example, be achieved by connecting a latch circuit to the wiring SL so that the input signal for the selection of the pixels 20 in the i-th row can be held after the selection of the pixels 20 in the (i+1)-th row.

In the case where a decoder circuit and the like is used in the gate line driver circuit, the selection signal can kept being supplied to the wiring SL_i, even without the connection of a latch circuit and the like to the wiring SL, by controlling a signal input to the decoder circuit.

Note that in FIG. 10, normal video signals are supplied to the pixel 20_(i+1, j), the pixel 20_(i+1, j+1), and the pixel 20_(i+1, j+2) that are pixels in the (i+1)-th row.

Figure 11:
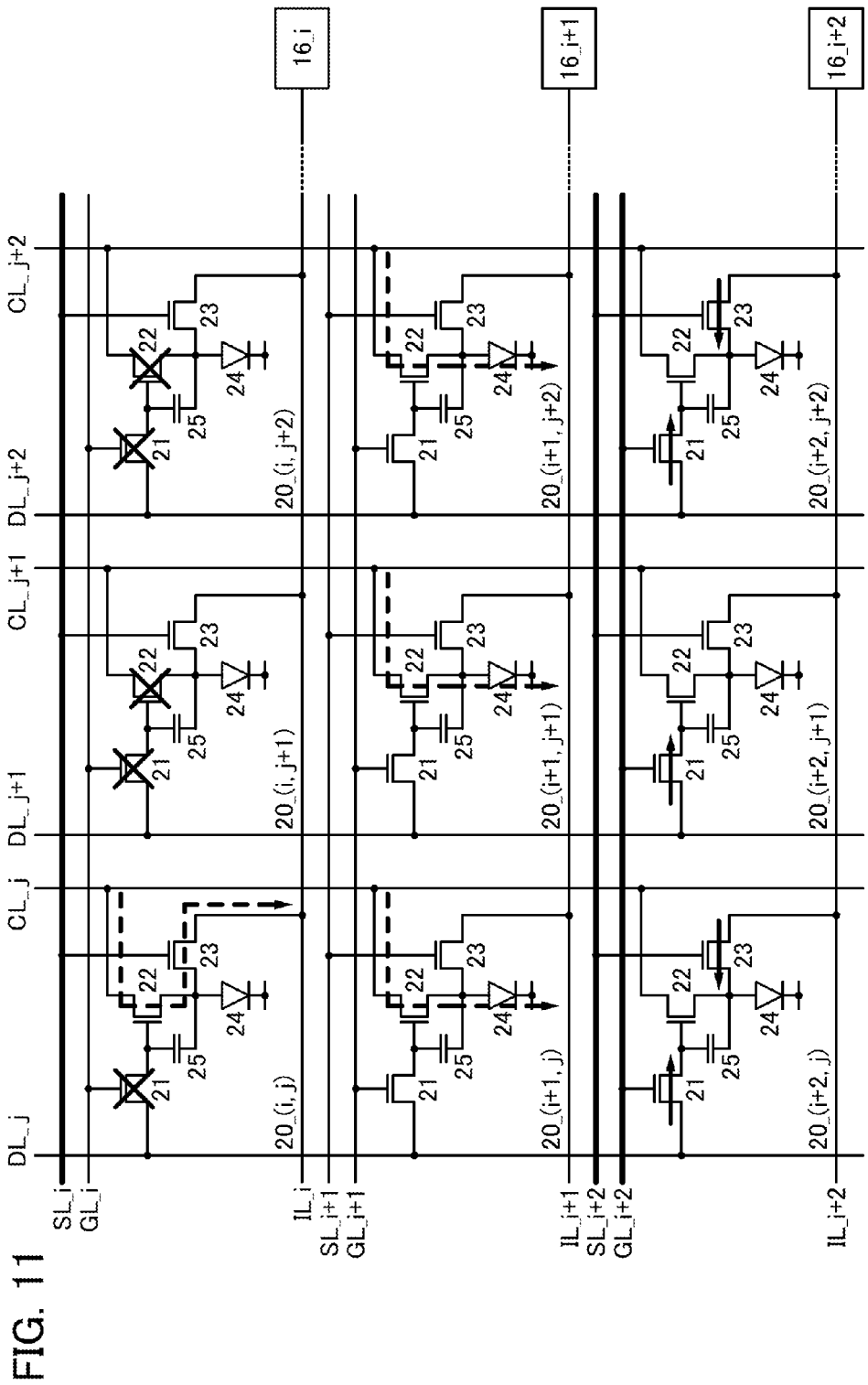
FIG. 11 is a circuit diagram for explaining operation of one embodiment of the present invention.

Next, as shown in FIG. 11, after the selection of the pixels 20 in the (i+1)-th row is finished, the pixels 20 in the (i+2)-th row are selected. When the pixels in the (i+2)-th row are selected, selection signals are supplied to the wiring GL_i+2 and the wiring SL_i+2. Then, video signals are supplied to the pixel 20_(i+2, j), the pixel 20_(i+2, j+1), and the pixel 20_(i+2, j+2). In addition, the supply of the selection signals to the wiring GL_i+1 and the wiring SL_i+1 is stopped, and selection signals are supplied to the wiring GL_i+2 and the wiring SL_i+2. Consequently, the transistors 21 and the transistors 23 in the pixels 20 in the (i+1)-th row are turned off. In the pixels 20 in the (i+1)-th row, a current corresponding to the video signals flow through the light-emitting elements. That is, the display period starts in the pixel 20_(i+1, j), the pixel 20_(i+1, j+1), and the pixel 20_(i+1, j+2). Note that the supply of the selection signal to the wiring GL_i+2 and the supply of the selection signal to the wiring SL_i+2 may be performed in different periods in the same manner as that shown in FIG. 8 and FIG. 9.

Here, in the pixel 20_(i, j), since the reading signal is held in the gate of the transistor 22, the transistor 22 is maintained in the on state. Since the selection signal is supplied to the wiring SL_i, the transistor 23 is maintained in the on state. Accordingly, in the period during which the pixels 20 in the (i+2)-th row are selected or the period during which the display operation of the pixels 20 in the (i+1)-th row is performed, data on current characteristics of the transistor 22 in the pixel 20_(1, j) can be read out by the reading circuit 16_i.

Figure 12:
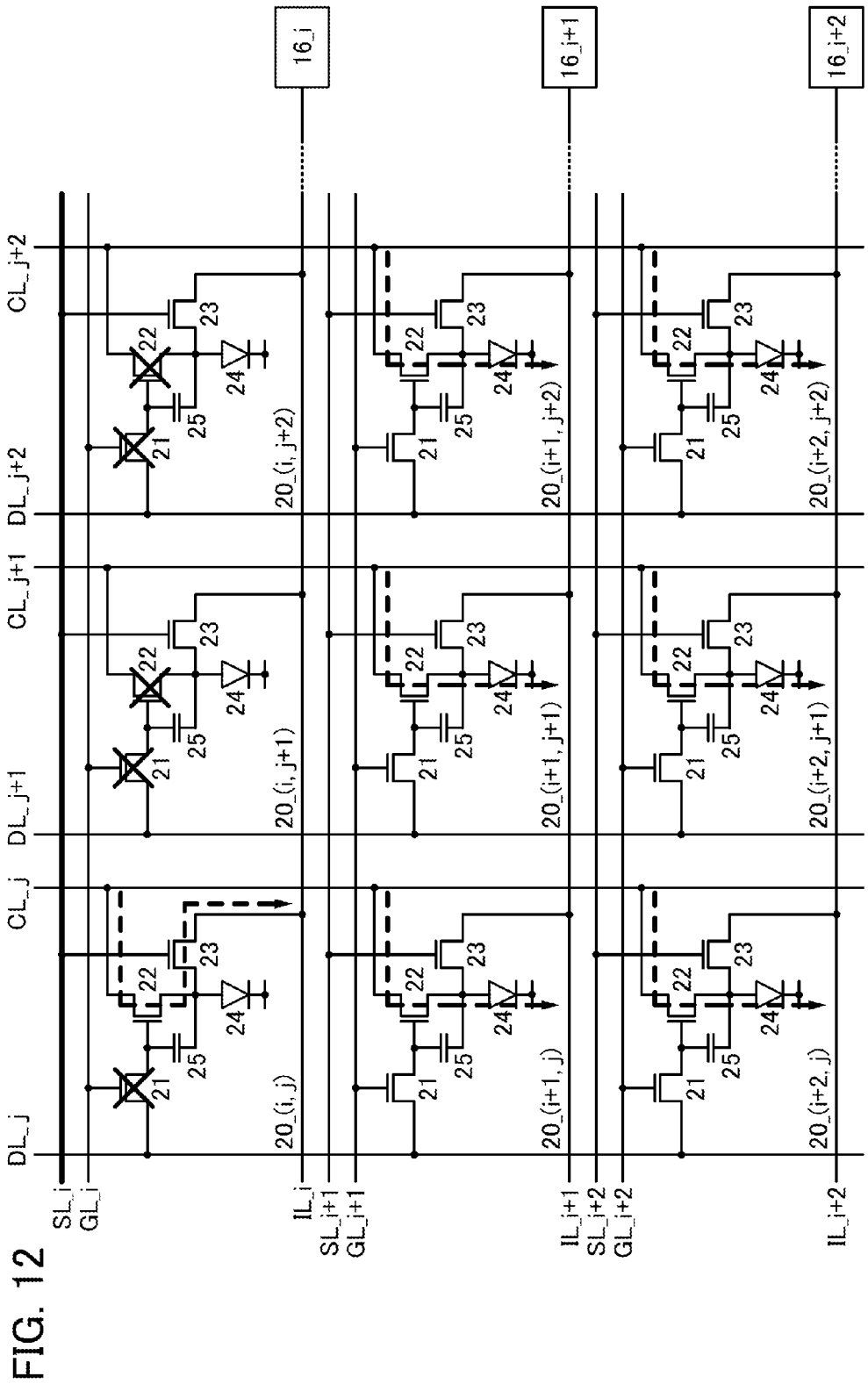
FIG. 12 is a circuit diagram for explaining operation of one embodiment of the present invention.

Next, as shown in FIG. 12, after the selection of the pixels 20 in the (i+2)-th row is finished, the pixels 20 in the next row are selected. When the pixels in the next row are selected, selection signals are supplied and video signals are supplied to the next row similarly. In addition, the supply of the selection signals to the wiring GL_i+2 and the wiring SL_i+2 is stopped. Consequently, the transistors 21 and the transistors 23 in the pixels 20 in the (i+2)-th row are turned off. In the pixels 20 in the (i+2)-th row, a current corresponding to the video signal flows through the light-emitting elements. That is, the display period starts in the pixel 20_(i+2, j), the pixel 20_(i+2, j+1), and the pixel 20_(i+2, j+2).

The subsequent rows are scanned and a similar operation is repeated.

By the above-described operation, writing of a video signal to a pixel and reading of data on current characteristics of a driving transistor can be performed. After the pixels 20 in the last row are selected, one frame period is finished and the next frame period starts.

Figure 13:
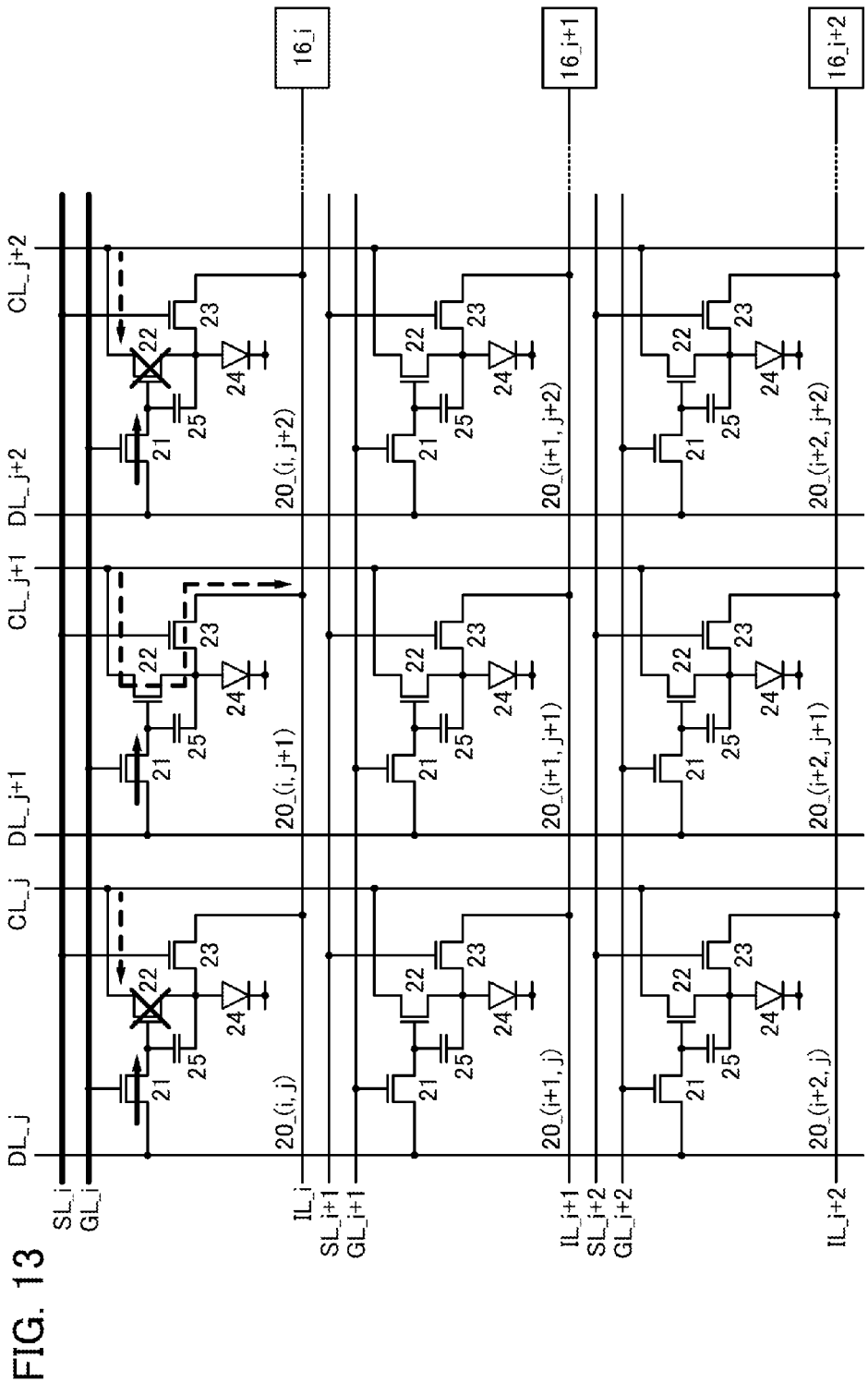
FIG. 13 is a circuit diagram for explaining operation of one embodiment of the present invention.

In the case where, also in the next frame period, all the pixels 20 in the i-th row are displayed in black and data on current characteristics is read out from the pixel 20_(i, j) in the i-th row and the j-th column, the operation is similarly performed from FIG. 9. However, in the case where all the pixels 20 in the i-th row are displayed in black and data on current characteristics is read out from the pixel other than the pixel 20_(i, j) in the i-th row and the j-th column, for example, the pixel 20_(i, j+1) in the i-th row and the (j+1)-th column, the operation shown in FIG. 13 is performed instead of the operation shown in FIG. 9. In other words, video signals for the pixel 20_(i, j) and the pixel 20_(i, j+2) (here, video signals for black display) are supplied to the wiring DL_j and the wiring DL_j+2, respectively, and a reading signal is supplied to the wiring DL_j+1 and the pixel 20_(i, j+1). In this manner, data on current characteristics can be read out from the pixel 20_(i, j+1) in the i-th row and the (j+1)-th column. Furthermore, in the next frame period, data on current characteristics can be read out from a different pixel. By repeating the operation this way, data on current characteristics can be read out from all the pixels in one row.

Figure 14:
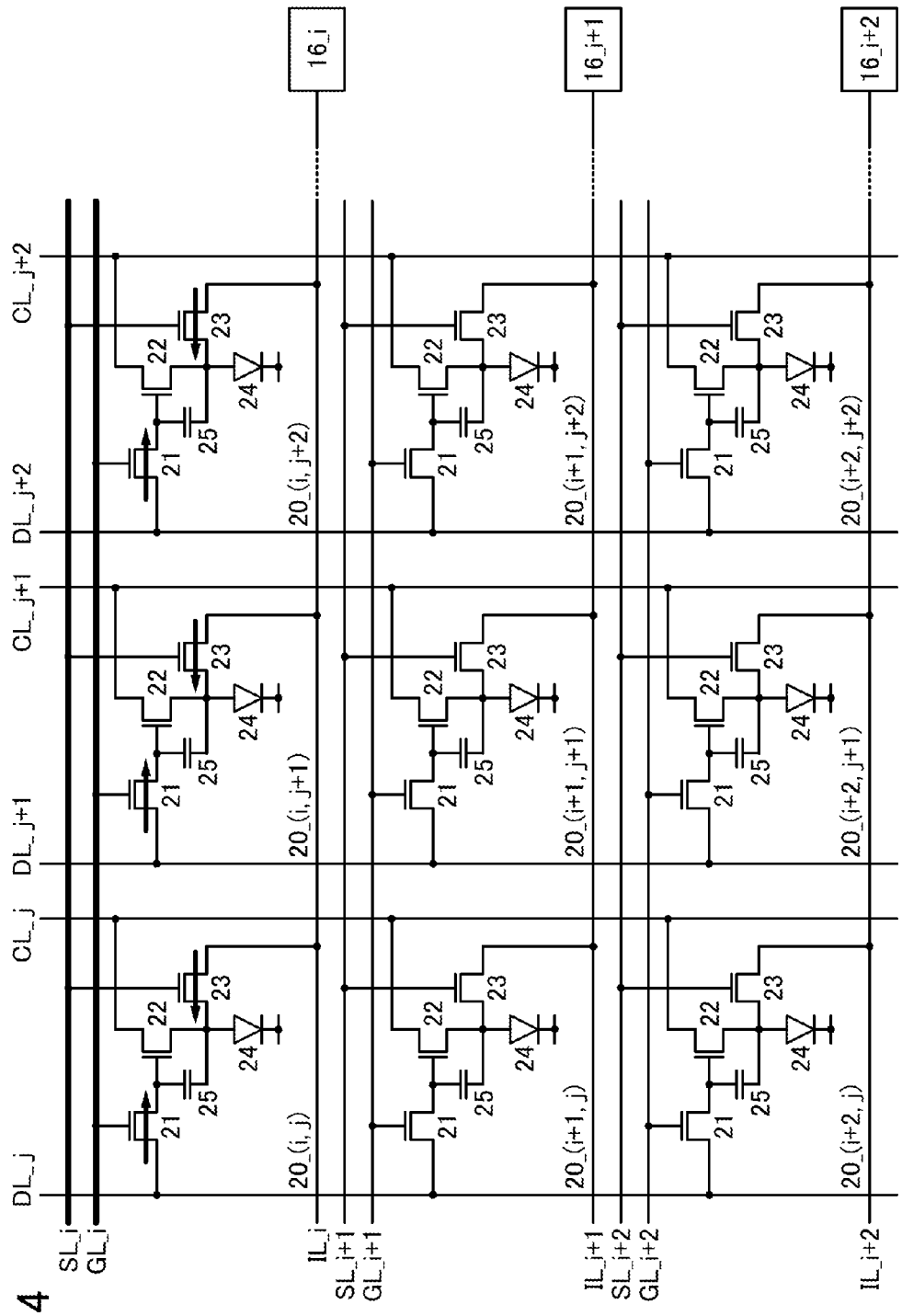
FIG. 14 is a circuit diagram for explaining operation of one embodiment of the present invention.

In the next frame, if some of the pixels 20 in the i-th row are not displayed in black, normal operation is performed. In this case, the operation shown in FIG. 14 is performed instead of the operation shown in FIG. 9.

Then, in accordance with the data on current characteristics of the transistor 22 of the pixel 20_(i, j) or the like, which is read out by the operation shown in FIG. 8 to FIG. 14, a video signal for correcting the variation in current characteristics of the transistor 22 is produced. This video signal can be input to the pixel 20_(i, j) or the like in the next or later frame period. As a result, variation in transistors or adverse effects due to deterioration can be reduced.

Note that the reading of the data on current characteristics from the pixel 20_(i, j) can be performed after the operation shown in FIG. 9 is performed, until the pixel 20_(i, j) is selected again in the next frame period (not including the time when the pixel 20_(i, j) is selected in the next frame period).

In the case where there is a row having all the pixels displayed in black other than the i-th row, data on current characteristics can be read out by an operation similar to the above-described operation.

Moreover, reading may be performed from a plurality of rows in one frame period. For example, in a manner similar to that of the operation in the i-th row in FIG. 9, a reading signal and a video signal may be supplied to the (i+1)-th row in FIG. 10; in this case, data on current characteristics can be read out from one pixel among the pixels in the (i+1)-th row. Alternatively, in a manner similar to that of the operation in the i-th row in FIG. 9, a reading signal and video signals may be supplied to the (i+2)-th row in FIG. 11; in this case, data on current characteristics can be read out from one pixel among the pixels in the (i+2)-th row. As a result, reading operation can be executed in a plurality of rows.

The variation in current characteristics of the driving transistors among pixels of the display device of this embodiment can be corrected by the above-described driving method. In this driving method, the variation in current characteristics of the driving transistors can be corrected in parallel with the display operation of the display device.

Accordingly, in a product including the display device described in this embodiment, variation in luminance of pixels of the product can be corrected while display inspection of the product is performed in pre-shipment inspection. Thus, the period of the pre-shipment inspection of the product can be shortened, resulting in cost reduction of the product.

With regard also to a product that has been shipped, the above-described driving method of the display device is performed each time the power is turned on and an image is displayed. Thus, variation in luminance due to deterioration over time and the like after the shipment of the product can be automatically corrected. This enables a longer product lifetime.

Figure 15A:
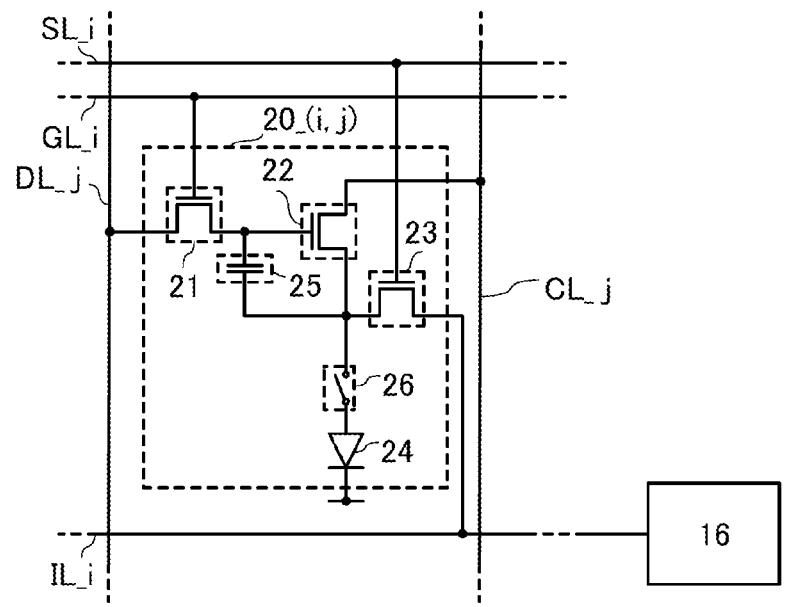
FIGS. 15A and 15B are circuit diagrams for explaining one embodiment of the present invention.
Figure 15B:
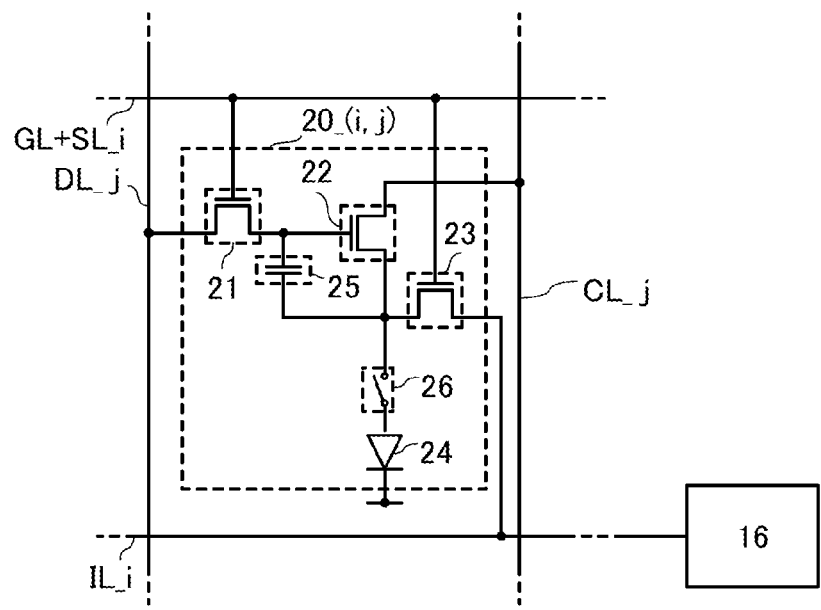

The pixel structure of the display device of this embodiment is not limited to that shown in FIG. 4. For example, in the pixel 20_(i, j) in FIG. 4, a switch 26 may be provided between the light-emitting element 24 and the transistor 22. FIGS. 15A and 15B show circuit diagrams in that case. FIG. 15A shows the case where the switch 26 is provided in the structure of FIG. 4, and FIG. 15B shows the case where the switch 26 is provided in the structure of FIG. 6. By keeping the switch 26 in an off state, the non-light-emitting state of the light-emitting element 24 can be surely maintained, for example, in a reading pixel.

<Structural Example of Reading Circuit>

Next, specific structure examples of the reading circuit 16 are described with reference to the circuit diagrams in FIGS. 16A to 16D.

Figure 16A:
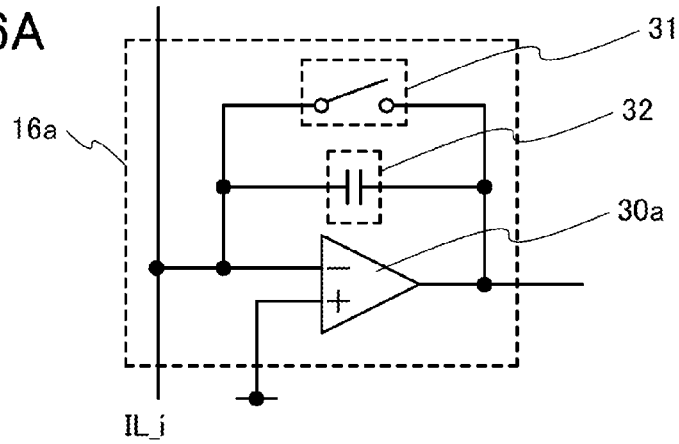
FIGS. 16A to 16D are circuit diagrams for explaining one embodiment of the present invention.

A reading circuit 16a in FIG. 16A includes an operational amplifier 30a, a capacitor 32, and a switch 31. In the operational amplifier 30a, a reference potential is input to a non-inverting input terminal; an inverting input terminal is connected to the wiring IL_i, one terminal of the switch 31, and one electrode of the capacitor 32; and an output terminal is connected to the other terminal of the switch 31 and the other electrode of the capacitor 32. The operational amplifier 30a operates so that the potential of the non-inverting input terminal and the potential of the inverting input terminal are equal to each other. Thus, the potential of the wiring IL_i can be controlled by the potential of the non-inverting input terminal Thus, it can be said that the reading circuit 16a is configured to control the potential of the wiring IL_i. Therefore, also in the address period, the potential of the wiring IL_i may be controlled by the reading circuit 16a.

With such a structure, a current integral value of the wiring IL_i can be read out by the reading circuit 16a.

Figure 16B:
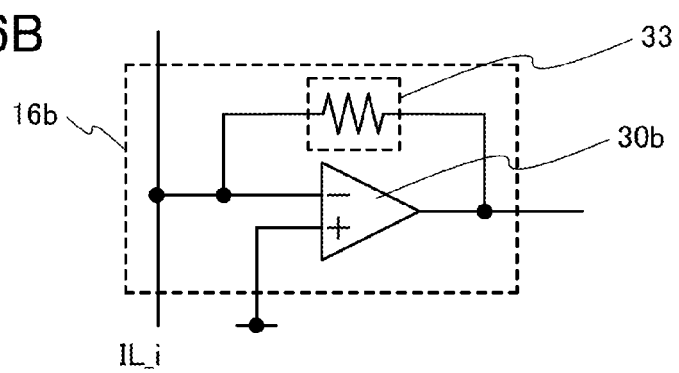

A reading circuit 16b in FIG. 16B includes an operational amplifier 30b and a resistor 33. In the operational amplifier 30b, a reference potential is input to a non-inverting input terminal; an inverting input terminal is connected to the wiring IL_i and one electrode of the resistor 33; and an output terminal is connected to the other electrode of the resistor 33. The operational amplifier 30b operates so that the potential of the non-inverting input terminal and the potential of the inverting input terminal are equal to each other. Thus, the potential of the wiring IL_i can be controlled by the potential of the non-inverting input terminal Thus, it can be said that the reading circuit 16b is configured to control the potential of the wiring IL_i. Therefore, also in the address period, the potential of the wiring IL_i may be controlled by the reading circuit 16b.

With such a structure, the reading circuit 16b converts the current value of the wiring IL_i into a voltage value to be read out.

Figure 16C:
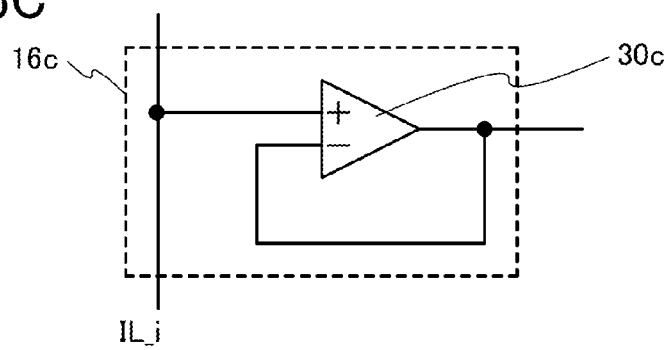

A reading circuit 16c in FIG. 16C includes an operational amplifier 30c. In the operational amplifier 30c, a non-inverting input terminal is connected to the wiring IL_i and an inverting input terminal is connected to an output terminal of the operational amplifier 30c. The operational amplifier 30c operates so that the potential of the non-inverting input terminal and the potential of the inverting input terminal are equal to each other. Thus, the potential of the wiring IL_i can be output from the operation amplifier 30c as the potential of the inverting input terminal; i.e., the potential of the output terminal Note that the reading circuit 16c does not have a function of controlling the potential of the wiring IL_i. Thus, as shown in FIG. 5, the potential of the wiring IL_i may be controlled by using another circuit.

Figure 16D:
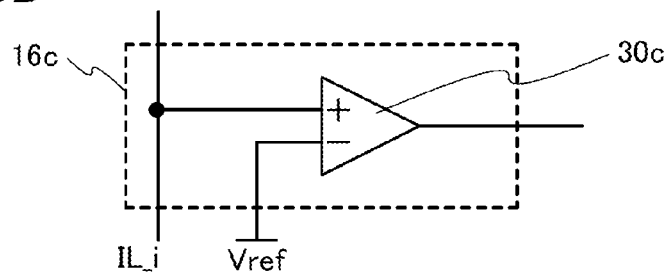

As shown in FIG. 16D, the inverting input terminal may be connected to another wiring Vref without being connected to the output terminal of the operational amplifier 30c. This reading circuit can operate as a comparator circuit. The potential of the wiring Vref is compared with the potential of the inverting input terminal and a corresponding result is output. By utilizing this circuit, an AD converter circuit can be formed. In that case, changing the potential of the wiring Vref can convert an analog potential into a digital potential. A plurality of operation amplifiers may be provided in parallel to form a flash AD converter circuit.

With this structure, the threshold voltage of the transistor 22 that is connected to the wiring IL_i can be read out by the reading circuit 16c.

<Connection Example of Reading Circuit>

Although the structure in which each wiring IL is connected to a different reading circuit 16 is shown in FIG. 8 to FIG. 14, a plurality of wirings IL may be connected to one reading circuit 16. A configuration example of the pixels 20 and the reading circuit 16 with that structure is shown in FIG. 17.

In FIG. 17, the wiring IL_i, the wiring IL_i+1, and the wiring IL_i+2 are connected to the same reading circuit 16 via switches. Specifically, the wiring IL_i is connected to the reading circuit 16 via a switch 41_i, the wiring IL_i+1 is connected to the reading circuit 16 via a switch 41_i+1, and the wiring IL_i+2 is connected to the reading circuit 16 via a switch 41_i+2. Although the configuration in which three wirings IL are connected to one reading circuit 16 is described here, the number of wirings IL connected to one reading circuit 16 is not limited to three and may be an arbitrary number of two or more.

In the case where data on current characteristics are read out from the pixels 20 in the i-th row, the switch 41_i is turned on and the switch 41_i+1 and the switch 41_i+2 are turned off. In this way, the wiring IL_i is brought into electrical contact with the reading circuit 16 and data on current characteristics can be read out from the pixels 20 connected to the wiring IL_i. Similarly, in the case where data on current characteristics are read out from the pixels 20 in the (i+1)-th row, the switch 41_i+1 is turned on and the switch 41_i and the switch 41_i+2 are turned off. In the case where data on current characteristics are read out from the pixels 20 in the (i+2)-th row, the switch 41_i+2 is turned on and the switch 41_i and the switch 41_i+1 are turned off.

With this structure, the number of reading circuits 16 can be reduced as compared with the case in which one reading circuit 16 is provided per wiring IL; accordingly, the area occupied by the circuit portion 13 can be reduced.

The switches 41 can be each formed using a transistor, for example. In this case, one of a source and a drain of the transistor is connected to the wiring IL, and the other of the source and the drain is connected to the reading circuit 16. As a material of the transistor, a semiconductor material that can be used in the above-described transistors 21 to 23 can be used. Here, OS transistors are particularly preferable as the transistors used as the switches 41. In this case, a current flow from the wiring IL to the reading circuit 16 can be prevented in the rows where reading of data on current characteristics is not performed, so that accurate reading of data on current characteristics can be achieved.

In the row where reading of data on current characteristics is performed, it is preferable to accurately supply a current in the wiring IL to the reading circuit 16. Therefore, the transistors used as the switches 41 preferably have a higher current supply capability than the transistors 21, 22, and 23. For this purpose, W (channel width)/L (channel length) of the transistors used as the switches 41 is preferably larger than W/L of the transistors 21, 22, and 23.

<Structural Example of Output Control Circuit>

Figure 18A:
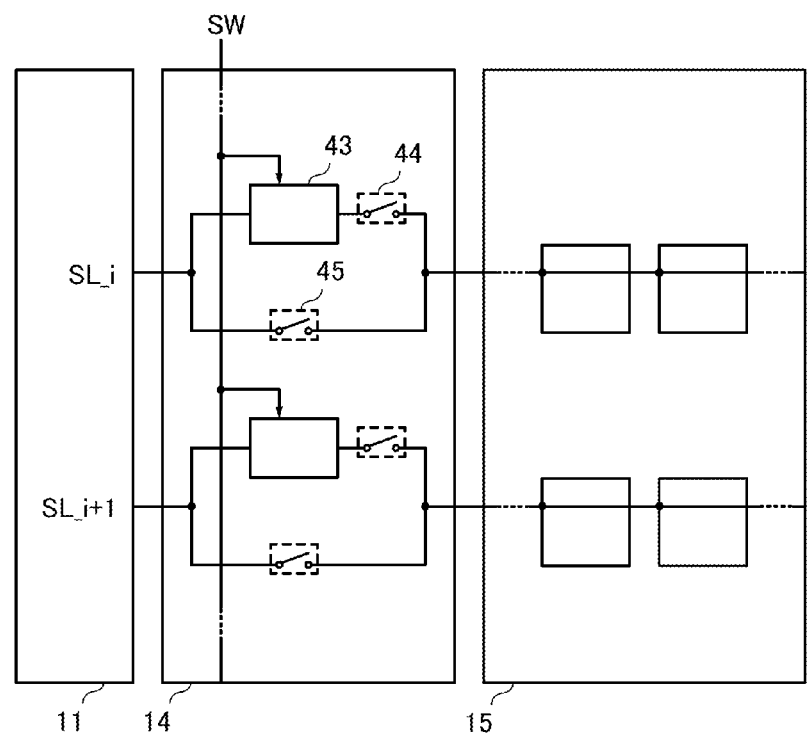
FIGS. 18A and 18B are circuit diagrams for explaining one embodiment of the present invention.
Figure 18B:
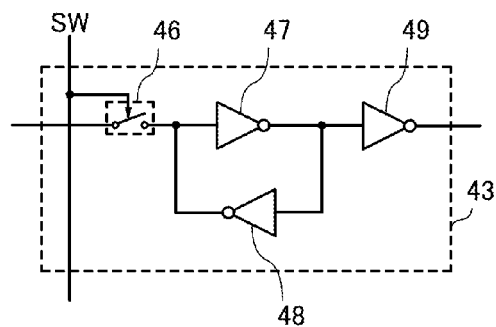

In the driving method of the display device shown in FIG. 3 and the like, data on the current characteristics is read out by sequentially performing scanning from the first row and selecting a row in which all the pixels are displayed in black. When such a driving method is employed, an output control circuit which controls a signal output from the driver circuit 11 is preferably provided. An example of the structure of the output control circuit is described with reference to FIGS. 18A and 18B. FIG. 18A shows the driver circuit 11, an output control circuit 14, and the pixel portion 15 of the display device. FIG. 18B shows an example of the structure of a latch circuit 43 shown in FIG. 18A.

The display device in FIG. 18A includes the output control circuit 14 between the driver circuit 11 and the pixel portion 15. The wiring SL_i connected to the driver circuit 11 is branched into two circuits in the output control circuit 14, and one extends in the row direction via the latch circuit 43 and a switch 44, and the other extends in the row direction via a switch 45. The branched wirings SL_i are joined via the switch 44 and the switch 45, and extend in the row direction to the pixel portion 15.

As shown in FIG. 18B, the latch circuit 43 includes a switch 46, an inverter 47, an inverter 48, and an inverter 49. One terminal of the switch 46 is connected to the wiring SL_i and the other terminal is connected to an input terminal of the inverter 47 and an output terminal of the inverter 48. An output terminal of the inverter 47 is connected to an input terminal of the inverter 48 and an input terminal of the inverter 49. An output terminal of the inverter 49 is connected to one terminal of the switch 44. The switch 46 is controlled by the wiring SW which extends in the column direction.

In a normal display mode, the switch 44 is turned off and the switch 45 is turned on, so that a signal is output from the driver circuit 11. In contrast, when a row in which data on current characteristics are read out is selected, the switch 44 is turned on and the switch 45 is turned off, whereby a signal is output from the driver circuit 11.

Furthermore, when the row in which all the pixels are displayed in black is selected, the switch 46 is turned on by the wiring SW. Accordingly, a signal input to the wiring SL_i can be held in the latch circuit 43. Thus, when the (i+1)-th row is selected and the signal input to the wiring SL_i from the driver circuit 11 is stopped, the transistor 23 can be kept turned on by the signal held by the latch circuit 43 via the wiring SL_i.

In the display device in FIGS. 18A and 18B, an example is illustrated in which a signal is output from the wiring SL via the output control circuit 14; however, the display device of this embodiment is not limited thereto. For example, a signal may be output from the wiring GL, in addition to the wiring SL, via the output control circuit 14.

In the display device of this embodiment, in the case of using the wiring GL, the above driving method can be used without holding a signal using the latch circuit 43; thus, a structure without the latch circuit 43 may be employed.

In the display device of this embodiment, the output control circuit 14 is not necessarily provided. For example, in the case where a signal of the driver circuit 11 can be selectively output to an arbitrary row by using a decoder or the like, the output control circuit 14 is not necessarily provided.

This embodiment shows an example of a basic principle. Thus, the structure and method described in this embodiment can be combined as appropriate with any of the structures and methods described in the other embodiments.

Embodiment 2

<Example of Variation of Semiconductor Device>

In this embodiment, a structure of a semiconductor device and a driving method thereof which are different from those described in Embodiment 1 are described with reference to FIG. 19 and FIG. 20.

Figure 19:
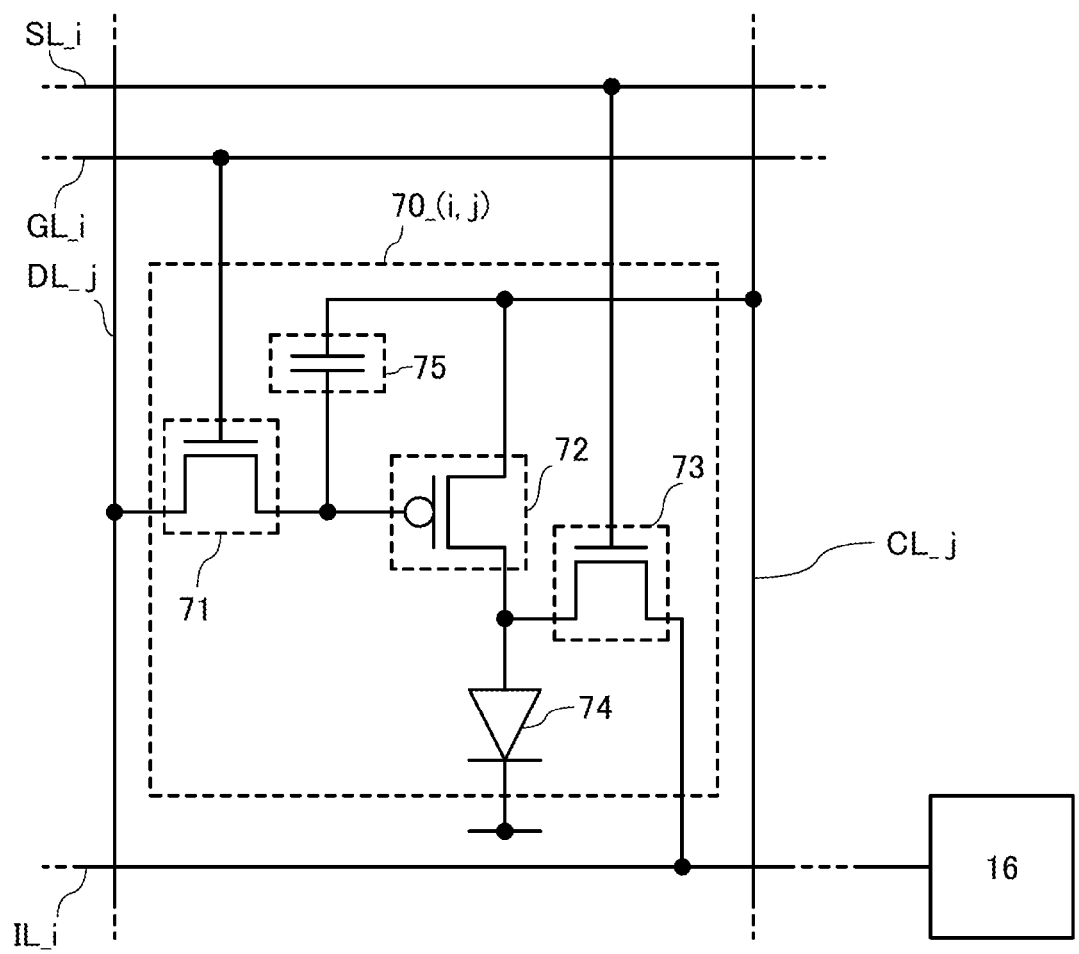
FIG. 19 is a circuit diagram for explaining one embodiment of the present invention.

FIG. 19 shows a pixel structure of the display device of this embodiment. The display device of this embodiment includes, as in the display device in FIG. 3, the pixel portion 15 including (m×n) pixels 70, a variety of peripheral circuits, and a variety of wirings. The same numerals and symbols are used for the peripheral circuits and the wirings.

FIG. 19 shows a structure of a pixel 70_(i, j) in the i-th row and the j-th column. The pixel 70_(i, j) includes a transistor 71, a p-channel transistor 72, a transistor 73, a light-emitting element 74, and a capacitor 75. Note that these elements included in the pixel 70_(i, j) are connected to the wiring GL_i, the wiring SL_i, the wiring DL_j, the wiring CL_j, and the wiring IL_i.

A specific connection relation in the pixel 70_(i, j) is as follows. A gate of the transistor 71 is connected to the wiring GL_i, one of a source and a drain thereof is connected to the wiring DL_j, and the other of the source and the drain thereof is connected to a gate of the transistor 72. One of a source and a drain of the transistor 72 is connected to one of a source and a drain of the transistor 73 and one of electrodes (hereinafter also referred to as a pixel electrode) of the light-emitting element 74. The other of the source and the drain of the transistor 72 (also referred to as the source electrode of the transistor 72) is connected to the wiring CL_j. A gate of the transistor 73 is connected to the wiring SL_i and the other of the source and the drain thereof is connected to the wiring IL_j. A predetermined potential (hereinafter also referred to as a common potential) is supplied to the other of the electrodes (hereinafter also referred to as a common electrode) of the light-emitting element 74.

The wiring IL_i is connected to the reading circuit 16 included in the circuit portion 13.

One of electrodes of the capacitor 75 is connected to the other of the source and the drain of the transistor 71 and the gate of the transistor 72, and the other electrode thereof is connected to the other of the source and the drain of the transistor 72. With the capacitor 75 provided as described above, more charges can be held in the gate electrode of the transistor 72, and a holding period of image data can be made longer.

Note that the capacitor 75 is not necessarily provided. For example, a high parasitic capacitance of the transistor 72 between the gate of the transistor 72 and the other of the source and the drain of the transistor 72 can be an alternative to the capacitor 75.

Note that the description of the transistors 21 and 23 can be referred to for the structures of the transistors 71 and 73. Furthermore, the description of the light-emitting element 24 can be referred to for the structure of the light-emitting element 74.

The pixel structure in FIG. 19 is different from the pixel structure in FIG. 4 in using a p-channel transistor as the transistor 72 and accordingly in having a different connection relation of the capacitor 75. The driving method of the display device described in Embodiment 1 can be referred to for the driving method of the display device in FIG. 19, considering a potential of the transistor 72 which is opposite to a potential of the transistor 22. As for the material of the semiconductor that can be used in the transistor 72, the description of the transistor 22 can be referred to.

Figure 20:
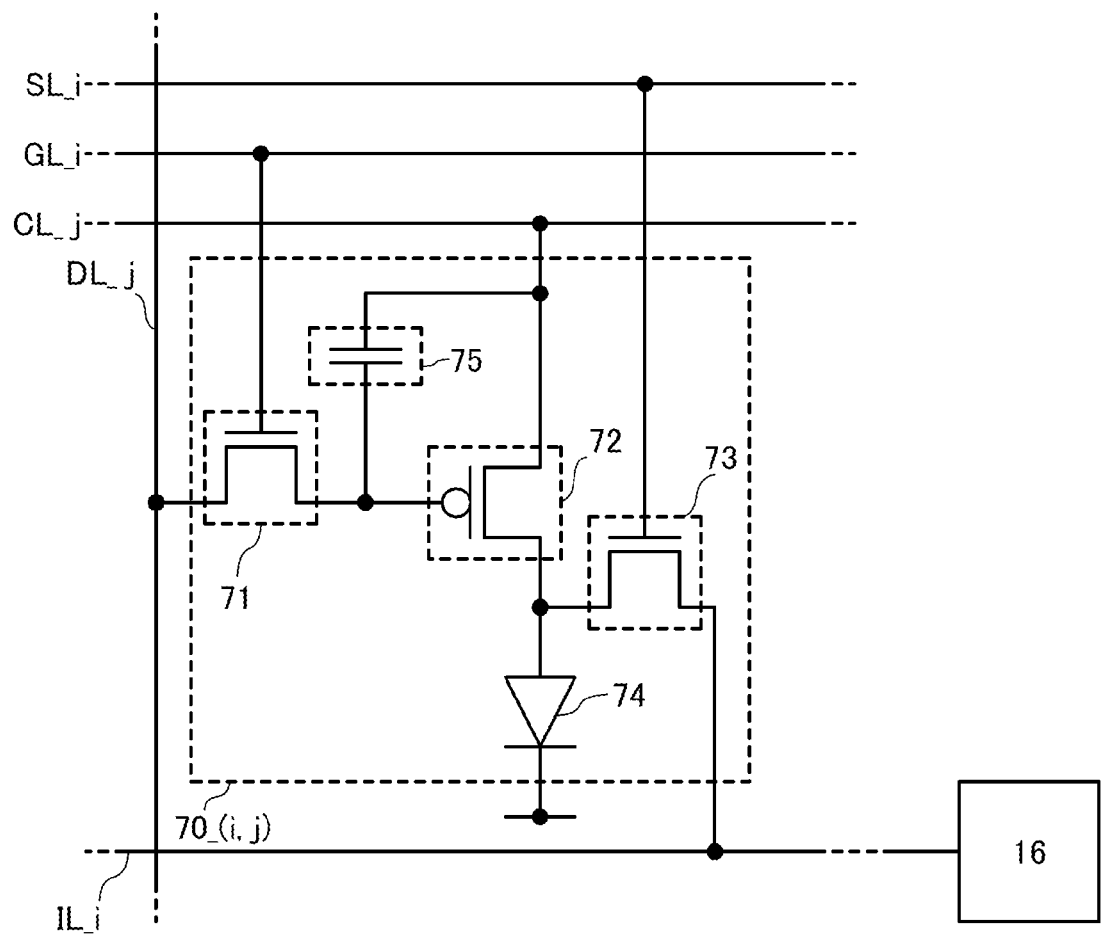
FIG. 20 is a circuit diagram for explaining one embodiment of the present invention.

FIG. 20 shows a pixel structure that is different from that in FIG. 19. The pixel structure in FIG. 20 is different from that in FIG. 19 in that the wiring CL extends in the row direction, and other structures are similar.

Here, the potential of the wiring CL may be changed in an analog manner, in which case the potential of the wiring CL can be adjusted in accordance with the changes in the potentials of the wiring GL and the wiring SL. For example, in FIG. 8, the potential of the wiring CL_j can be lower than the common potential, or at the same level as the common potential. The potential of the wiring CL_j is set as described above, so that reverse bias is applied to the light-emitting element 74 or bias is not applied to the light-emitting element 74. Thus, the black display state of the pixels in the i-th row can be maintained. Furthermore, even if forward bias is applied to the light-emitting element 74, the potential difference between the wiring CL_j and the common potential can be suppressed to extremely small in order that the black display state can be maintained. The extremely small potential difference is preferably a potential difference of approximately several volts or lower, for example, 2 volts or lower, further preferably 1 volt or lower.

The variation in current characteristics of the driving transistor among pixels of the display device described in this embodiment can be corrected by the above-described driving method. In this driving method, the variation in current characteristics of the driving transistors can be corrected in parallel with the display operation of the display device.

Figure 21:
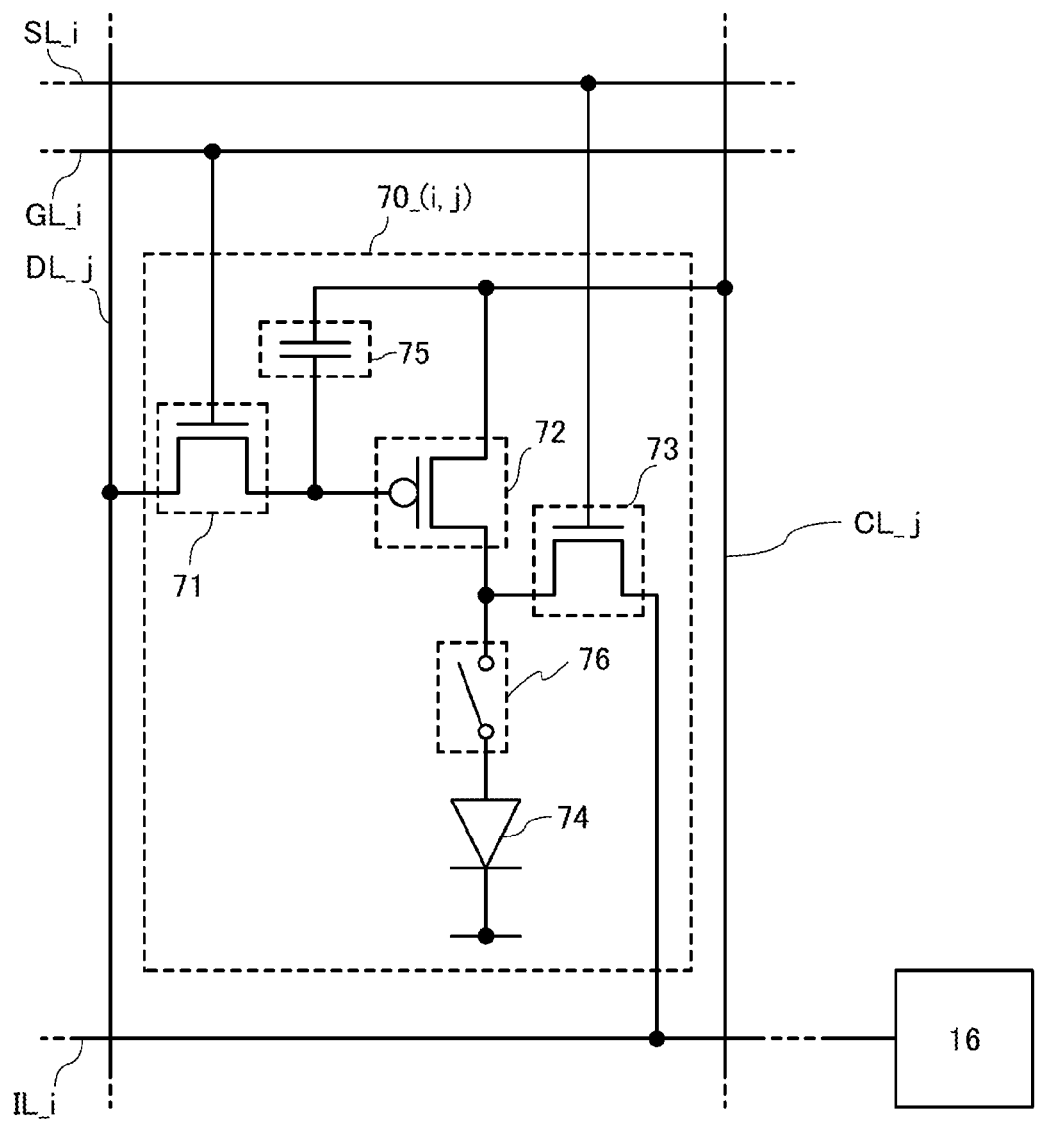
FIG. 21 is a circuit diagram for explaining one embodiment of the present invention.
Figure 22:
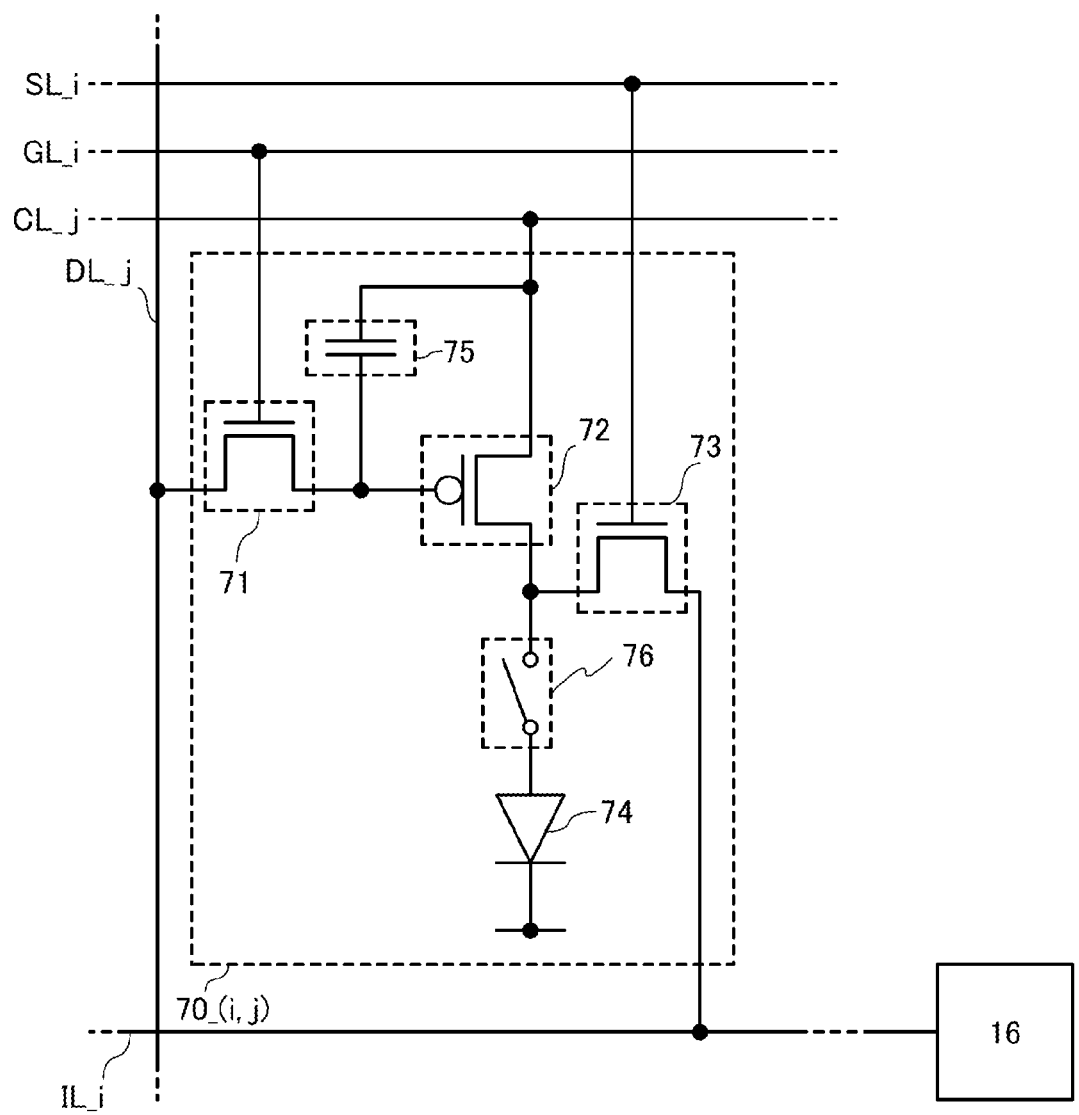
FIG. 22 is a circuit diagram for explaining one embodiment of the present invention.

The pixel structure of the display device of this embodiment is not limited to that shown in FIG. 19 and FIG. 20. For example, in the pixel 70_(i, j) shown in FIG. 19 and FIG. 20, a switch 76 may be provided between the light-emitting element 74 and the transistor 72. FIG. 21 and FIG. 22 show the circuit diagrams in that case. FIG. 21 shows the case where the switch 76 is provided in the structure of FIG. 19, and FIG. 22 shows the case where the switch 76 is provided in the structure of FIG. 20. By keeping the switch 76 in an off state in the pixel 20_(i, j) or the like in FIG. 10 and FIG. 11, the non-light-emitting state of the light-emitting element 74 can be surely maintained.

This embodiment is obtained by performing change, addition, modification, removal, application, superordinate conceptualization, or subordinate conceptualization on part or the whole of another embodiment. Thus, the structure and method described in this embodiment can be combined as appropriate with any of the structures and methods described in the other embodiments.

Embodiment 3

<Structural Example of Pixel>

Figure 23A:
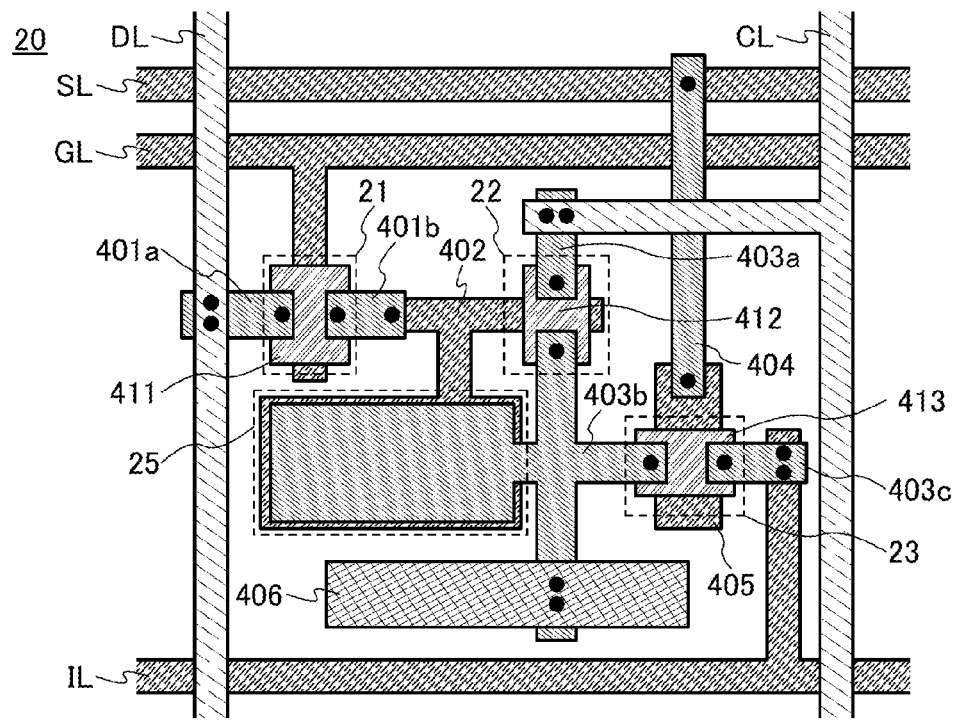
FIGS. 23A and 23B are views for explaining the layout of one embodiment of the present invention.
Figure 23B:
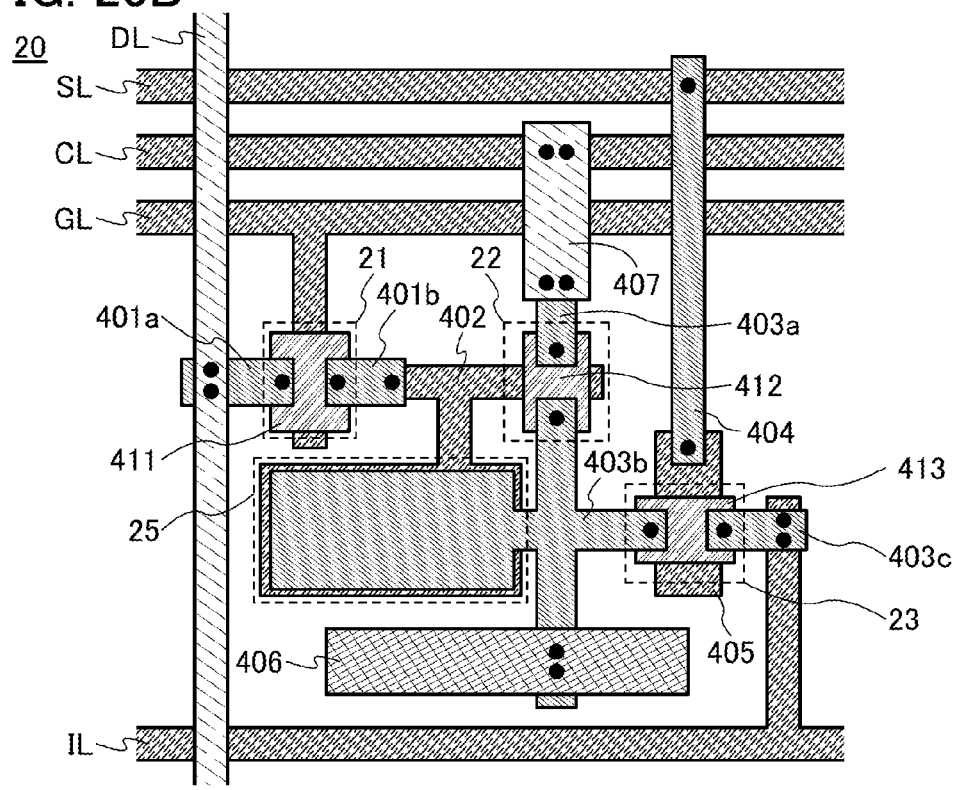

FIGS. 23A and 23B show layout examples of the pixel that can be used in the above embodiments. Note that the wirings, conductive layers, semiconductor layers, and the like shown by the same hatch pattern in FIGS. 23A and 23B can be formed using the same material in the same process. Although structural examples of the pixel 20 are described here, a similar structure can be applied to the pixel 70.

The pixel 20 in FIG. 23A includes the transistor 21, the transistor 22, the transistor 23, and the capacitor 25. The pixel also includes a conductive layer 406 having a function of the pixel electrode of the light-emitting element 24. As for connection relations of the elements, the description of FIG. 4 can be referred to. Note that black circles in the drawing represent contact holes.

The transistor 21 includes a semiconductor layer 411, the transistor 22 includes a semiconductor layer 412, and the transistor 23 includes a semiconductor layer 413. The semiconductor layer 411 is connected to a conductive layer 401a and a conductive layer 401b. The semiconductor layer 412 is connected to a conductive layer 403a and a conductive layer 403b. The semiconductor layer 413 is connected to the conductive layer 403b and a conductive layer 403c.

The conductive layer 401a is connected to the wiring DL. Note that part of the wiring DL may be used as the conductive layer 401a. The conductive layer 401b is connected to a conductive layer 402. The conductive layer 403a is connected to the wiring CL. Note that part of the wiring CL may be used as the conductive layer 403a. The conductive layer 403b is connected to the conductive layer 406 having a function of the one electrode of the light-emitting element 24. Note that part of the conductive layer 403b may be used as the conductive layer 406. The conductive layer 403c is connected to the wiring IL. Note that part of the wiring IL may be used as the conductive layer 403c. A conductive layer 405 is connected to a conductive layer 404, and the conductive layer 404 is connected to the wiring SL. Note that part of the conductive layer 404 may be used as the conductive layer 405, or part of the wiring SL may be used as the conductive layer 404 and the conductive layer 405.

The conductive layer 401a has a function of one of the source and the drain of the transistor 21. The conductive layer 401b has a function of the other of the source and the drain of the transistor 21. The conductive layer 402 has a function of the gate of the transistor 22 and one electrode of the capacitor 25. The conductive layer 403a has a function of one of the source and the drain of the transistor 22. The conductive layer 403b has a function of the other of the source and the drain of the transistor 22, one of the source and the drain of the transistor 23, and the other electrode of the capacitor 25. The conductive layer 403c has a function of the other of the source and the drain of the transistor 23. The conductive layer 405 has a function of the gate of the transistor 23. Note that semiconductor layers containing an oxide semiconductor can be used as the semiconductor layer 411, the semiconductor layer 412, and the semiconductor layer 413. Alternatively, semiconductor layers containing an amorphous, microcrystalline, polycrystalline, or single-crystal semiconductor of silicon, germanium, or the like can be used.

In FIG. 23A, the transistors 21 to 23 have a bottom-gate structure; however, they may independently have either a bottom-gate structure or a top-gate structure.

Here, the wiring IL can be provided in a position overlapping with another wiring or conductive layer. For example, in FIG. 23A, the wiring IL can be formed in a layer different from the wiring GL or the wiring SL so as to have a region overlapping with the wiring GL or the wiring SL. In this way, the wiring IL used for reading out data on current characteristics can be provided while suppressing an increase in the area of the pixel 20. Note that the wiring IL may be provided so as to have a region overlapping with any one or more of the conductive layers 401 to 406 or one or more of the semiconductor layers 411 to 413.

Although FIG. 23A illustrates the structure in which the wiring CL extends in the column direction, the wiring CL may be provided to extend in the row direction as shown in FIG. 20. A structural example of the pixel 20 in such a case is illustrated in FIG. 23B.

In FIG. 23B, the wiring CL extends in the row direction, in a manner similar to that of the wiring SL and the wiring GL. The wiring CL is provided in the same layer as the wiring SL and the wiring GL and between the wiring SL and the wiring GL. The conductive layer 403a is connected to a conductive layer 407, and the conductive layer 407 is connected to the wiring CL.

Although the structural example in which the wiring SL, the wiring CL, and the wiring GL are provided in the same layer is described here, the wiring CL may be provided in a layer different from the wiring SL and the wiring GL. In this case, the wiring CL can be provided in a position that includes a region overlapping with the wiring SL or the wiring GL. Furthermore, the wiring SL may be provided between the wiring CL and the wiring GL, or the wiring GL may be provided between the wiring CL and the wiring SL.

This embodiment is obtained by performing change, addition, modification, removal, application, superordinate conceptualization, or subordinate conceptualization on part or the whole of another embodiment. Thus, the structure and method described in this embodiment can be combined as appropriate with any of the structures and methods described in the other embodiments.

Embodiment 4

<Structure Example of Display Device>

Figure 24:
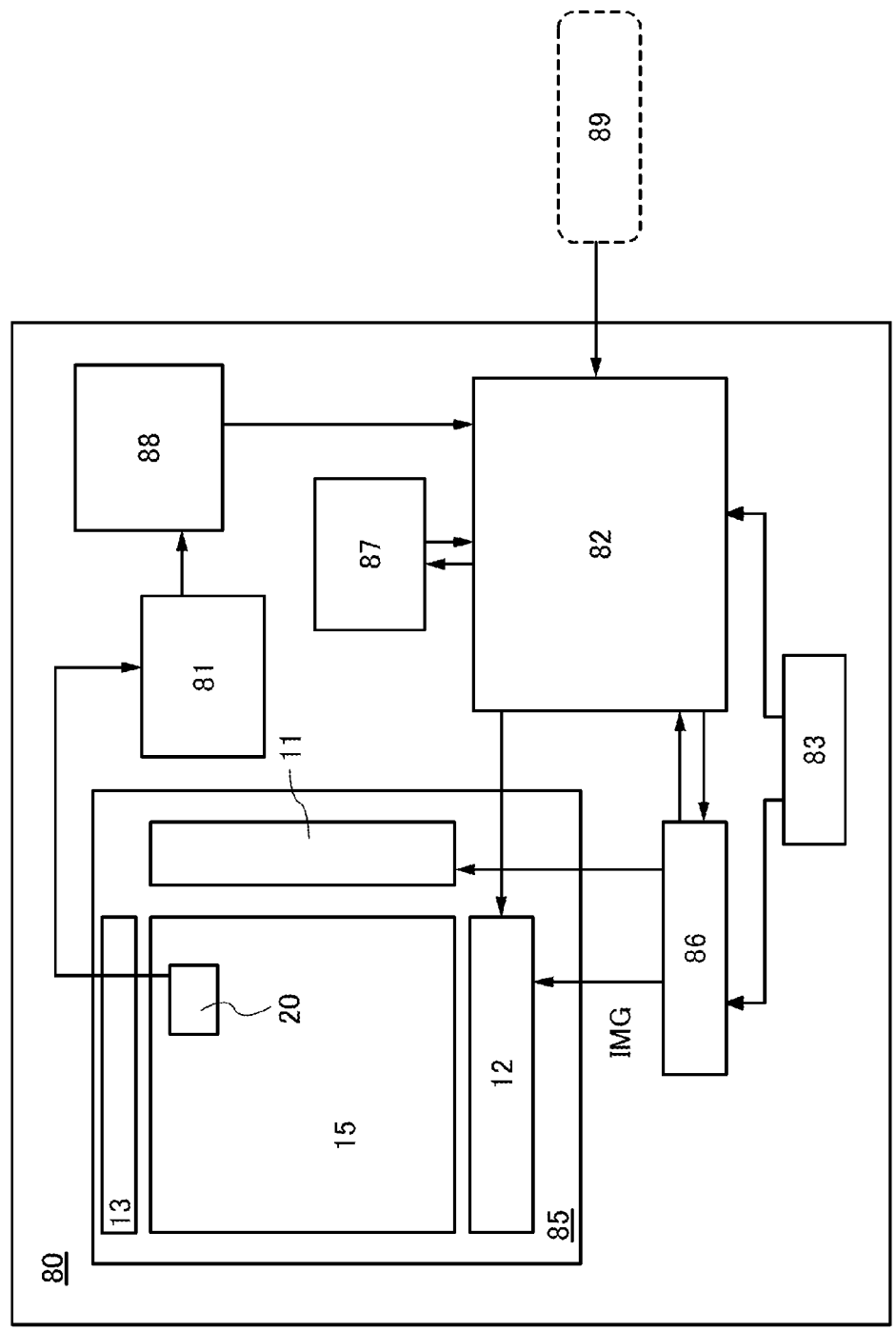
FIG. 24 is a block diagram for explaining one embodiment of the present invention.

An example of a structure of a display device is described. FIG. 24 shows a block diagram of a structure of a display device 80. Although the block diagram shows elements classified according to their functions in independent blocks, it may be practically difficult to separate the elements according to their functions and, in some cases, one element may be involved in a plurality of functions.

The display device 80 illustrated in FIG. 24 includes a panel 85 including the plurality of pixels 20 in the pixel portion 15, a controller 86, a CPU 83, an image processing circuit 82, an image memory 87, a memory 88, and a correction circuit 81. Furthermore, the panel 85 includes the driver circuit 11, the driver circuit 12, and the circuit portion 13. Note that description in the above embodiments can be referred to for the driver circuit 11, the driver circuit 12, the circuit portion 13, the pixel portion 15, and the pixel 20.

The CPU 83 is configured to decode an instruction input from the outside or an instruction stored in a memory provided in the CPU 83 and executing the instruction by controlling the overall operations of various circuits included in the display device 80.

By the method described in Embodiment 1, the correction circuit 81 generates data for correcting current characteristics on the basis of data on current characteristics of a driving transistor included in each of the display pixel. The memory 88 is configured to store data for correcting current characteristics.

The image memory 87 is configured to store image data 89 which is input to the display device 80. Note that although just one image memory 87 is provided in the display device 80 in FIG. 24, a plurality of image memories 87 may be provided in the display device 80. For example, in the case where the pixel portion 15 displays a full-color image with the use of three pieces of image data 89 corresponding to hues such as red, blue, and green, the image memory 87 corresponding to each of the pieces of image data 89 may be provided.

As the image memory 87, for example, a memory circuit such as a dynamic random access memory (DRAM) or a static random access memory (SRAM) can be used. Alternatively, as the image memories 87, video RAMs (VRAMs) may be used.

The image processing circuit 82 is configured to write and read the image data 89 to and from the image memory 87 in response to an instruction from the CPU 83 and to generate a video signal from the image data 89. In addition, the image processing circuit 82 is configured to read the data stored in the memory 88 in response to an instruction from the CPU 83 and to correct the video signal using the data.

The controller 86 is configured to process the video signal in accordance with the specification of the panel 85 and then to supply the processed video signal to the panel 85.

Note that the controller 86 is configured to supply various driving signals used for driving the driver circuit 12, the driver circuit 11, and the like to the panel 85. The driving signal includes a start pulse signal SSP and a clock signal SCK for controlling operation of the driver circuit 12, a latch signal LP, a start pulse GSP and a clock signal GCK for controlling operation of the driver circuit 11, and the like.

Note that the display device 80 may include an input device which is configured to give data or an instruction to the CPU 83 included in the display device 80. As the input device, a keyboard, a pointing device, a touch panel, a sensor, or the like can be used.

<Structure Example 1 of Transistor>

In FIGS. 25A and 25B and FIGS. 30A and 30B, transistors each having a top-gate structure are shown as examples of transistors included in a display device.

Figure 25A:
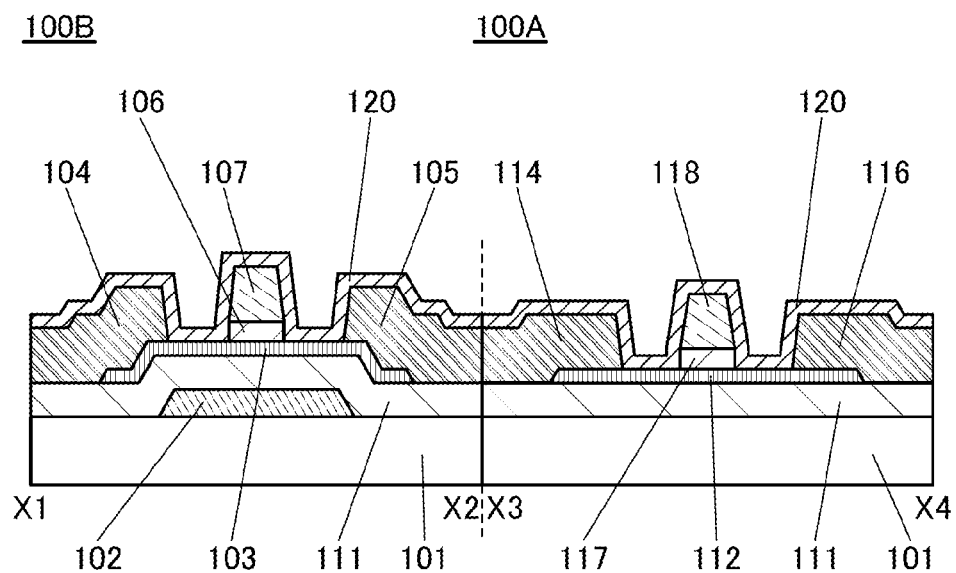
FIGS. 25A and 25B are cross-sectional views for explaining one embodiment of the present invention.
Figure 25B:
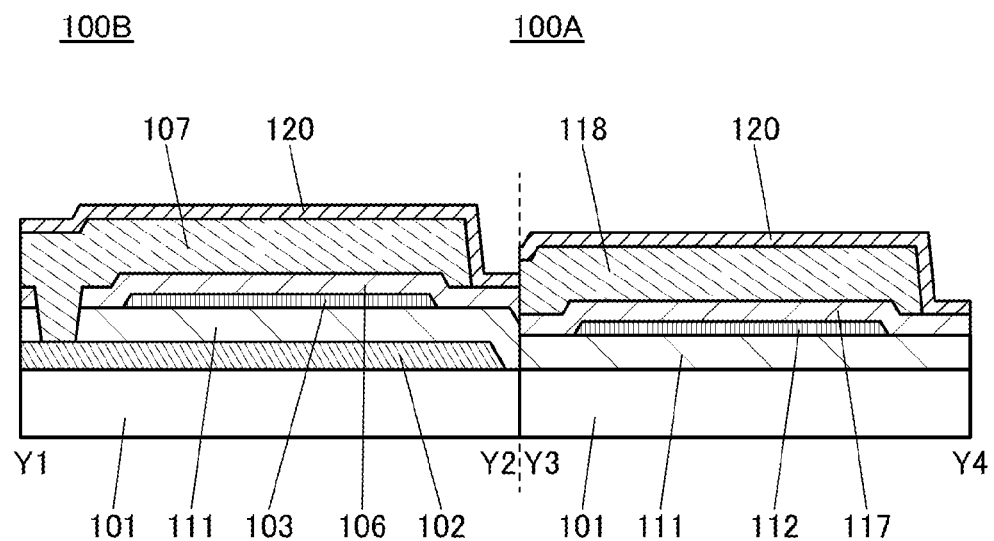
Figure 30A:
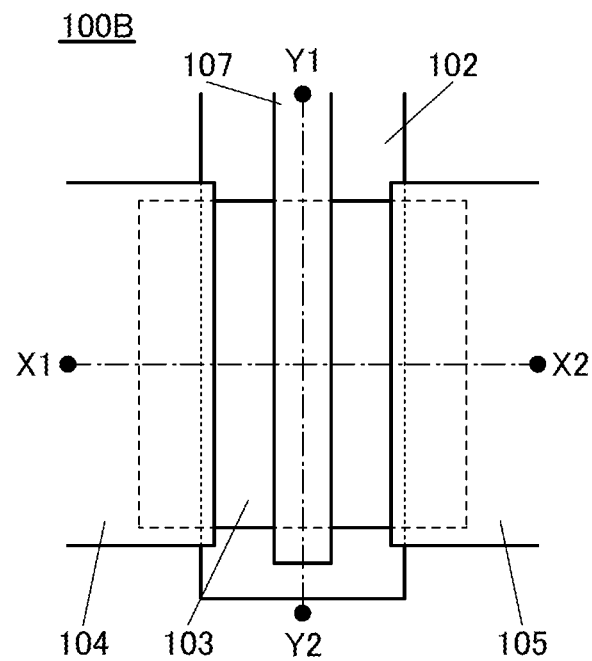
FIGS. 30A and 30B are top views for explaining one embodiment of the present invention.
Figure 30B:
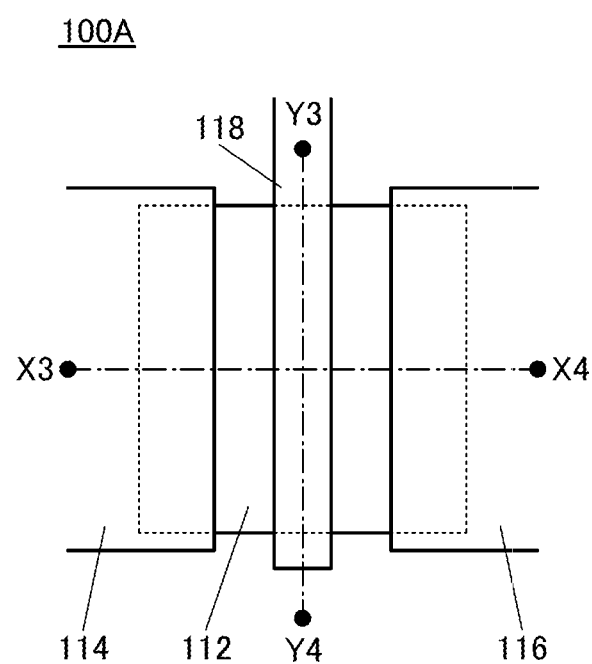

FIGS. 30A and 30B are top views of a transistor 100B provided in the driver circuit and a transistor 100A provided in the pixel portion 15, respectively. FIGS. 25A and 25B are cross sectional views of the transistor 100B and the transistor 100A. FIG. 30A is the top view of the transistor 100B and FIG. 30B is the top view of the transistor 100A. FIG. 25A shows a cross section along the dashed-dotted line X1-X2 in FIG. 30A and a cross section along the dashed-dotted line X3-X4 in FIG. 30B. FIG. 25B shows a cross section along the dashed-dotted line Y1-Y2 in FIG. 30A and a cross section along the dashed-dotted line Y3-Y4 in FIG. 30B. FIG. 25A shows a cross-sectional view of the transistors 100A and 100B in a channel length direction, and FIG. 25B shows a cross-sectional view of the transistors 100A and 100B in a channel width direction.

In a manner similar to that of the transistors 100A and 100B, some components are not illustrated in some cases in top views of transistors described below. Furthermore, the directions of the dashed-dotted line X1-X2 and the dashed-dotted line X3-X4 may be called a channel length direction, and the direction of the dashed-dotted line Y1-Y2 and the dashed-dotted line Y3-Y4 may be called a channel width direction.

The transistor 100A illustrated in FIGS. 25A and 25B includes an oxide semiconductor film 112 over an insulating film 111 over a substrate 101; a conductive film 114, a conductive film 116, and an insulating film 117 that are in contact with the oxide semiconductor film 112; and a conductive film 118 that overlaps with the oxide semiconductor film 112 with the insulating film 117 placed therebetween. Note that an insulating film 120 is provided over the transistor 100A.

The transistor 100B illustrated in FIGS. 25A and 25B includes an oxide semiconductor film 103 over the insulating film 111 over the substrate 101; a conductive film 104, a conductive film 105, and an insulating film 106 that are in contact with the oxide semiconductor film 103; and a conductive film 107 that overlaps with the oxide semiconductor film 103 with the insulating film 106 placed therebetween. The insulating film 120 is provided over the transistor 100B.

The transistor 100B includes a conductive film 102 that overlaps with the oxide semiconductor film 103 with the insulating film 111 placed therebetween. That is, the conductive film 102 serves as a gate electrode. Furthermore, the transistor 100B is a transistor having a dual-gate structure. The other components of the transistor 100B are the same as those of the transistor 100A and have similar functions as those in the transistor 100A.

When the conductive film 102 and the conductive film 107 are supplied with different potentials, the threshold voltage of the transistor 100B can be controlled. Alternatively, as illustrated in FIG. 25B, when the conductive film 102 and the conductive film 107 are supplied with the same potential, an increase in the on-state current, a reduction in variation in initial characteristics, a reduction in deterioration in a negative gate bias temperature (−GBT) stress test, and suppression in changes in the rising voltage of on-state current at different drain voltages are possible.

In the display device, the transistor in the driver circuit portion (e.g., the driver circuit 11, the driver circuit 12, or the like) and the transistor in the pixel portion 15 have different structures. The transistor included in the driver circuit portion has a dual-gate structure. That is, the transistor included in the driver circuit portion has a higher on-state current than that included in the pixel portion 15.

Furthermore, the transistor in the driver circuit portion and the transistor in the pixel portion 15 may have different channel lengths.

Typically, the channel length of the transistor 100B included in the driver circuit portion can be less than 2.5 µm, or greater than or equal to 1.45 µm and less than or equal to 2.2 µm. The channel length of the transistor 100A included in the pixel portion 15 can be greater than or equal to 2.5 µm, or greater than or equal to 2.5 µm and less than or equal to 20 µm.

When the channel length of the transistor 100B included in the driver circuit portion is less than 2.5 µm, preferably greater than or equal to 1.45 µm and less than or equal to 2.2 µm, the amount of on-state current can be increased as compared with the transistor 100A included in the pixel portion 15. As a result, a driver circuit portion that can operate at high speed can be formed.

In the oxide semiconductor film 112, an element that forms an oxygen vacancy is included in a region that does not overlap with the conductive film 114, the conductive film 116, and the conductive film 118. In the oxide semiconductor film 103, an element that forms an oxygen vacancy is included in a region that does not overlap with the conductive film 104, the conductive film 105, and the conductive film 107. Hereinafter, the elements which form oxygen vacancies are described as impurity elements. Typical examples of the impurity elements are hydrogen, rare gas elements, and the like. Typical examples of rare gas elements are helium, neon, argon, krypton, and xenon. Furthermore, boron, carbon, nitrogen, fluorine, aluminum, silicon, phosphorus, chlorine, or the like may be contained in the oxide semiconductor film 112 and the oxide semiconductor film 103 as an impurity element.

The insulating film 120 is a film containing hydrogen and is typically a nitride insulating film. The insulating film 120 is in contact with the oxide semiconductor film 112 and the oxide semiconductor film 103, whereby hydrogen contained in the insulating film 120 is diffused to the oxide semiconductor film 112 and the oxide semiconductor film 103. Consequently, much hydrogen is contained in the regions of the oxide semiconductor film 112 and the oxide semiconductor film 103 in contact with the insulating film 120.

When a rare gas element is added as an impurity element to the oxide semiconductor film, a bond between a metal element and oxygen in the oxide semiconductor film is cut, whereby an oxygen vacancy is formed. By interaction between hydrogen and the oxygen vacancy included in the oxide semiconductor film, the conductivity of the oxide semiconductor film is increased. Specifically, hydrogen enters the oxygen vacancies in the oxide semiconductor film, whereby an electron serving as a carrier is produced. As a result, the conductivity is increased.

Figure 26A:
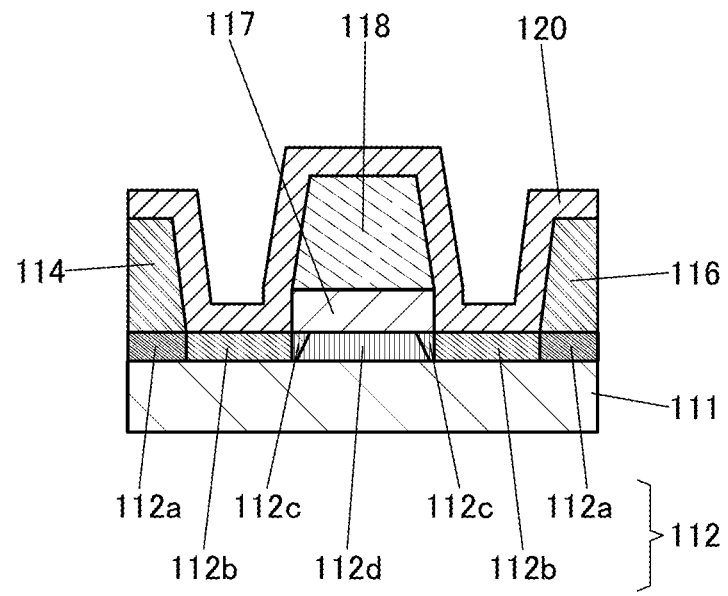
FIGS. 26A and 26B are cross-sectional views for explaining one embodiment of the present invention.
Figure 26B:
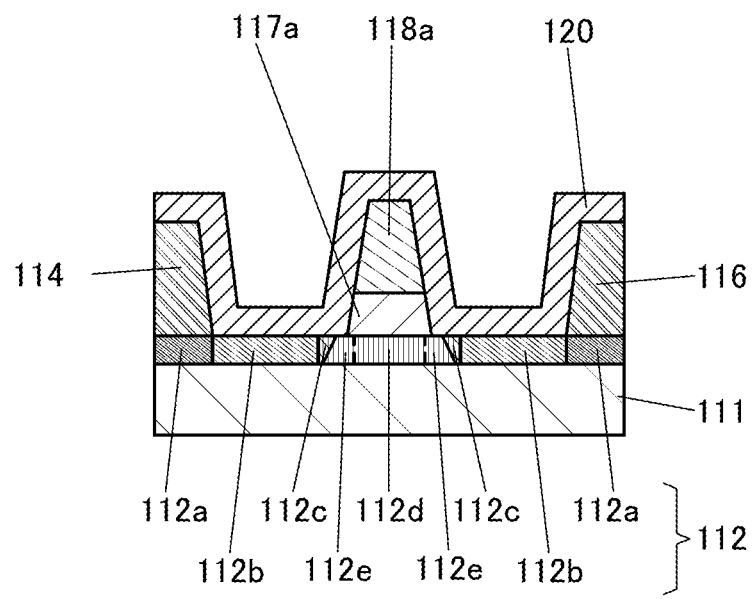

Here, FIGS. 26A and 26B are partial enlarged views of the oxide semiconductor film 112. Note that as typical examples, description is made with reference to the partial enlarged views of the oxide semiconductor film 112 included in the transistor 100A. As shown in FIG. 26A, the oxide semiconductor film 112 includes a region 112a in contact with the conductive film 114 or the conductive film 116, a region 112b in contact with the insulating film 120, and a region 112d in contact with the insulating film 117. Note that in the case where the conductive film 118 has a tapered side surface, the oxide semiconductor film 112 may include regions 112c overlapping with a tapered portion of the conductive film 118.

The regions 112a serve as a source region and a drain region. In the case where the conductive films 114 and 116 are formed using a conductive material which is easily bonded to oxygen, such as tungsten, titanium, aluminum, copper, molybdenum, chromium, tantalum, an alloy of any of these, or the like, oxygen contained in the oxide semiconductor films is bonded to the conductive material contained in the conductive films 114 and 116, and oxygen vacancies are formed in the oxide semiconductor film. Further, in some cases, part of constituent elements of the conductive material that forms the conductive films 114 and 116 is mixed into the oxide semiconductor film. As a result, the regions 112a in contact with the conductive film 114 and the conductive film 116 have higher conductivity and serve as a source region and a drain region.

The regions 112b function as low-resistance regions. The regions 112b contain at least a rare gas element and hydrogen as the impurity elements. Note that in the case where the side surface of the conductive film 118 has a tapered shape, the impurity element is added to the regions 112c through the tapered portion of the conductive film 118. Therefore, the regions 112c contain the impurity element although the concentration of the rare gas element, which is an example of the impurity element, of the regions 112c is lower than that in the regions 112b. With the regions 112c, source-drain breakdown voltage of the transistor can be increased.

In the case where the oxide semiconductor film 112 is formed by a sputtering method, the regions 112a to 112d each contain a rare gas element. In addition, the rare gas element concentration of each of the regions 112b and 112c is higher than that of each of the regions 112a and 112d. This is because a rare gas element is used as a sputtering gas to form the oxide semiconductor film 112 by sputtering and is therefore included in the oxide semiconductor film 112, and because a rare gas element is intentionally added to the regions 112b and 112c to form an oxygen vacancy. Note that a rare gas element different from that added to the regions 112a and 112d may be added to the regions 112b and 112c.

Since the region 112b is in contact with the insulating film 120, the hydrogen concentration of the region 112b is higher than those of the region 112a and the region 112d. In the case where hydrogen is diffused from the region 112b to the region 112c, the concentration of hydrogen in the region 112c is higher than the concentration of hydrogen in the region 112a and the concentration of hydrogen in the region 112d. Note that the hydrogen concentration of the region 112b is higher than that of the region 112c.

In the regions 112b and 112c, the concentrations of hydrogen measured by secondary ion mass spectrometry (SIMS) can be greater than or equal to $8\times10^{19}$ atoms/cm$^3$, greater than or equal to $1\times10^{20}$ atoms/cm$^3$, or greater than or equal to $5\times10^{20}$ atoms/cm$^3$. Note that in the regions 112a and 112d, the concentration of hydrogen which is measured by SIMS can be lower than or equal to $5\times10^{19}$ atoms/cm$^3$, lower than or equal to $1\times10^{19}$ atoms/cm$^3$, lower than or equal to $5\times10^{18}$ atoms/cm$^3$, lower than or equal to $1\times10^{18}$ atoms/cm$^3$, lower than or equal to $5\times10^{17}$ atoms/cm$^3$, or lower than or equal to $1\times10^{16}$ atoms/cm$^3$.

In the case where boron, carbon, nitrogen, fluorine, aluminum, silicon, phosphorus, or chlorine is added to the oxide semiconductor film 112 as an impurity element, only the regions 112b and 112c contain the impurity element. Therefore, the concentrations of the impurity element in the regions 112b and 112c are higher than those in the regions 112a and 112d. Note that, in the region 112b and the region 112c, the impurity element concentration which is measured by SIMS can be higher than or equal to $1\times10^{18}$ atoms/cm$^3$ and lower than or equal to $1\times10^{22}$ atoms/cm$^3$, higher than or equal to $1\times10^{19}$ atoms/cm$^3$ and lower than or equal to $1\times10^{21}$ atoms/cm$^3$, or higher than or equal to $5\times10^{19}$ atoms/cm$^3$ and lower than or equal to $5\times10^{20}$ atoms/cm$^3$.

The regions 112b and 112c have higher hydrogen concentrations than the region 112d and have more oxygen vacancies than the region 112d because of addition of impurity elements. Therefore, the regions 112b and 112c have higher conductivity and serve as low-resistance regions. The resistivity of the regions 112b and 112c can be typically greater than or equal to $1\times10^{-3}$ Ωcm and less than $1\times10^4$ Ωcm, or greater than or equal to $1\times10^{-3}$ Ωcm and less than $1\times10^{-1}$ Ωcm.

Note that in the region 112b and the region 112c, when the amount of hydrogen is smaller than or equal to the amount of oxygen vacancies, hydrogen is easily captured by the oxygen vacancies and is not easily diffused into the region 112d that serves as a channel. As a result, a normally-off transistor can be manufactured.

The region 112d serves as a channel.

In addition, after the impurity element is added to the oxide semiconductor film 112 using the conductive films 114, 116, and 118 as masks, the area of the conductive film 118 when seen from the above may be reduced. This can be performed in such a manner that a slimming process is performed on a mask over the conductive film 118 in a step of forming the conductive film 118 so as to obtain a mask with a minuter structure. Then, the conductive film 118 and the insulating film 117 are etched using the mask, so that a conductive film 118a and an insulating film 117a illustrated in FIG. 26B can be formed. As the slimming process, an ashing process using an oxygen radical or the like can be employed, for example.

As a result, an offset region 112e is formed between the region 112c and the region 112d serving as a channel in the oxide semiconductor film 112. Note that the length of the offset region 112e in the channel length direction is set to be less than 0.1 μm, whereby a decrease in the on-state current of the transistor can be suppressed.

The insulating film 117 and the insulating film 106 each function as a gate insulating film.

The conductive film 114 and the conductive film 116 serve as a source electrode and a drain electrode, and the conductive film 104 and the conductive film 105 serve as a source electrode and a drain electrode.

The conductive film 118 and the conductive film 107 each function as a gate electrode.

The transistor 100A and the transistor 100B described in this embodiment each include the region 112b and/or the region 112c functioning as a low-resistance region between the region 112d functioning as a channel and each of the regions 112a functioning as a source region and a drain region. Accordingly, resistance between the channel and each of the source region and the drain region can be reduced, and the transistor 100A and the transistor 100B each have a high on-state current and a high field-effect mobility.

In addition, in the transistor 100A and the transistor 100B, parasitic capacitance between the conductive film 118 and each of the conductive films 114 and 116 can be reduced by forming the conductive film 118 so as not overlap with the conductive films 114 and 116. Moreover, parasitic capacitance between the conductive film 107 and each of the conductive films 104 and 105 can be reduced by forming the conductive film 107 so as not to overlap with the conductive films 104 and 105. As a result, in the case where a large-sized substrate is used as the substrate 101, signal delays in the conductive films 114 and 116 and the conductive film 118, and signal delays in the conductive films 104 and 105 and the conductive film 107 can be reduced.

In the transistor 100A, a region including oxygen vacancies is formed by adding a rare gas element to the oxide semiconductor film 112 using the conductive films 114, 116, and 118 as masks. In the transistor 100B, the impurity element is added to the oxide semiconductor film 103 using the conductive films 104, 105, and 107 as masks, so that regions having oxygen vacancies are formed. Furthermore, because the region including oxygen vacancies is in contact with the insulating film 120 containing hydrogen, hydrogen contained in the insulating film 120 is diffused into the region including oxygen vacancies, so that a low-resistance region is formed. That is, the low-resistance regions can be formed in a self-aligned manner.

In the transistor 100A and the transistor 100B described in this embodiment, the rare gas element is added to the regions 112b to form oxygen vacancies, and furthermore, hydrogen is added thereto. Therefore, the conductivity of the region 112b can be increased and variation in conductivity of the region 112b in each transistor can be reduced. That is, by adding the rare gas element and hydrogen to the region 112b, the conductivity of the region 112b can be controlled.

The structures shown in FIGS. 25A and 25B will be described below in detail.

The type of the substrate 101 is not limited to a certain type, and any of a variety of substrates can be used as the substrate 101. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of a glass substrate include a barium borosilicate glass substrate, an aluminoborosilicate glass substrate, and a soda lime glass substrate. Examples of a flexible substrate, an attachment film, a base material film, or the like are as follows: plastic typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid; epoxy; an inorganic vapor deposition film; and paper. Specifically, when the transistors are formed using a semiconductor substrate, a single crystal substrate, an SOI substrate, or the like, it is possible to form a transistor with few variations in characteristics, size, shape, or the like, with high current supply capability, and with a small size. By forming a circuit with the use of such a transistor, power consumption of the circuit can be reduced or the circuit can be highly integrated.

Still alternatively, a flexible substrate may be used as the substrate 101, and the transistors may be directly provided on the flexible substrate. Alternatively, a separation layer may be provided between the substrate 101 and each of the transistors. The separation layer can be used when part or the whole of a semiconductor device formed over the separation layer is completed and separated from the substrate 101 and transferred to another substrate. In such a case, the transistors can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

Examples of a substrate to which the transistors are transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. When such a substrate is used, a transistor with excellent properties or a transistor with low power consumption can be formed, a device with high durability can be formed, high heat resistance can be provided, or reduction in weight or thickness can be achieved.

The insulating film 111 can be formed with a single layer or a stack using one or more oxide insulating films and/or one or more nitride insulating films. Note that an oxide insulating film is preferably used as at least a region of the insulating film 111 that is in contact with the oxide semiconductor films 103 and 112, in order to improve characteristics of the interface with the oxide semiconductor films 103 and 112. An oxide insulating film that releases oxygen by being heated is preferably used as the insulating film 111, in which case oxygen contained in the insulating film 111 can be moved to the oxide semiconductor films 103 and 112 by heat treatment.

The thickness of the insulating film 111 can be greater than or equal to 50 nm, greater than or equal to 100 nm and less than or equal to 3000 nm, or greater than or equal to 200 nm and less than or equal to 1000 nm. With the use of the thick insulating film 111, the amount of oxygen released from the insulating film 111 can be increased, and the interface states between the insulating film 111 and each of the oxide semiconductor films 103 and 112 and oxygen vacancies included in the oxide semiconductor film 103 and the region 112d of the oxide semiconductor film 112 can be reduced.

The insulating film 111 can be formed with a single layer or a stack using, for example, one or more of silicon oxide, silicon oxynitride, silicon nitride oxide, silicon nitride, aluminum oxide, hafnium oxide, gallium oxide, a Ga—Zn oxide, and the like.

The oxide semiconductor films 112 and 103 are typically formed using a metal oxide such as an In—Ga oxide, an In—Zn oxide, or an In-M-Zn oxide (M is Mg, Al, Ti, Ga, Y, Zr, La, Ce, Nd, or Hf). Note that the oxide semiconductor films 112 and 103 have light-transmitting properties.

Note that in the case of using an In-M-Zn oxide as the oxide semiconductor films 112 and 103, when the summation of In and M exclusive of Zn and O is assumed to be 100 atomic %, the proportions of In and M are preferably set to be greater than or equal to 25 atomic % and less than 75 atomic %, respectively, or greater than or equal to 34 atomic % and less than 66 atomic %, respectively.

The energy gaps of the oxide semiconductor films 112 and 103 are each 2 eV or more, 2.5 eV or more, or 3 eV or more.

The thickness of each of the oxide semiconductor films 112 and 103 can be greater than or equal to 3 nm and less than or equal to 200 nm, greater than or equal to 3 nm and less than or equal to 100 nm, or greater than or equal to 3 nm and less than or equal to 50 nm.

In the case where the oxide semiconductor films 112 and 103 contain an In-M-Zn oxide (M is Mg, Al, Ti, Ga, Y, Zr, La, Ce, Nd, or Hf), it is preferable that the atomic ratio of metal elements of a sputtering target used for forming a film of the In-M-Zn oxide satisfy In≥M and Zn≥M. As the atomic ratio of metal elements of such a sputtering target, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, or the like is preferable. Note that the atomic ratios of metal elements in the formed oxide semiconductor films 112 and 103 vary from the above atomic ratio of metal elements of the sputtering target within a range of ±40% as an error.

When silicon or carbon that is one of elements belonging to Group 14 is contained in the oxide semiconductor film 112 and the oxide semiconductor film 103, oxygen vacancies are increased in the oxide semiconductor film 112 and the oxide semiconductor film 103, and the oxide semiconductor film 112 and the oxide semiconductor film 103 become n-type films. Thus, the concentration of silicon or carbon (the concentration measured by SIMS) in the oxide semiconductor film 112 and the oxide semiconductor film 103, in particular, the region 112d, can be lower than or equal to $2\times10^{18}$ atoms/cm$^3$, or lower than or equal to $2\times10^{17}$ atoms/cm$^3$. As a result, the transistor has positive threshold voltage (normally-off characteristics).

Furthermore, the concentration of alkali metal or alkaline earth metal which is measured by SIMS in the oxide semiconductor film 112 and the oxide semiconductor film 103, in particular, the region 112d, can be lower than or equal to $1\times10^{18}$ atoms/cm$^3$, or lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of an alkali metal or an alkaline earth metal in the region 112d. As a result, the transistor has positive threshold voltage (normally-off characteristics).

Furthermore, when nitrogen is contained in the oxide semiconductor film 112 and the oxide semiconductor film 103, in particular, the region 112d, electrons serving as carriers are generated, carrier density is increased, and the oxide semiconductor films 112 and 103 become n-type films in some cases. Thus, a transistor including an oxide semiconductor film which contains nitrogen is likely to have normally-on characteristics. Therefore, nitrogen is preferably reduced as much as possible in the oxide semiconductor film, particularly the region 112d. The nitrogen concentration, which is measured by SIMS, can be set to, for example, lower than or equal to $5\times10^{18}$ atoms/cm$^3$.

By reducing the impurity elements in the oxide semiconductor film 112 and the oxide semiconductor film 103, in particular, the region 112d, the carrier density of the oxide semiconductor films can be lowered. In the oxide semiconductor film 112 and the oxide semiconductor film 103, in particular, the region 112d, the carrier density can be less than $8\times10^{11}$/cm$^3$, preferably less than $1\times10^{11}$/cm$^3$, further preferably less than $1\times10^{10}$/cm$^3$, and more than or equal to $1\times10^{-9}$/cm$^3$.

An oxide semiconductor film with a low impurity concentration and a low density of defect states can be used for the oxide semiconductor films 112 and 103, in which case the transistors can have more excellent electrical characteristics. Here, the state in which impurity concentration is low and density of defect states is low (the amount of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor including the oxide semiconductor film in which a channel region is formed is likely to have positive threshold voltage (normally-off characteristics). A highly purified intrinsic or substantially highly purified intrinsic oxide semiconductor film has a low density of defect states and accordingly has low density of trap states in some cases. Furthermore, a transistor including a highly purified intrinsic or substantially highly purified intrinsic oxide semiconductor film has an extremely small off-state current; the off-state current can be smaller than or equal to the measurement limit of a semiconductor parameter analyzer, i.e., smaller than or equal to $1\times10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases.

In addition, each of the oxide semiconductor films 112 and 103 may have a non-single-crystal structure, for example. The non-single crystal structure includes a c-axis aligned crystalline oxide semiconductor (CAAC-OS), a polycrystalline structure, a microcrystalline structure, or an amorphous structure, for example. Among the non-single crystal structure, the amorphous structure has the highest density of defect states, whereas CAAC-OS has the lowest density of defect states.

Note that each of the oxide semiconductor films 112 and 103 may be a mixed film including two or more of the following: a region having an amorphous structure, a region having a microcrystalline structure, a region having a polycrystalline structure, a region of CAAC-OS and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, the mixed film has a stacked-layer structure including, for example, two or more of a region having an amorphous structure, a region having a microcrystalline structure, a region having a polycrystalline structure, a CAAC-OS region, and a region having a single-crystal structure in some cases.

Note that in some cases, the regions 112b and 112d are different in crystallinity in each of the oxide semiconductor films 112 and 103. In addition, in some cases, the regions 112c and 112d are different in crystallinity in each of the oxide semiconductor films 112 and 103. This is because when an impurity element is added to the region 112b or 112c, the region 112b or 112c is damaged and thus has lower crystallinity.

The insulating films 106 and 117 can be formed with a single layer or a stack using one or more of an oxide insulating film and a nitride insulating film. Note that an oxide insulating film is preferably used as at least regions of the insulating films 106 and 117 that are in contact with the oxide semiconductor films 103 and 112, respectively, in order to improve characteristics of the interface with the oxide semiconductor films 103 and 112. The insulating films 106 and 117 can be formed with a single layer or a stack using, for example, one or more of silicon oxide, silicon oxynitride, silicon nitride oxide, silicon nitride, aluminum oxide, hafnium oxide, gallium oxide, a Ga—Zn oxide, and the like.

Furthermore, it is possible to prevent outward diffusion of oxygen from the oxide semiconductor films 112 and 103 and entry of hydrogen, water, or the like into the oxide semiconductor films 112 and 103 from the outside by providing an insulating film having a blocking effect against oxygen, hydrogen, water, and the like as the insulating films 106 and 117. As the insulating film which has an effect of blocking oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, or the like can be used.

The insulating films 106 and 117 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistors can be reduced.

When the insulating films 106 and 117 are formed using an oxide insulating film from which oxygen is released by heating, oxygen contained in the insulating films 106 and 117 can be moved to the oxide semiconductor films 103 and 112 by heat treatment.

In addition, a silicon oxynitride film with few defects can be used as the insulating films 106 and 117. In an ESR spectrum at 100 K or lower of the silicon oxynitride film with few defects, after heat treatment, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1\times10^{18}$ spins/cm$^3$, typically higher than or equal to $1\times10^{17}$ spins/cm$^3$ and lower than $1\times10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide ($NO_x$; x is greater than or equal to 0 and less than or equal to 2, or greater than or equal to 1 and smaller than or equal to 2). Accordingly, the lower the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the smaller the amount of nitrogen oxide contained in the silicon oxynitride film is.

In the silicon oxynitride film with few defects, the concentration of nitrogen which is measured by SIMS is lower than or equal to $6 \times 10^{20}$ atoms/cm$^3$. When the insulating film 117 is formed using the silicon oxynitride film with few defects, nitrogen oxide is unlikely to be generated, so that the carrier traps at the interface between the oxide semiconductor films 112 and 103 and the insulating films can be reduced. Furthermore, a shift of the threshold voltage of the transistor included in the display device can be reduced, which leads to a smaller change in the electrical characteristics of the transistor.

The thickness of the insulating films 106 and 117 can be greater than or equal to 5 nm and less than or equal to 400 nm, greater than or equal to 5 nm and less than or equal to 300 nm, or greater than or equal to 10 nm and less than or equal to 250 nm.

Each of the conductive film 114, the conductive film 116, the conductive film 118, the conductive film 104, the conductive film 105, the conductive film 102, and the conductive film 107 can be formed using, for example, a metal element selected from aluminum, chromium, copper, tantalum, titanium, molybdenum, nickel, iron, cobalt, and tungsten; an alloy containing any of these metal elements as a component; an alloy containing these metal elements in combination; or the like. Further, one or more metal elements selected from manganese and zirconium may be used. Furthermore, the conductive film 114, the conductive film 116, the conductive film 118, the conductive film 104, the conductive film 105, the conductive film 102, and the conductive film 107 may have a single-layer structure or a stacked-layer structure including two or more layers. For example, any of the following can be used: a single-layer structure of an aluminum film containing silicon; a single-layer structure of a copper film containing manganese; two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; a three-layer structure in which a copper film containing manganese, a copper film, and a copper film containing manganese are stacked in this order; and the like. Alternatively, an alloy film or a nitride film which contains aluminum and one or more elements selected from titanium, tantalum, tungsten, molybdenum, chromium, neodymium, and scandium may be used.

Alternatively, the conductive film 114, the conductive film 116, the conductive film 118, the conductive film 104, the conductive film 105, the conductive film 102, and the conductive film 107 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide including silicon oxide. Alternatively, a stacked-layer structure of the above light-transmitting conductive material and a conductive material containing the above metal element may be employed.

The thicknesses of the conductive films 114 and 116, the conductive film 118, the conductive films 104 and 105, the conductive film 102, and the conductive film 107 each can be greater than or equal to 30 nm and less than or equal to 500 nm, or greater than or equal to 100 nm and less than or equal to 400 nm.

The insulating film 120 is a film containing hydrogen and is typically a nitride insulating film. The nitride insulating film can be formed using silicon nitride, aluminum nitride, or the like.

<Structure Example 2 of Transistor>

Next, another structure of the transistor included in the display device is described with reference to FIGS. 27A to 27C. Description is made here using a transistor 100C as a modified example of the transistor 100A provided in the pixel portion 15; however, the structure of the insulating film 111 or the structure of the conductive film 114, 116, or 118 of the transistor 100C can be applied as appropriate to the transistor 100B in the driver circuit portion.

Figure 27A:
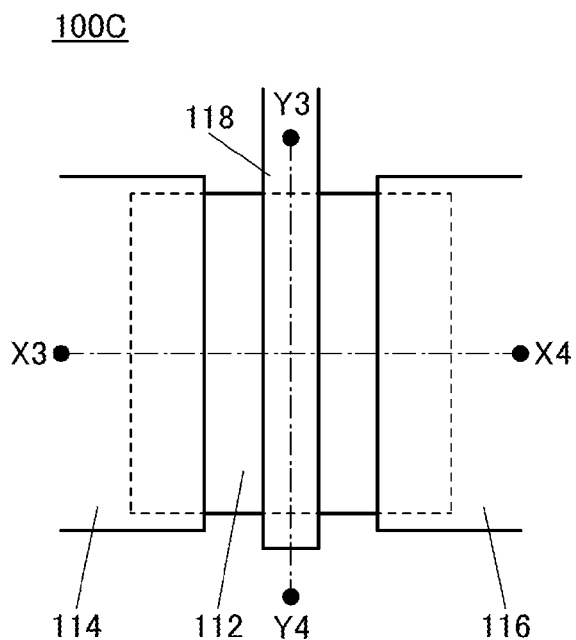
FIGS. 27A to 27C are a top view and cross-sectional views for explaining one embodiment of the present invention.
Figure 27B:
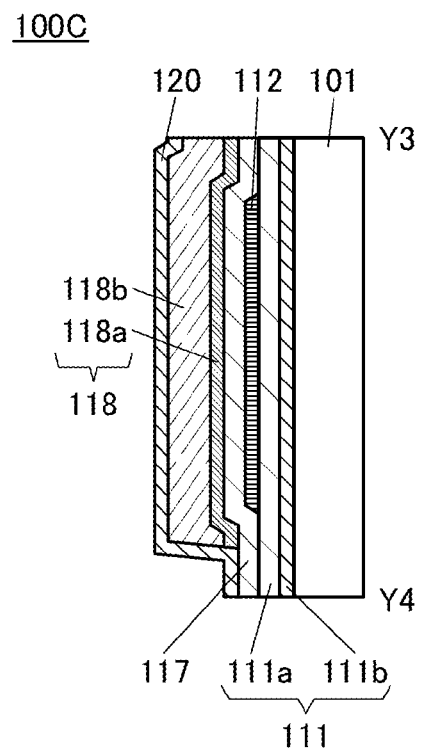
Figure 27C:
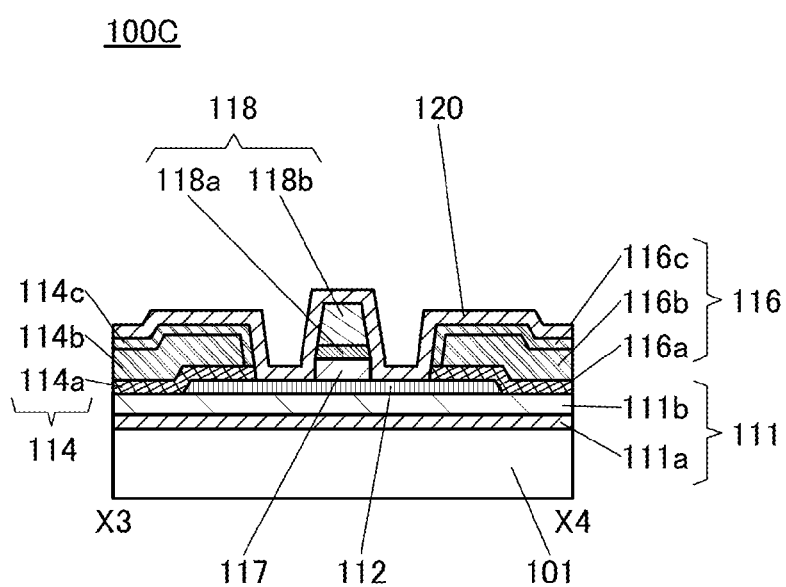

FIGS. 27A to 27C are a top view and cross-sectional views of the transistor 100C included in the display device. FIG. 27A is a top view of the transistor 100C, FIG. 27B is a cross-sectional view taken along dashed-dotted line Y3-Y4 in FIG. 27A, and FIG. 27C is a cross-sectional view taken along dashed-dotted line X3-X4 in FIG. 27A.

The transistor 100C illustrated in FIGS. 27A to 27C has a two- or three-layer structure of the conductive films 114 and 116 and the conductive film 118. In addition, the insulating film 111 has a stacked-layer structure of a nitride insulating film 111a and an oxide insulating film 111b. The other structures are the same as those of the transistor 100A and the effect similar to that in the case of the transistor 100A can be obtained.

First, the conductive films 114 and 116 and the conductive film 118 are described.

In the conductive film 114, conductive films 114a, 114b, and 114c are stacked in this order and the conductive films 114a and 114c cover the surfaces of the conductive film 114b. That is, the conductive films 114a and 114c function as protective films of the conductive film 114b.

In a manner similar to that of the conductive film 114, in the conductive film 116, conductive films 116a, 116b, and 116c are stacked in this order and the conductive films 116a and 116c cover the surfaces of the conductive film 116b. That is, the conductive films 116a and 116c function as protective films of the conductive film 116b.

In the conductive film 118, conductive films 118a and 118b are stacked in this order.

The conductive films 114a and 116a and the conductive film 118a are formed using materials that prevent metal elements contained in the conductive films 114b and 116b and the conductive film 118b, respectively, from diffusing to the oxide semiconductor film 112. The conductive films 114a and 116a and the conductive film 118a can be formed using titanium, tantalum, molybdenum, tungsten, an alloy of any of these materials, titanium nitride, tantalum nitride, molybdenum nitride, or the like. Alternatively, the conductive films 114a and 116a and the conductive film 118a can be formed using Cu—X alloy (X is Mn, Ni, Cr, Fe, Co, Mo, Ta, or Ti) or the like.

The conductive films 114b and 116b and the conductive film 118b are each formed using a low-resistance material. The conductive films 114b and 116b and the conductive film 118b can be formed using copper, aluminum, gold, silver, an alloy of any of these materials, a compound containing any of these materials as a main component, or the like.

When the conductive films 114c and 116c are formed using films in which the metal elements contained in the conductive films 114b and 116b, respectively, are passivated, the metal elements contained in the conductive films 114b and 116b can be prevented from moving to the oxide semiconductor film 112 in a step of forming the insulating film 128. The conductive films 114c and 116c can be formed using a metal silicide or a metal silicide nitride, typically, $CuSi_x$ (x>0), $CuSi_xN_y$ (x>0, y>0), or the like.

Here, a method for forming the conductive films 114c and 116c is described. Note that the conductive films 114b and 116b are formed using copper. In addition, the conductive films 114c and 116c are formed using $CuSi_xN_y$ (x>0, y>0).

The conductive films 114b and 116b are exposed to plasma generated in a reducing atmosphere such as a hydrogen atmosphere, an ammonia atmosphere, or a carbon monoxide atmosphere and the oxide formed on the surfaces of the conductive films 114b and 116b are reduced.

Next, the conductive films 114b and 116b are exposed to silane while being heated at a temperature higher than or equal to 200° C. and lower than or equal to 400° C. As a result, copper contained in the conductive films 114b and 116b acts as a catalyst, and silane is decomposed into Si and $H_2$, and $CuSi_x$ (x>0) is formed on the surfaces of the conductive films 114b and 116b.

Next, the conductive films 114b and 116b are exposed to plasma generated in an atmosphere containing nitrogen, such as an ammonia atmosphere or a nitrogen atmosphere, whereby $CuSi_x$ (x>0) formed on the surfaces of the conductive films 114b and 116b reacts with nitrogen contained in the plasma and accordingly $CuSi_xN_y$ (x>0, y>0) is formed as the conductive films 114c and 116c.

Note that in the above step, $CuSi_xN_y$ (x>0, y>0) may be formed as the conductive films 114c and 116c in such a manner that the conductive films 114b and 116b are exposed to plasma generated in an atmosphere containing nitrogen, such as an ammonia atmosphere or a nitrogen atmosphere, and then exposed to silane while being heated at a temperature higher than or equal to 200° C. and lower than or equal to 400° C.

Next, the insulating film 111 in which the nitride insulating film 111a and the oxide insulating film 111b are stacked is described.

The nitride insulating film 111a can be formed using silicon nitride, silicon nitride oxide, aluminum nitride, or aluminum nitride oxide, for example. The oxide insulating film 111b can be formed using silicon oxide, silicon oxynitride, aluminum oxide, or the like, for example. The structure in which the nitride insulating film 111a is provided on the substrate 101 side can prevent hydrogen, water, or the like from diffusing to the oxide semiconductor film 112 from the outside.

<Structure Example 3 of Transistor>

Next, another structure of the transistor included in the display device is described with reference to FIGS. 28A to 28C and FIGS. 29A to 29C. Description is made here using a transistor 100D and a transistor 100E as modified examples of the transistor 100A provided in the pixel portion 15; however, the structure of an oxide semiconductor film 112 included in the transistor 100D or the structure of an oxide semiconductor film 112 included in the transistor 100E can be applied as appropriate to the transistor 100B in the driver circuit portion.

Figure 28A:
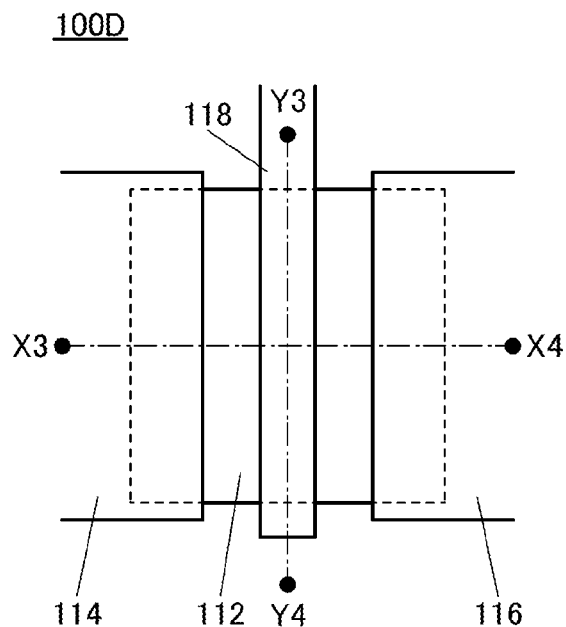
FIGS. 28A to 28C are a top view and cross-sectional views for explaining one embodiment of the present invention.
Figure 28B:
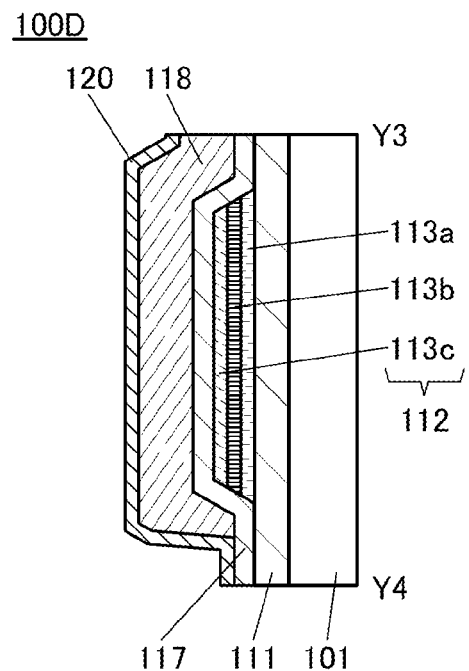
Figure 28C:
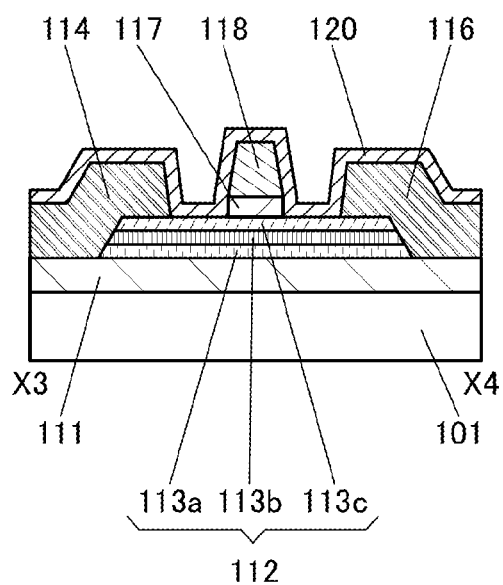

FIGS. 28A to 28C are a top view and cross-sectional views of the transistor 100D included in the display device. FIG. 28A is a top view of the transistor 100D, FIG. 28B is a cross-sectional view taken along dashed-dotted line Y3-Y4 in FIG. 28A, and FIG. 28C is a cross-sectional view taken along dashed-dotted line X3-X4 in FIG. 28A.

The oxide semiconductor film 112 of the transistor 100D illustrated in FIGS. 28A to 28C has a multilayer structure. Specifically, the oxide semiconductor film 112 includes an oxide semiconductor film 113a in contact with the insulating film 111, an oxide semiconductor film 113b in contact with the oxide semiconductor film 113a, and an oxide semiconductor film 113c in contact with the oxide semiconductor film 113b, the conductive films 114 and 116, and the insulating films 117 and 120. The other structures are the same as those of the transistor 100A and the effect similar to that in the case of the transistor 100A can be obtained.

The oxide semiconductor films 113a, 113b, and 113c are typically formed using a metal oxide such as an In—Ga oxide, an In—Zn oxide, or an In-M-Zn oxide (M is Mg, Al, Ti, Ga, Y, Zr, La, Ce, Nd, or Hf).

The oxide semiconductor films 113a and 113c are typically each an In—Ga oxide, an In—Zn oxide, an In—Mg oxide, a Zn—Mg oxide, or an In-M-Zn oxide (M is Mg, Al, Ti, Ga, Y, Zr, La, Ce, Nd, or Hf), and has the energy at the bottom of the conduction band closer to a vacuum level than that of the oxide semiconductor film 113b. Typically, a difference between the energy at the bottom of the conduction band of the oxide semiconductor film 113b and the energy at the bottom of the conduction band of each of the oxide semiconductor films 113a and 113c is greater than or equal to 0.05 eV, greater than or equal to 0.07 eV, greater than or equal to 0.1 eV, or greater than or equal to 0.2 eV and also less than or equal to 2 eV, less than or equal to 1 eV, less than or equal to 0.5 eV, or less than or equal to 0.4 eV. Note that the difference between the vacuum level and the energy at the bottom of the conduction band is referred to as electron affinity.

In the case where the oxide semiconductor film 113b is an In-M-Zn oxide (M is Mg, Al, Ti, Ga, Y, Zr, La, Ce, Nd, or Hf) and a target having the atomic ratio of metal elements of $In:M:Zn=x_1:y_1:z_1$ is used for depositing the oxide semiconductor film 113b, $x_1/y_1$ is preferably greater than or equal to ⅓ and less than or equal to 6, or further preferably greater than or equal to 1 and less than or equal to 6, and $z_1/y_1$ is preferably greater than or equal to ⅓ and less than or equal to 6, or further preferably greater than or equal to 1 and less than or equal to 6. Note that when $z_1/y_1$ is greater than or equal to 1 and less than or equal to 6, a CAAC-OS film as the oxide semiconductor film 113b is easily formed. As typical examples of the atomic ratio of metal elements of the target, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, and the like can be given.

In the case where the oxide semiconductor films 113a and 113c are each an In-M-Zn oxide (M is Mg, Al, Ti, Ga, Y, Zr, La, Ce, Nd, or Hf) and a target having the atomic ratio of metal elements of $In:M:Zn=x_2:y_2:z_2$ is used for forming the oxide semiconductor films 113a and 113c, $x_2/y_2$ is preferably less than $x_1/y_1$, and $z_2/y_2$ is preferably greater than or equal to ⅓ and less than or equal to 6, or further preferably greater than or equal to 1 and less than or equal to 6. Note that when $z_2/y_2$ is greater than or equal to 1 and less than or equal to 6, a CAAC-OS film to be described later as the oxide semiconductor films 113a and 113c is easily formed. As typical examples of the atomic ratio of metal elements of the target, In:M:Zn=1:3:2, In:M:Zn=1:3:4, In:M:Zn=1:3:6, In:M:Zn=1:3:8, In:M:Zn=1:4:3, In:M:Zn=1:4:4, In:M:Zn=1:4:5, In:M:Zn=1:4:6, In:M:Zn=1:6:3, In:M:Zn=1:6:4, In:M:Zn=1:6:5, In:M:Zn=1:6:6, In:M:Zn=1:6:7, In:M:Zn=1:6:8, In:M:Zn=1:6:9, and the like can be given.

Note that a proportion of each atom in the atomic ratio of the oxide semiconductor films 113a, 113b, and 113c varies within a range of ±40% as an error.

The atomic ratio is not limited to the above, and the atomic ratio may be appropriately set in accordance with needed semiconductor characteristics.

The oxide semiconductor film 113a and the oxide semiconductor film 113c may have the same composition. For example, as the oxide semiconductor film 113a and the oxide semiconductor film 113c, an In—Ga—Zn oxide in which the atomic ratio of In to Ga and Zn is 1:3:2, 1:3:4, 1:4:5, 1:4:6, 1:4:7, or 1:4:8 may be used.

Alternatively, the oxide semiconductor films 113a and 113c may have different compositions. For example, an In—Ga—Zn oxide film in which the atomic ratio of In to Ga and Zn is 1:3:2 may be used as the oxide semiconductor film 113a, whereas an In—Ga—Zn oxide film in which the atomic ratio of In to Ga and Zn is 1:3:4 or 1:4:5 may be used as the oxide semiconductor film 113c.

The thickness of each of the oxide semiconductor films 113a and 113c is greater than or equal to 3 nm and less than or equal to 100 nm, or preferably greater than or equal to 3 nm and less than or equal to 50 nm. The thickness of the oxide semiconductor film 113b is greater than or equal to 3 nm and less than or equal to 200 nm, greater than or equal to 3 nm and less than or equal to 100 nm, or greater than or equal to 3 nm and less than or equal to 50 nm. When the thicknesses of the oxide semiconductor films 113a and 113c are made smaller than that of the oxide semiconductor film 113b, the amount of change in the threshold voltage of the transistor can be reduced.

The interface between the oxide semiconductor film 113b and each of the oxide semiconductor films 113a and 113c can be observed by scanning transmission electron microscopy (STEM) in some cases.

Oxygen vacancies in the oxide semiconductor film 113b can be reduced by providing the oxide semiconductor films 113a and 113c in which oxygen vacancies are less likely to be generated than the oxide semiconductor film 113b in contact with the upper surface and the lower surface of the oxide semiconductor film 113b. Furthermore, since the oxide semiconductor film 113b is in contact with the oxide semiconductor films 113a and 113c containing one or more metal elements forming the oxide semiconductor film 113b, the interface state densities between the oxide semiconductor film 113a and the oxide semiconductor film 113b and between the oxide semiconductor film 113b and the oxide semiconductor film 113c are extremely low. Accordingly, oxygen vacancies contained in the oxide semiconductor film 113b can be reduced.

In addition, with the oxide semiconductor film 113a, variation in the electrical characteristics of the transistor, such as a threshold voltage, can be reduced.

Since the oxide semiconductor film 113c containing one or more metal elements forming the oxide semiconductor film 113b is provided in contact with the oxide semiconductor film 113b, scattering of carriers does not easily occur at an interface between the oxide semiconductor film 113b and the oxide semiconductor film 113c, and thus the field-effect mobility of the transistor can be increased.

Furthermore, the oxide semiconductor films 113a and 113c each also serve as a barrier film which suppresses formation of an impurity state due to the entry of the constituent elements of the insulating films 111 and 117 into the oxide semiconductor film 113b.

As described above, in the transistors described in this embodiment, variation in the electrical characteristics, such as a threshold voltage, is reduced. The display device described in the any of the above embodiments is formed using transistors in which variation in the threshold voltage is reduced; thus, variation in the threshold voltage can be corrected easily and effectively.

Figure 29A:
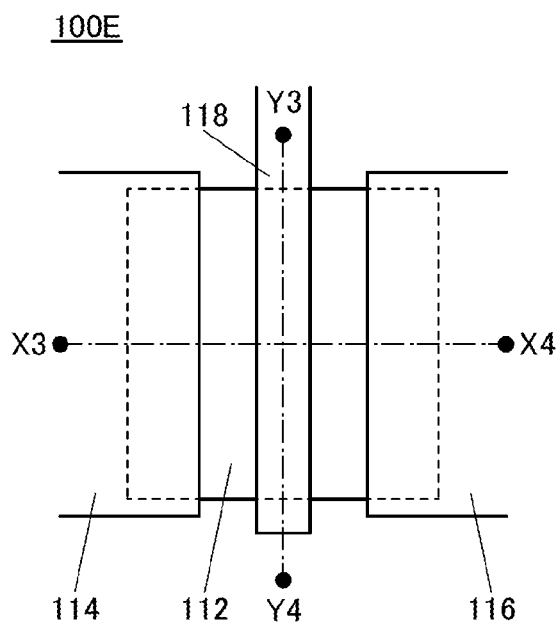
FIGS. 29A to 29C are a top view and cross-sectional views for explaining one embodiment of the present invention.
Figure 29B:
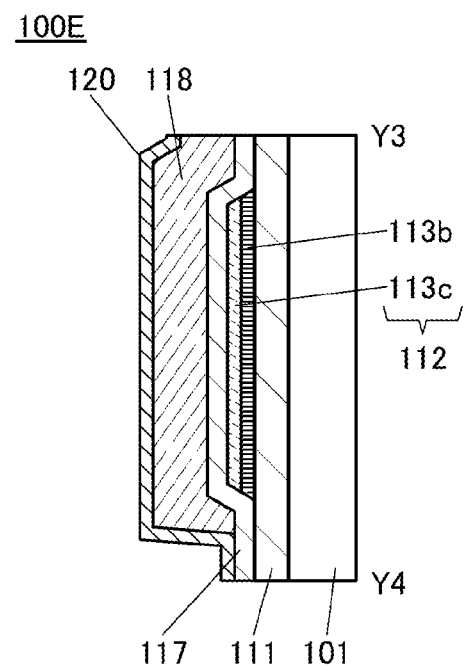
Figure 29C:
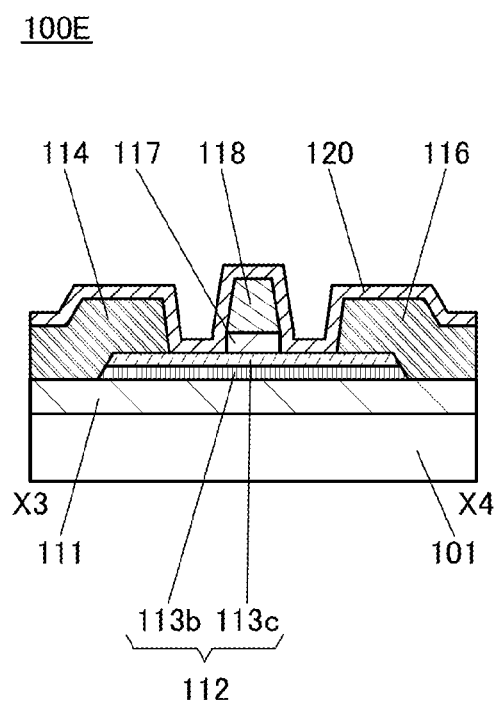

A transistor having a structure different from that in FIGS. 28A to 28C is illustrated in FIGS. 29A to 29C.

FIGS. 29A to 29C are a top view and cross-sectional views of the transistor 100E included in the display device. FIG. 29A is a top view of the transistor 100E, FIG. 29B is a cross-sectional view taken along dashed-dotted line Y3-Y4 in FIG. 29A, and FIG. 29C is a cross-sectional view taken along dashed-dotted line X3-X4 in FIG. 29A. Note that in FIG. 29A, the substrate 101, the insulating films 111, 117, and 120, and the like are omitted for simplicity. FIG. 29B is the cross-sectional view of the transistor 100E in the channel width direction. Moreover, FIG. 29C is the cross-sectional view of the transistor 100E in the channel length direction.

Like the oxide semiconductor film 112 of the transistor 100E illustrated in FIGS. 29A to 29C, the oxide semiconductor film 112 may have a stacked-layer structure of the oxide semiconductor film 113b in contact with the insulating film 111 and the oxide semiconductor film 113c in contact with the oxide semiconductor film 113b and the insulating film 117.

<Band Structure>

Figure 34A:
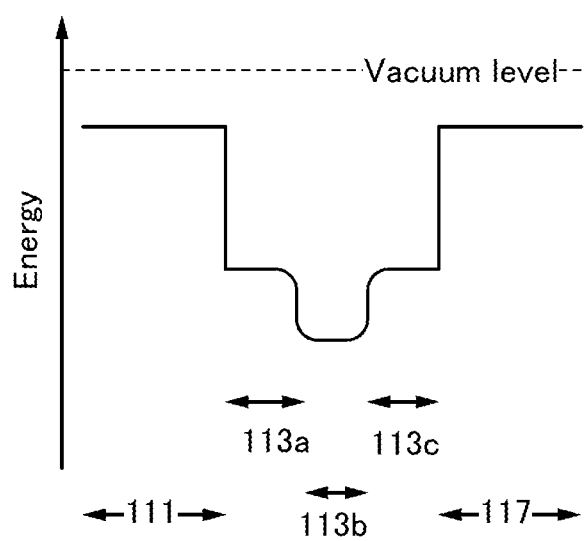
FIGS. 34A and 34B are schematic diagrams of band structures for explaining one embodiment of the present invention.
Figure 34B:
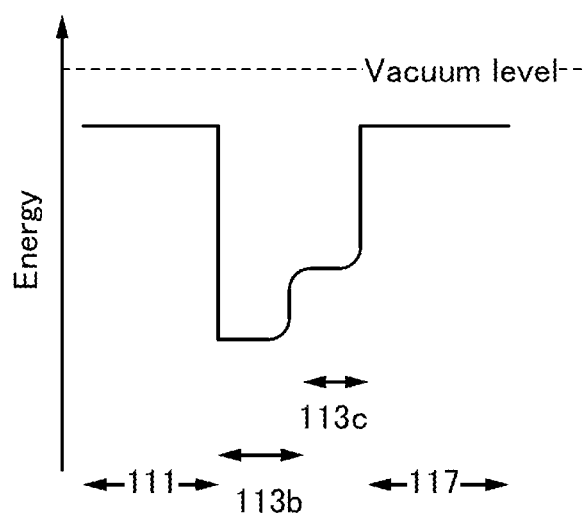

Here, the band structures of the transistor illustrated in FIGS. 28A to 28C and the transistor illustrated in FIGS. 29A to 29C are described. Note that FIG. 34A shows the band structure of the transistor 100D illustrated in FIGS. 28A to 28C, and for easy understanding, the energy (Ec) of the bottom of the conduction band of each of the insulating film 111, the oxide semiconductor films 113a, 113b, and 113c, and the insulating film 117 is shown. FIG. 34B shows the band structure of the transistor 100E illustrated in FIGS. 29A to 29C, and for easy understanding, the energy (Ec) of the bottom of the conduction band of each of the insulating film 111, the oxide semiconductor films 113b and 113c, and the insulating film 117 is shown.

As illustrated in FIG. 34A, the energies at the bottoms of the conduction bands are changed continuously in the oxide semiconductor films 113a, 113b, and 113c. This can be understood also from the fact that the constituent elements are common among the oxide semiconductor films 113a, 113b, and 113c and oxygen is easily diffused among the oxide semiconductor films 113a to 113c. Thus, the oxide semiconductor films 113a, 113b, and 113c have a continuous physical property although they are a stack of films having different compositions.

The oxide semiconductor films that are stacked and contain the same main components have not only a simple stacked-layer structure of the layers but also a continuous energy band (here, in particular, a well structure having a U shape in which energies at the bottoms of the conduction bands are changed continuously between layers (U-shaped well)). That is, the stacked-layer structure is formed so that a defect state which serves as a trap center or a recombination center in an oxide semiconductor, or an impurity which inhibits the flow of carriers does not exist at interfaces between the layers. If impurities are mixed between the oxide semiconductor films stacked, the continuity of the energy band is lost and carriers disappear by a trap or recombination.

Note that FIG. 34A illustrates the case where the Ec of the oxide semiconductor film 113a and the Ec of the oxide semiconductor film 113c are equal to each other; however, they may be different from each other.

As illustrated in FIG. 34A, the oxide semiconductor film 113b serves as a well and a channel of the transistor 100D is formed in the oxide semiconductor film 113b. Note that since the energies at the bottoms of the conduction bands are changed continuously in the oxide semiconductor films 113a, 113b, and 113c, a channel in the well structure having a U shape can also be referred to as a buried channel.

As illustrated in FIG. 34B, the energies at the bottoms of the conduction bands are changed continuously in the oxide semiconductor films 113b and 113c.

As illustrated in FIG. 34B, the oxide semiconductor film 113b serves as a well and a channel of the transistor 100E is formed in the oxide semiconductor film 113b.

The transistor 100D illustrated in FIGS. 28A to 28C includes the oxide semiconductor films 113a and 113c containing one or more metal elements forming the semiconductor film 113b; therefore, interface states are not easily formed at the interface between the oxide semiconductor film 113a and the oxide semiconductor film 113b and the interface between the oxide semiconductor film 113c and the oxide semiconductor film 113b. Thus, with the oxide semiconductor films 113a and 113c, variation or change in the electrical characteristics of the transistor, such as a threshold voltage, can be reduced.

The transistor 100E illustrated in FIGS. 29A to 29C includes the oxide semiconductor film 113c containing one or more metal elements forming the semiconductor film 113b; therefore, an interface state is not easily formed at the interface between the oxide semiconductor film 113c and the oxide semiconductor film 113b. Thus, with the oxide semiconductor film 113c, variation or change in the electrical characteristics of the transistor, such as a threshold voltage, can be reduced. The display device described in any of the above embodiments is formed using the transistors in which variation in the threshold voltage is reduced; thus, variation in the threshold voltage can be corrected easily and effectively.

<Structure Example 4 of Transistor>

Next, another structure of the transistor included in the display device is described with reference to FIGS. 31A to 31D.

Figure 31A:
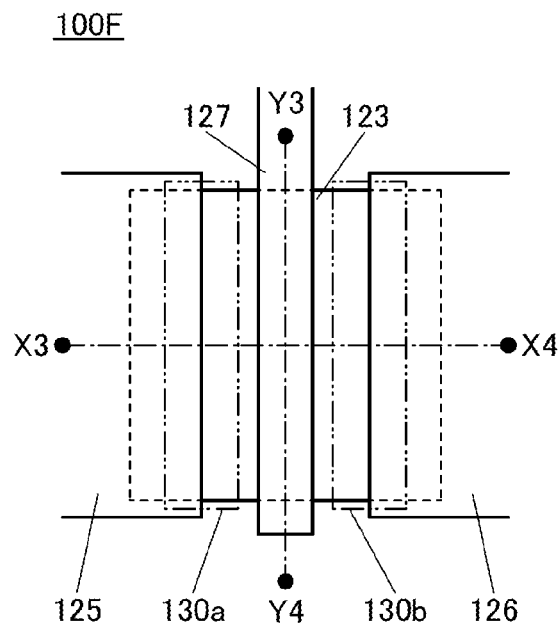
FIGS. 31A to 31D are a top view and cross-sectional views for explaining one embodiment of the present invention.
Figure 31B:
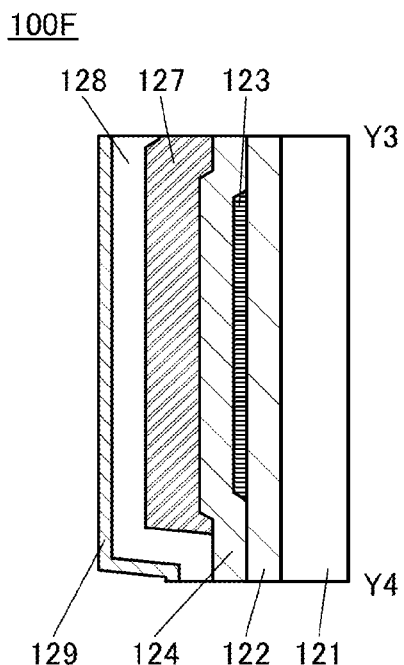
Figure 31C:
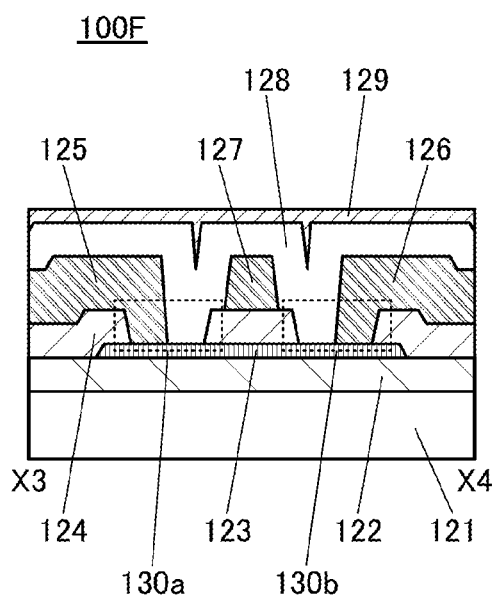

FIGS. 31A to 31C are a top view and cross-sectional views of a transistor 100F included in the display device. FIG. 31A is a top view of the transistor 100F, FIG. 31B is a cross-sectional view taken along dashed-dotted line Y3-Y4 in FIG. 31A, and FIG. 31C is a cross-sectional view taken along dashed-dotted line X3-X4 in FIG. 31A.

The transistor 100F illustrated in FIGS. 31A to 31D includes an oxide semiconductor film 123 over an insulating film 122 formed over a substrate 121, an insulating film 124 in contact with the oxide semiconductor film 123, a conductive film 125 in contact with the oxide semiconductor film 123 in part of an opening 130a formed in the insulating film 124, a conductive film 126 in contact with the oxide semiconductor film 123 in part of an opening 130b formed in the insulating film 124, and a conductive film 127 overlapping with the oxide semiconductor film 123 with the insulating film 124 provided therebetween. Note that insulating films 128 and 129 may be provided over the transistor 100F.

Regions of the oxide semiconductor film 123 not overlapping with the conductive films 125 and 126 and the conductive film 127 each include an element which forms an oxygen vacancy. An element which forms an oxygen vacancy is described below as an impurity element. Typical examples of an impurity element are hydrogen, boron, carbon, nitrogen, fluorine, aluminum, silicon, phosphorus, chlorine, a rare gas element, and the like. Typical examples of a rare gas element are helium, neon, argon, krypton, and xenon.

When the impurity element is added to the oxide semiconductor film, a bond between a metal element and oxygen in the oxide semiconductor film is cut, whereby an oxygen vacancy is formed. When the impurity element is added to the oxide semiconductor film, oxygen bonded to a metal element in the oxide semiconductor film is bonded to the impurity element, whereby oxygen is detached from the metal element and accordingly an oxygen vacancy is formed. As a result, the oxide semiconductor film has a higher carrier density and thus the conductivity thereof becomes higher.

Figure 31D:
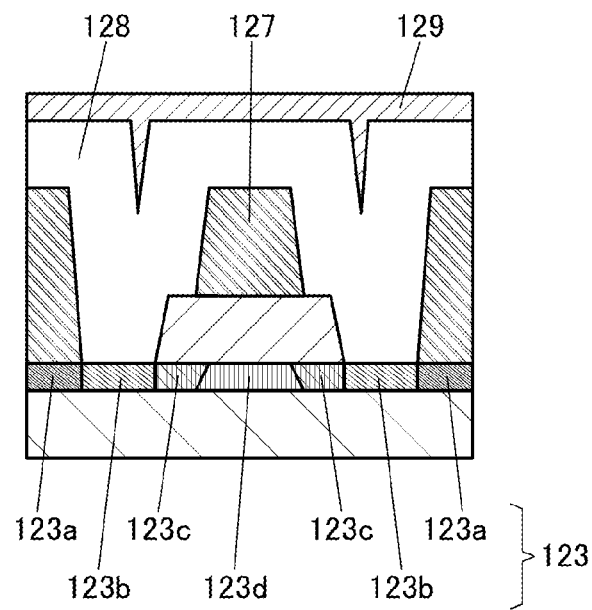

Here, FIG. 31D is a partial enlarged view of the oxide semiconductor film 123. As illustrated in FIG. 31D, the oxide semiconductor film 123 includes regions 123a in contact with the conductive films 125 and 126, regions 123b in contact with the insulating film 128, and regions 123c and a region 123d overlapping with the insulating film 124.

The regions 123a have high conductivity and function as a source region and a drain region in a manner similar to that of the regions 112a illustrated in FIGS. 26A and 26B.

The regions 123b and 123c function as low-resistance regions. The regions 123b and 123c contain an impurity element. Note that the concentrations of the impurity element in the regions 123b are higher than those in the regions 123c. Note that in the case where the conductive film 127 has a tapered side surface, part of the regions 123c may overlap with the conductive film 127.

In the case where a rare gas element is used as the impurity element and the oxide semiconductor film 123 is formed by a sputtering method, the regions 123a to 123d contain the rare gas element, and the concentrations of the rare gas elements in the regions 123b and 123c are higher than those in the regions 123a and 123d. This is due to the fact that in the case where the oxide semiconductor film 123 is formed by a sputtering method, the rare gas element is contained in the oxide semiconductor film 123 because the rare gas element is used as a sputtering gas and the rare gas element is intentionally added to the oxide semiconductor film 123 in order to form oxygen vacancies in the regions 123b and 123c. Note that a rare gas element different from that in the regions 123a and 123d may be added to the regions 123b and 123c.

In the case where the impurity element is boron, carbon, nitrogen, fluorine, aluminum, silicon, phosphorus, or chlorine, only the regions 123b and 123c contain the impurity element. Therefore, the concentrations of the impurity element in the regions 123b and 123c are higher than those in the regions 123a and 123d. Note that the concentrations of the impurity element in the regions 123b and 123c which are measured by SIMS can be greater than or equal to $1\times10^{18}$ atoms/cm$^3$ and less than or equal to $1\times10^{22}$ atoms/cm$^3$, greater than or equal to $1\times10^{19}$ atoms/cm$^3$ and less than or equal to $1\times10^{21}$ atoms/cm$^3$, or greater than or equal to $5\times10^{19}$ atoms/cm$^3$ and less than or equal to $5\times10^{20}$ atoms/cm$^3$.

The concentrations of the impurity element in the regions 123b and 123c are higher than those in the regions 123a and 123d in the case where the impurity elements are hydrogen. Note that the concentrations of hydrogen in the regions 123b and 123c which are measured by SIMS can be greater than or equal to $8\times10^{19}$ atoms/cm$^3$, greater than or equal to $1\times10^{20}$ atoms/cm$^3$, or greater than or equal to $5\times10^{20}$ atoms/cm$^3$.

Since the regions 123b and 123c contain the impurity elements, oxygen vacancies and carrier densities of the regions 123b and 123c are increased. As a result, the region 123b and the region 123c have higher conductivity and serve as low-resistance regions. By provision of the low-resistance regions in such a manner, the resistance between the channel and the source region and the drain region can be reduced, and the transistor 100F have high on-state current and high field-effect mobility. Thus, the transistor 100F can be preferably used as the driving transistor (e.g., the transistor 22) described in the above embodiment.

Note that the impurity element may be a combination of one or more of hydrogen, boron, carbon, nitrogen, fluorine, aluminum, silicon, phosphorus, and chlorine and one or more of the rare gas elements. In that case, due to interaction between oxygen vacancies formed by the rare gas elements in the regions 123b and 123c and one or more of hydrogen, boron, carbon, nitrogen, fluorine, aluminum, silicon, phosphorus, and chlorine added to the above regions, the conductivity of the regions 123b and 123c might be further increased.

The region 123d serves as a channel.

A region of the insulating film 124 overlapping with the oxide semiconductor film 123 and the conductive film 127 functions as a gate insulating film. In addition, a region of the insulating film 124 overlapping with the oxide semiconductor film 123 and the conductive films 125 and 126 functions as an interlayer insulating film.

The conductive film 125 and the conductive film 126 serve as a source electrode and a drain electrode. The conductive film 127 functions as a gate electrode.

In the manufacturing process of the transistor 100F described in this embodiment, the conductive film 127 functioning as a gate electrode and the conductive films 125 and 126 functioning as a source electrode and a drain electrode are formed at the same time. Therefore, in the transistor 100F, the conductive film 127 does not overlap with the conductive films 125 and 126, and parasitic capacitance formed between the conductive film 127 and each of the conductive films 125 and 126 can be reduced. As a result, in the case where a large-sized substrate is used as the substrate 121, signal delays in the conductive films 125 and 126 and the conductive film 127 can be reduced.

In addition, in the transistor 100F, the impurity element is added to the oxide semiconductor film 123 using the conductive films 125 and 126 and the conductive film 127 as masks. That is, the low-resistance regions can be formed in a self-aligned manner.

The substrate 101 illustrated in FIGS. 25A and 25B can be used as appropriate as the substrate 121.

As the insulating film 122, the insulating film 111 illustrated in FIGS. 25A and 25B can be used as appropriate.

The oxide semiconductor films 103 and 112 illustrated in FIGS. 25A and 25B can be used as appropriate as the oxide semiconductor film 123.

The insulating films 106 and 117 illustrated in FIGS. 25A and 25B can be used as appropriate as the insulating film 124.

Since the conductive films 125 and 126 and the conductive film 127 are formed at the same time, they are formed using the same materials and have the same stacked-layer structures.

The conductive films 114 and 116, the conductive film 118, the conductive films 104 and 105, the conductive film 102, and the conductive film 107 illustrated in FIGS. 25A and 25B can be used as appropriate as the conductive films 125 and 126 and the conductive film 127.

The insulating film 128 can be formed with a single layer or a stack using one or more oxide insulating films and/or one or more nitride insulating films. Note that an oxide insulating film is preferably used as at least a region of the insulating film 128 that is in contact with the oxide semiconductor film 123, in order to improve characteristics of the interface with the oxide semiconductor film 123. An oxide insulating film that releases oxygen by being heated is preferably used as the insulating film 128, in which case oxygen contained in the insulating film 128 can be moved to the oxide semiconductor film 123 by heat treatment.

The insulating film 128 can be formed with a single layer or a stack using, for example, one or more of silicon oxide, silicon oxynitride, silicon nitride oxide, silicon nitride, aluminum oxide, hafnium oxide, gallium oxide, a Ga—Zn oxide, and the like.

It is preferable that the insulating film 129 be a film functioning as a barrier film against hydrogen, water, or the like from the outside. The insulating film 129 can be formed with a single layer or a stack using, for example, one or more of silicon nitride, silicon nitride oxide, aluminum oxide, and the like.

The thicknesses of the insulating films 128 and 129 each can be greater than or equal to 30 nm and less than or equal to 500 nm, or greater than or equal to 100 nm and less than or equal to 400 nm.

Note that in a manner similar to that of the transistor 100B illustrated in FIGS. 25A and 25B, the transistor 100F can have a dual-gate structure in which a conductive film is provided below the insulating film 122 so as to overlap with the oxide semiconductor film 123.

<Structure Example 5 of Transistor>

Next, another structure of the transistor included in the display device is described with reference to FIGS. 32A to 32C and FIGS. 33A and 33B.

Figure 32A:
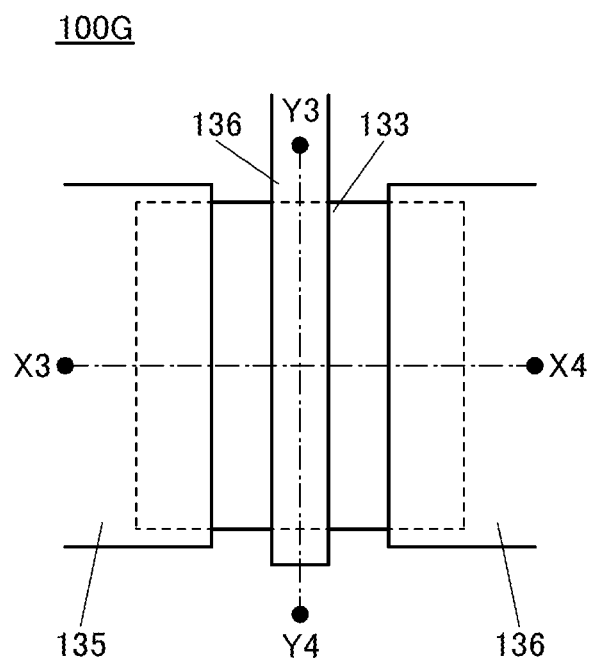
FIGS. 32A to 32C are a top view and cross-sectional views for explaining one embodiment of the present invention.
Figure 32B:
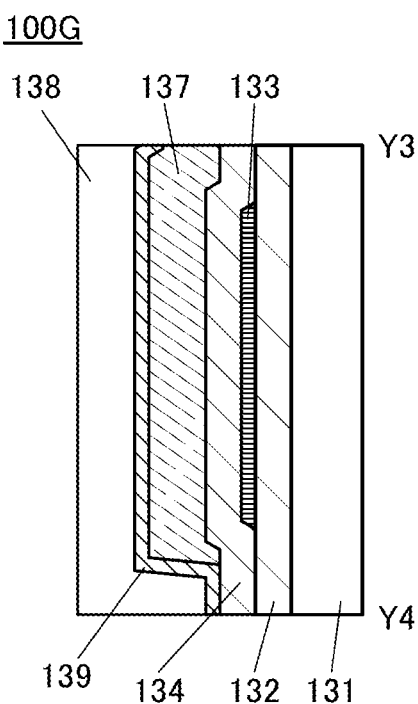
Figure 32C:
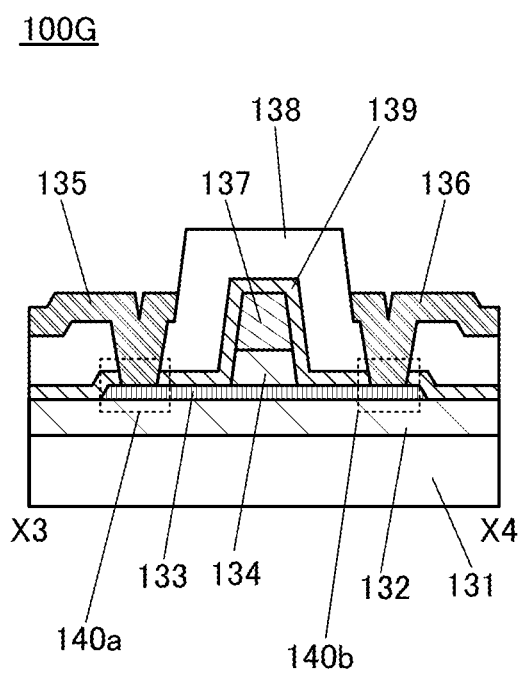

FIGS. 32A to 32C are a top view and cross-sectional views of a transistor 100G included in the display device. FIG. 32A is a top view of the transistor 100G, FIG. 32B is a cross-sectional view taken along dashed-dotted line Y3-Y4 in FIG. 32A, and FIG. 32C is a cross-sectional view taken along dashed-dotted line X3-X4 in FIG. 32A.

The transistor 100G illustrated in FIGS. 32A to 32C includes an oxide semiconductor film 133 over an insulating film 132 formed over a substrate 131, an insulating film 134 in contact with the oxide semiconductor film 133, a conductive film 137 overlapping with the oxide semiconductor film 133 with the insulating film 134 provided therebetween, an insulating film 139 in contact with the oxide semiconductor film 133, an insulating film 138 formed over the insulating film 139, a conductive film 135 in contact with the oxide semiconductor film 133 in an opening 140a formed in the insulating films 138 and 139, and a conductive film 136 in contact with the oxide semiconductor film 133 in an opening 140b formed in the insulating films 138 and 139.

The conductive film 137 of the transistor 100G functions as a gate electrode. The conductive films 135 and 136 function as a source electrode and a drain electrode.

Regions of the oxide semiconductor film 133 not overlapping with the conductive films 135 and 136 and the conductive film 137 each include an element which forms an oxygen vacancy. An element which forms an oxygen vacancy is described below as an impurity element. Typical examples of an impurity element are hydrogen, boron, carbon, nitrogen, fluorine, aluminum, silicon, phosphorus, chlorine, a rare gas element, and the like. Typical examples of a rare gas element are helium, neon, argon, krypton, and xenon.

When the impurity element is added to the oxide semiconductor film, a bond between a metal element and oxygen in the oxide semiconductor film is cut, whereby an oxygen vacancy is formed. When the impurity element is added to the oxide semiconductor film, oxygen bonded to a metal element in the oxide semiconductor film is bonded to the impurity element, whereby oxygen is detached from the metal element and accordingly an oxygen vacancy is formed. As a result, the oxide semiconductor film has a higher carrier density and thus the conductivity thereof becomes higher.

Figure 33A:
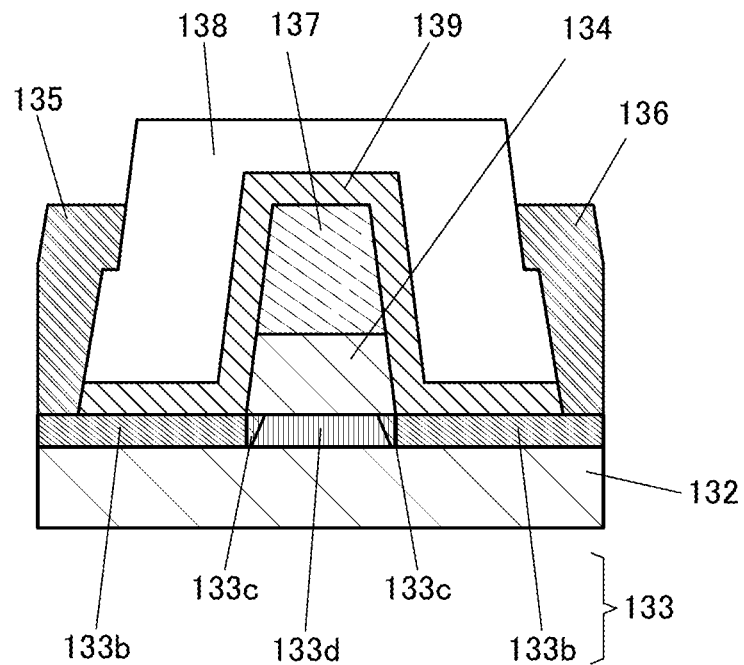
FIGS. 33A and 33B are cross-sectional views for explaining one embodiment of the present invention.
Figure 33B:
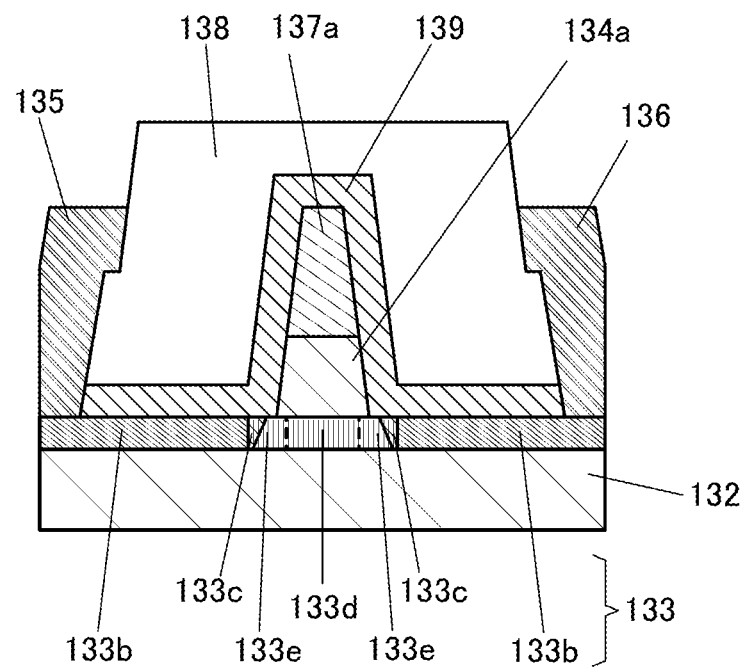

Here, FIG. 33A is a partial enlarged view of the oxide semiconductor film 133. As illustrated in FIG. 33A, the oxide semiconductor film 133 includes regions 133b in contact with the conductive films 135 and 136 or the insulating film 138 and a region 133d in contact with the insulating film 134. Note that in the case where the conductive film 137 has a tapered side surface, the oxide semiconductor film 133 may include a region 133c overlapping with a tapered portion of the conductive film 137.

The region 133b functions as a low-resistance region. The region 133b contains at least a rare gas element and hydrogen as impurity elements. Note that in the case where the conductive film 137 has a tapered side surface, the impurity element is added to the region 133c through the tapered portion of the conductive film 137; therefore, the region 133c contains the impurity element, though the concentration of the rare gas element, which is an example of the impurity element, of the region 133c is lower than that in the region 133b. With the regions 133c, source-drain breakdown voltage of the transistor can be increased.

In the case where the oxide semiconductor film 133 is formed by a sputtering method, the regions 133b to 133d each contain the rare gas element, and the concentrations of the rare gas elements in the regions 133b and 133c are higher than those in the region 133d. This is due to the fact that in the case where the oxide semiconductor film 133 is formed by a sputtering method, the rare gas element is contained in the oxide semiconductor film 133 because the rare gas element is used as a sputtering gas and the rare gas element is intentionally added to the oxide semiconductor film 133 in order to form oxygen vacancies in the regions 133b and 133c. Note that a rare gas element different from that in the region 133d may be added to the regions 133b and 133c.

Since the region 133b is in contact with the insulating film 138, the concentration of hydrogen in the region 133b is higher than that in the region 133d. In addition, in the case where hydrogen is diffused from the region 133b to the region 133c, the concentration of hydrogen in the region 133c is higher than that in the region 133d. However, the concentration of hydrogen in the region 133b is higher than that in the region 133c.

In the regions 133b and 133c, the concentrations of hydrogen measured by secondary ion mass spectrometry (SIMS) can be greater than or equal to $8 \times 10^{19}$ atoms/cm$^3$, greater than or equal to $1 \times 10^{20}$ atoms/cm$^3$, or greater than or equal to $5 \times 10^{20}$ atoms/cm$^3$. Note that the concentration of hydrogen in the region 133d which is measured by secondary ion mass spectrometry can be less than or equal to $5 \times 10^{19}$ atoms/cm$^3$, less than or equal to $1 \times 10^{19}$ atoms/cm$^3$, less than or equal to $5 \times 10^{18}$ atoms/cm$^3$, less than or equal to $1 \times 10^{18}$ atoms/cm$^3$, less than or equal to $5 \times 10^{17}$ atoms/cm$^3$, or less than or equal to $1 \times 10^{16}$ atoms/cm$^3$.

In the case where boron, carbon, nitrogen, fluorine, aluminum, silicon, phosphorus, or chlorine is added to the oxide semiconductor film 133 as an impurity element, only the regions 133b and 133c contain the impurity element. Therefore, the concentrations of the impurity element in the regions 133b and 133c are higher than that in the region 133d. Note that the concentrations of the impurity element in the regions 133b and 133c which are measured by secondary ion mass spectrometry can be greater than or equal to $1 \times 10^{18}$ atoms/cm$^3$ and less than or equal to $1 \times 10^{22}$ atoms/cm$^3$, greater than or equal to $1 \times 10^{19}$ atoms/cm$^3$ and less than or equal to $1 \times 10^{21}$ atoms/cm$^3$, or greater than or equal to $5 \times 10^{19}$ atoms/cm$^3$ and less than or equal to $5 \times 10^{20}$ atoms/cm$^3$.

The regions 133b and 133c have higher concentrations of hydrogen and larger amounts of oxygen vacancies due to addition of the rare gas element than the region 133d. Therefore, the regions 133b and 133c have higher conductivity and function as low-resistance regions. The resistivity of the regions 133b and 133c can be typically greater than or equal to $1 \times 10^{-3}$ Ωcm and less than $1 \times 10^{4}$ Ωcm, or greater than or equal to $1 \times 10^{-3}$ Ωcm and less than $1 \times 10^{-1}$ Ωcm.

Note that when the amount of hydrogen in each of the regions 133b and 133c is the same as or smaller than the amount of oxygen vacancies therein, hydrogen is easily captured by oxygen vacancies and is less likely to be diffused to the region 133d serving as a channel. As a result, a transistor having normally-off characteristics can be obtained.

The region 133d serves as a channel.

In addition, after the impurity element is added to the oxide semiconductor film 133 using the conductive film 137 as a mask, the area of the conductive film 137 when seen from the above may be reduced. This can be performed in such a manner that a slimming process is performed on a mask over the conductive film 137 in a step of forming the conductive film 137 so as to obtain a mask with a minuter structure. Then, the conductive film 137 and the insulating film 134 are etched using the mask, so that a conductive film 137a and an insulating film 134a illustrated in FIG. 33B can be formed. As the slimming process, an ashing process using an oxygen radical or the like can be employed, for example.

As a result, an offset region 133e is formed between the region 133c and the region 133d serving as a channel in the oxide semiconductor film 133. Note that the length of the offset region 133e in the channel length direction is set to be less than 0.1 μm, whereby a decrease in the on-state current of the transistor can be suppressed.

The substrate 101 illustrated in FIGS. 25A and 25B can be used as appropriate as the substrate 131 illustrated in FIGS. 32A to 32C.

The insulating film 111 illustrated in FIGS. 25A and 25B can be used as appropriate as the insulating film 132 illustrated in FIGS. 32A to 32C.

The oxide semiconductor films 103 and 112 illustrated in FIGS. 25A and 25B can be used as appropriate as the oxide semiconductor film 133 illustrated in FIGS. 32A to 32C.

The insulating films 106 and 117 illustrated in FIGS. 25A and 25B can be used as appropriate as the insulating film 134 illustrated in FIGS. 32A to 32C.

The conductive films 114 and 116, the conductive film 118, the conductive films 104 and 105, the conductive film 102, and the conductive film 107 illustrated in FIGS. 25A and 25B can be used as appropriate as the conductive films 135 and 136 and the conductive film 137 illustrated in FIGS. 32A to 32C.

The thicknesses of the insulating films 137 and 138 each can be greater than or equal to 30 nm and less than or equal to 500 nm, or greater than or equal to 100 nm and less than or equal to 400 nm.

In the transistor 100G, the conductive film 137 does not overlap with the conductive films 135 and 136, and parasitic capacitance formed between the conductive film 137 and each of the conductive films 135 and 136 can be reduced. As a result, in the case where a large-sized substrate is used as the substrate 131, signal delays in the conductive films 135 and 136 and the conductive film 137 can be reduced.

In addition, in the transistor 100G, the impurity element is added to the oxide semiconductor film 133 using the conductive film 137 as a mask. That is, the low-resistance regions can be formed in a self-aligned manner.

Note that in a manner similar to that of the transistor 100B illustrated in FIGS. 25A and 25B, the transistor 100G can have a dual-gate structure in which a conductive film is provided below the insulating film 132 so as to overlap with the oxide semiconductor film 133.

[Crystal Structure of Oxide Semiconductor Film]

A structure of an oxide semiconductor film that forms the oxide semiconductor layer 520 will be described. In this specification, trigonal and rhombohedral crystal systems are included in a hexagonal crystal system.

An oxide semiconductor film is classified roughly into a single crystal oxide semiconductor film and a non-single-crystal oxide semiconductor film. The non-single-crystal oxide semiconductor film includes any of a CAAC-OS film, a polycrystalline oxide semiconductor film, a microcrystalline oxide semiconductor film, an amorphous oxide semiconductor film, and the like.

[CAAC-OS Film]

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

In the high-resolution cross-sectional TEM image of the CAAC-OS film observed in a direction substantially parallel to the sample surface, metal atoms arranged in a layered manner are seen in the crystal parts. Each metal atom layer has a configuration reflecting unevenness of a surface over which the CAAC-OS film is formed (hereinafter, the surface is referred to as a formation surface) or a top surface of the CAAC-OS film, and is arranged parallel to the formation surface or the top surface of the CAAC-OS film.

While in the high-resolution planar TEM image of the CAAC-OS film observed in a direction substantially perpendicular to the sample surface, metal atoms arranged in a triangular or hexagonal configuration are seen in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that in structural analysis of the CAAC-OS film including an $InGaZnO_4$ crystal by an out-of-plane method, another peak may appear when $2\theta$ is around 36°, in addition to the peak at $2\theta$ of around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ not appear at around 36°.

The CAAC-OS film is an oxide semiconductor film with a low impurity concentration. The impurity is an element other than the main components of the oxide semiconductor film, such as hydrogen, carbon, silicon, or a transition metal element. An element (specifically, silicon or the like) having higher strength of bonding to oxygen than a metal element included in an oxide semiconductor film extracts oxygen from the oxide semiconductor film, which results in disorder of the atomic arrangement and reduced crystallinity of the oxide semiconductor film. A heavy metal such as iron or nickel, argon, carbon dioxide, or the like has a large atomic radius (or molecular radius), and thus disturbs the atomic arrangement of the oxide semiconductor film and decreases crystallinity. Additionally, the impurity contained in the oxide semiconductor film might serve as a carrier trap or a carrier generation source.

The CAAC-OS film is an oxide semiconductor film having a low density of defect states. For example, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus has a low carrier density in some cases. Thus, a transistor including the oxide semiconductor film rarely has a negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. An electric charge trapped by the carrier traps in the oxide semiconductor film takes a long time to be released. The trapped electric charge may behave like a fixed electric charge. Thus, the transistor which includes the oxide semiconductor film having a high impurity concentration and a high density of defect states might have unstable electrical characteristics.

In an OS transistor using the CAAC-OS film, change in electric characteristics of the transistor due to irradiation with visible light or ultraviolet light is small.

[Microcrystalline Oxide Semiconductor Film]

A microcrystalline oxide semiconductor film has a region in which a crystal part is observed and a region in which a crystal part is not observed clearly in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high-resolution TEM image of the nc-OS, for example, a grain boundary is not clearly observed in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is analyzed by an out-of-plane method using an X-ray beam having a diameter larger than the size of a crystal part, a peak which shows a crystal plane does not appear. Furthermore, a diffraction pattern like a halo pattern is observed when the nc-OS film is subjected to electron diffraction using an electron beam with a probe diameter (e.g., 50 nm or larger) that is larger than the size of a crystal part (the electron diffraction is also referred to as selected-area electron diffraction). Meanwhile, spots appear in a nanobeam electron diffraction pattern of the nc-OS film when an electron beam having a probe diameter close to or smaller than the size of a crystal part is applied. Moreover, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film that has high regularity as compared with an amorphous oxide semiconductor film. Therefore, the nc-OS film is likely to have a lower density of defect states than an amorphous oxide semiconductor film. Note that there is no regularity of crystal orientation between different crystal parts in the nc-OS film. Therefore, the nc-OS film has a higher density of defect states than the CAAC-OS film.

[Amorphous Oxide Semiconductor Film]

The amorphous oxide semiconductor film is an oxide semiconductor film having disordered atomic arrangement and no crystal part. For example, the amorphous oxide semiconductor film does not have a specific state as in quartz.

In a high-resolution TEM image of the amorphous oxide semiconductor film, crystal parts cannot be found. When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

An oxide semiconductor film may have a structure having physical properties intermediate between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed. In this manner, growth of the crystal part occurs due to the crystallization of the a-like OS film, which is induced by a slight amount of electron beam employed in the TEM observation. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes having a distance therebetween of from 0.28 nm to 0.30 nm is regarded as corresponding to the a-b plane of the $InGaZnO_4$ crystal, focusing on the lattice fringes in the high-resolution TEM image.

The film density of the oxide semiconductor film varies depending on the structure in some cases. For example, the structure of an oxide semiconductor film can be estimated by comparing the film density of the oxide semiconductor film with the film density of a single crystal oxide semiconductor film having the same composition as the oxide semiconductor film. For example, the film density of the a-like OS film is higher than or equal to 78.6% and lower than 92.3% of the film density of the single crystal oxide semiconductor film having the same composition. For example, the film density of the nc-OS film and the CAAC-OS film is higher than or equal to 92.3% or and lower than 100% of the film density of the single crystal oxide semiconductor film having the same composition. Note that it is difficult to form an oxide semiconductor film having a film density of lower than 78% of the film density of the single crystal oxide semiconductor film having the same composition.

Specific examples of the above description are given. For example, in the case of an oxide semiconductor film having an atomic ratio of In:Ga:Zn=1:1:1, the film density of single crystal $InGaZnO_4$ with a rhombohedral crystal structure is 6.357 $g/cm^3$. Accordingly, in the case of the oxide semiconductor film having an atomic ratio of In:Ga:Zn=1:1:1, the film density of the a-like OS film is higher than or equal to 5.0 $g/cm^3$ and lower than 5.9 $g/cm^3$. For example, in the case of the oxide semiconductor film having an atomic ratio of In:Ga:Zn=1:1:1, the film density of each of the nc-OS film and the CAAC-OS film is higher than or equal to 5.9 $g/cm^3$ and lower than 6.3 $g/cm^3$.

Note that there is a possibility that an oxide semiconductor film having a certain composition cannot exist in a single crystal structure. In that case, single crystal oxide semiconductor films with different compositions are combined in an adequate ratio to calculate the density equivalent to that of a single crystal oxide semiconductor film with the desired composition. The film density of the single crystal oxide semiconductor film having the desired composition can be calculated using a weighted average according to the combination ratio of the single crystal oxide semiconductor films with different compositions. Note that it is preferable to combine as few kinds of single crystal oxide semiconductor films as possible for film density calculation.

Note that an oxide semiconductor film may be a stacked film including two or more of an amorphous oxide semiconductor film, an a-like OS film, a microcrystalline oxide semiconductor film, and a CAAC-OS film, for example.

<Film Formation Method>

Although the variety of films such as the metal film, the semiconductor film, the inorganic insulating film which are disclosed in this specification and the like can be formed by a sputtering method or a plasma chemical vapor deposition (CVD) method, such films may be formed by another method, for example, a thermal CVD method. A metal organic chemical vapor deposition (MOCVD) method or an atomic layer deposition (ALD) method, for example, may be employed as a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied at a time to the chamber, in which the pressure is set to an atmospheric pressure or a reduced pressure, and react with each other in the vicinity of the substrate or over the substrate.

Deposition by an ALD method may be performed in such a manner that source gases for reaction are sequentially introduced into the chamber, in which the pressure is set to an atmospheric pressure or a reduced pressure, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute field effect transistor (FET).

The variety of films such as the metal film, the semiconductor film, and the inorganic insulating film which have been disclosed in the embodiment can be formed by a thermal CVD method such as a MOCVD method or an ALD method. For example, for forming an In—Ga—Zn—O film, trimethylindium, trimethylgallium, and dimethylzinc are used. The chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source material gas which is obtained by vaporizing liquid containing a solvent and a hafnium precursor compound (hafnium alkoxide or hafnium amide such as tetrakis(dimethylamide) hafnium (TDMAH)) are used. The chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing liquid containing a solvent and an aluminum precursor compound (e.g., trimethylaluminum (TMA)) are used. The chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced a plurality of times to form an initial tungsten film, and then a $WF_6$ gas and an $H_2$ gas are alternately introduced, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced a plurality of times to form an In—O layer, a $Ga(CH_3)_3$ gas and an $O_3$ gas are introduced to form a GaO layer, and then a $Zn(CH_3)_2$ gas and an $O_3$ gas are introduced to form a ZnO layer. Note that the order of these layers is not limited to this example. A mixed compound layer such as an In—Ga—O layer, an In—Zn—O layer, or a Ga—Zn—O layer may be formed by using these gases. Note that although an $H_2O$ gas which is obtained by bubbling water with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used.

<Off-State Current>

Unless otherwise specified, the off-state current in this specification refers to a drain current of a transistor in the off state (also referred to as non-conduction state and cutoff state). Unless otherwise specified, the off state of an n-channel transistor means that a voltage (Vgs) between its gate and source is lower than the threshold voltage (Vth), and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on Vgs in some cases. Thus, "the off-state current of a transistor is lower than or equal to I" may mean "there is Vgs with which the off-state current of the transistor becomes lower than or equal to I". Furthermore, "the off-state current of a transistor" means "the off-state current in an off state at predetermined Vgs", "the off-state current in an off state at Vgs in a predetermined range", "the off-state current in an off state at Vgs with which sufficiently reduced off-state current is obtained", or the like.

As an example, the assumption is made of an n-channel transistor where the threshold voltage Vth is 0.5 V and the drain current is $1\times10^{-9}$ A at Vgs of 0.5 V, $1\times10^{-13}$ A at Vgs of 0.1 V, $1\times10^{-19}$ A at Vgs of −0.5 V, and $1\times10^{-22}$ A at Vgs of −0.8 V. The drain current of the transistor is $1\times10^{-19}$ A or lower at Vgs of −0.5 V or at Vgs in the range of −0.8 V to −0.5 V; therefore, it can be said that the off-state current of the transistor is $1\times10^{-19}$ A or lower. Since there is Vgs at which the drain current of the transistor is $1\times10^{-22}$ A or lower, it may be said that the off-state current of the transistor is $1\times10^{-22}$ A or lower.

In this specification, the off-state current of a transistor with a channel width W is sometimes represented by a current value in relation to the channel width W or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability required in a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may refer to a situation where there is Vgs at which the off-state current of a transistor is lower than or equal to I at room temperature, 60° C., 85° C., 95° C., 125° C., a temperature at which the reliability required in a semiconductor device or the like including the transistor is ensured, or a temperature at which the semiconductor device or the like including the transistor is used (e.g., temperature in the range of 5° C. to 35° C.).

The off-state current of a transistor depends on voltage Vds between its drain and source in some cases. Unless otherwise specified, the off-state current in this specification may be an off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at Vds at which the required reliability of a semiconductor device or the like including the transistor is ensured or Vds at which the semiconductor device or the like including the transistor is used. The description "an off-state current of a transistor is lower than or equal to I" may refer to a situation where there is Vgs at which the off-state current of a transistor is lower than or equal to I at Vds of 0.1 V, 0.8 V, 1 V, 1.2 V, 1.8 V, 2.5 V, 3 V, 3.3 V, 10 V, 12 V, 16 V, or 20 V, Vds at which the required reliability of a semiconductor device or the like including the transistor is ensured, or Vds at which in the semiconductor device or the like including the transistor is used.

In the above description of off-state current, a drain may be replaced with a source. That is, the off-state current sometimes refers to a current that flows through a source of a transistor in the off state.

In this specification, the term "leakage current" sometimes expresses the same meaning as off-state current.

In this specification, the off-state current sometimes refers to a current that flows between a source and a drain when a transistor is off, for example.

The structure described above in this embodiment can be combined as appropriate with any of the structures described in the other embodiments.

Embodiment 5

Figure 35:
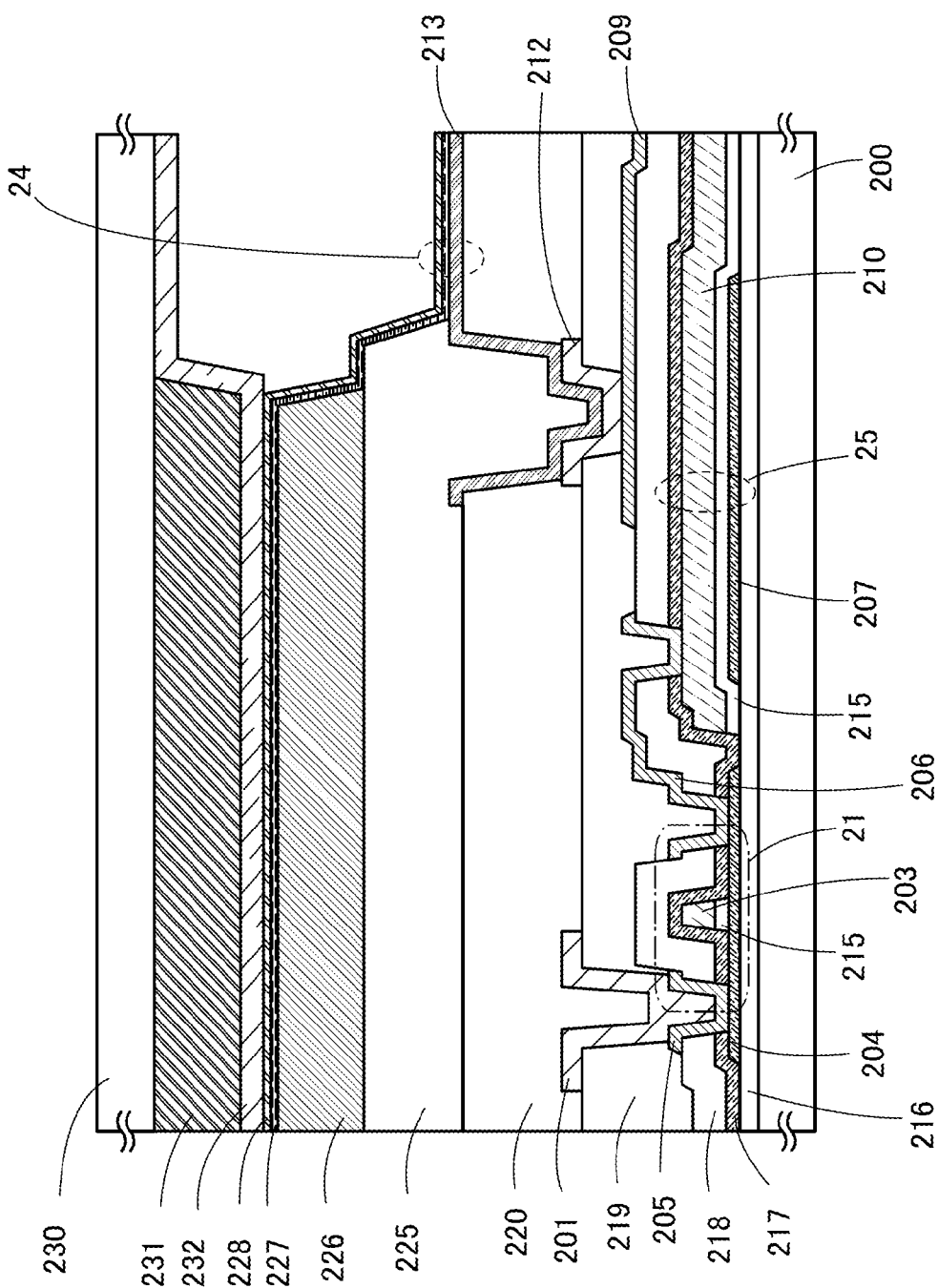
FIG. 35 is a cross-sectional view for explaining one embodiment of the present invention.

An example of a cross-sectional view of a display pixel of a display device will be described in this embodiment. FIG. 35 illustrates a cross-sectional structure of the transistor 21, the capacitor 25, and the light-emitting element 24 in the pixel 20.

Specifically, the display device illustrated in FIG. 35 includes an insulating film 216 over a substrate 200, and the transistor 21 and the capacitor 25 over the insulating film 216. The transistor 21 includes a semiconductor film 204, an insulating film 215 over the semiconductor film 204, a conductive film 203 overlapping with the semiconductor film 204 with the insulating film 215 provided therebetween and functioning as a gate, a conductive film 205 which is in contact with the semiconductor film 204 and is provided in an opening formed in an insulating film 217 and an insulating film 218, and a conductive film 206 which is similarly in contact with the semiconductor film 204 and is provided in an opening formed in the insulating films 217 and 218. Note that the conductive films 205 and 206 function as a source and a drain of the transistor 21.

The capacitor 25 includes a semiconductor film 207 functioning as an electrode, the insulating film 215 over the semiconductor film 207, and a conductive film 210 overlapping with the semiconductor film 207 with the insulating film 215 provided therebetween and functioning as an electrode.

The insulating film 215 may be formed with a single layer or a stack of an insulating film containing one or more of aluminum oxide, aluminum oxynitride, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Note that in this specification, oxynitride contains more oxygen than nitrogen, and nitride oxide contains more nitrogen than oxygen.

In the case where an oxide semiconductor is used in the semiconductor film 204, it is preferable to use, in the insulating film 216, a material that can supply oxygen to the semiconductor film 204. By using the material in the insulating film 216, oxygen contained in the insulating film 216 can be moved to the semiconductor film 204, and the amount of oxygen vacancies in the semiconductor film 204 can be reduced. Oxygen contained in the insulating film 216 can be moved to the semiconductor film 204 efficiently by heat treatment performed after the semiconductor film 204 is formed.

The insulating film 217 is provided over the semiconductor film 204 and the conductive films 203 and 210; the insulating film 218 is provided over the insulating film 217; and the conductive films 205 and 206 and a conductive film 209, and an insulating film 219 are provided over the insulating film 218. Conductive films 201 and 212 are provided over the insulating film 219, the conductive film 201 is connected to the conductive film 205 in an opening formed in the insulating film 219, and the conductive film 212 is connected to the conductive film 209 in an opening formed in the insulating film 219.

In the case where an oxide semiconductor is used as the semiconductor film 204, the insulating film 217 preferably has a function of blocking oxygen, hydrogen, water, an alkali metal, an alkaline earth metal, and the like. It is possible to prevent outward diffusion of oxygen from the semiconductor film 204 and entry of hydrogen, water, or the like into the semiconductor film 204 from the outside by providing the insulating film 217. The insulating film 217 can be formed using a nitride insulating film, for example. As the nitride insulating film, a silicon nitride film, a silicon nitride oxide film, an aluminum nitride film, an aluminum nitride oxide film, and the like can be given. Note that instead of the nitride insulating film having a blocking effect against oxygen, hydrogen, water, an alkali metal, an alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

An insulating film 220 and a conductive film 213 are provided over the insulating film 219 and the conductive films 201 and 212, and the conductive film 213 is connected to the conductive film 212 in an opening formed in the insulating film 220.

An insulating film 225 is provided over the insulating film 220 and the conductive film 213. The insulating film 225 has an opening in a region overlapping with the conductive film 213. Over the insulating film 225, an insulating film 226 is provided in a region different from the opening of the insulating film 225. An EL layer 227 and a conductive film 228 are sequentially stacked over the insulating films 225 and 226. A portion in which the conductive films 213 and 228 overlap with each other with the EL layer 227 provided therebetween functions as the light-emitting element 24. One of the conductive films 213 and 228 functions as an anode, and the other functions as a cathode.

The display device includes a substrate 230 that faces the substrate 200 with the light-emitting element 24 provided therebetween. A blocking film 231 having a function of blocking light is provided under the substrate 230, i.e., on a surface of the substrate 230 that is closer to the light-emitting element 24. The blocking film 231 has an opening in a region overlapping with the light-emitting element 24. In the opening overlapping with the light-emitting element 24, a coloring layer 232 that transmits visible light in a specific wavelength range is provided under the substrate 230.

Note that the insulating film 226 is provided to adjust the distance between the light-emitting element 24 and the substrate 230 and may be omitted in some cases.

Although the top-emission structure is employed in this embodiment in which light of the light-emitting element 24 is extracted from the side opposite to the element substrate, a bottom-emission structure in which light of the light-emitting element 24 is extracted from the element substrate side or a dual-emission structure in which light of the light-emitting element 24 is extracted from both the element substrate side and the side opposite to the element substrate can also be applied to embodiments of the present invention.

The structure described above in this embodiment can be combined as appropriate with any of the structures described in the other embodiments.

Embodiment 6

In this embodiment, a display device including a light-emitting element of one embodiment of the present invention and an electronic device in which the display device is provided with an input device will be described with reference to FIGS. 36A and 36B, FIGS. 37A to 37C, and FIGS. 38A and 38B.

<Description 1 of Touch Panel>

In this embodiment, a touch panel 500 including a display device and an input device will be described as an example of an electronic device. In addition, an example in which a touch sensor is used as an input device will be described.

Figure 36A:
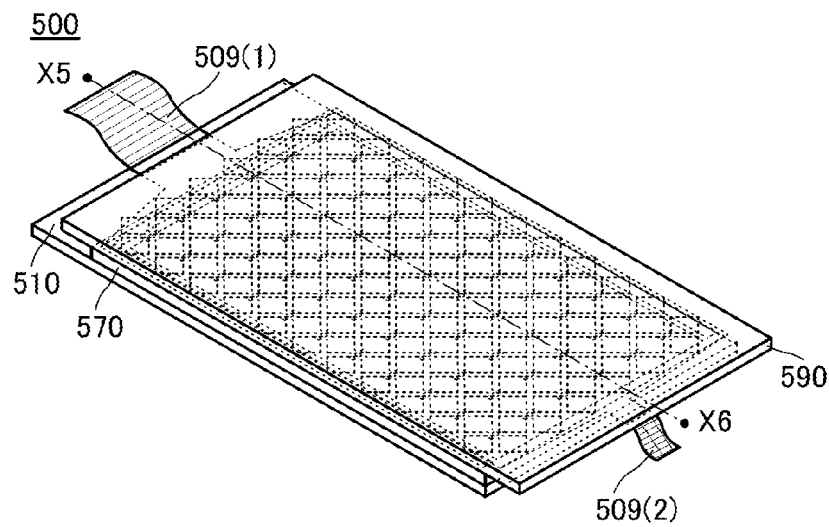
FIGS. 36A and 36B are perspective views for explaining one embodiment of the present invention.
Figure 36B:
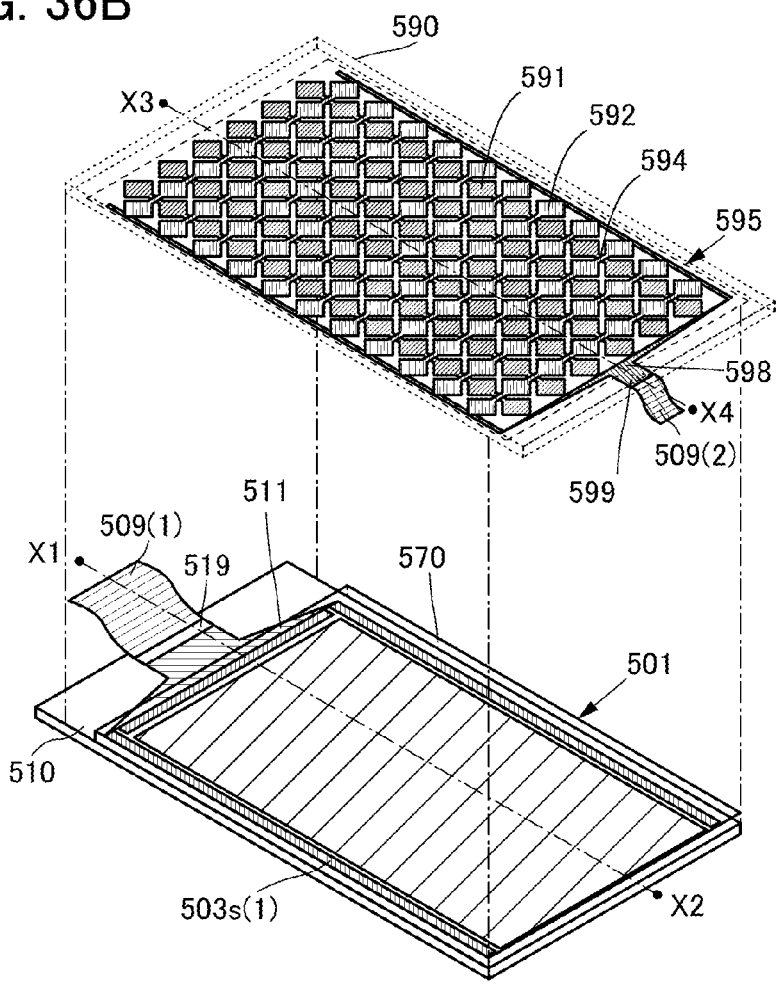

FIGS. 36A and 36B are perspective views of the touch panel 500. Note that FIGS. 36A and 36B illustrate only main components of the touch panel 500 for simplicity.

The touch panel 500 includes a display device 501 and a touch sensor 595 (see FIG. 36B). The touch panel 500 also includes a substrate 510, a substrate 570, and a substrate 590. The substrate 510, the substrate 570, and the substrate 590 each have flexibility. Note that one or all of the substrates 510, 570, and 590 may be inflexible.

The display device 501 includes a plurality of pixels over the substrate 510 and a plurality of wirings 511 through which signals are supplied to the pixels. The plurality of wirings 511 are led to a peripheral portion of the substrate 510, and parts of the plurality of wirings 511 form a terminal 519. The terminal 519 is connected to an FPC 509(1).

The substrate 590 includes the touch sensor 595 and a plurality of wirings 598 connected to the touch sensor 595. The plurality of wirings 598 are led to a peripheral portion of the substrate 590, and parts of the plurality of wirings 598 form a terminal. The terminal is connected to an FPC 509(2). Note that in FIG. 36B, electrodes, wirings, and the like of the touch sensor 595 provided on the back side of the substrate 590 (the side facing the substrate 510) are indicated by solid lines for clarity.

As the touch sensor 595, a capacitive touch sensor can be used for example. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

Note that the touch sensor 595 illustrated in FIG. 36B is an example of using a projected capacitive touch sensor.

Note that a variety of sensors that can sense proximity or touch of a sensing target such as a finger can be used as the touch sensor 595.

The projected capacitive touch sensor 595 includes electrodes 591 and electrodes 592. The electrodes 591 are connected to any of the plurality of wirings 598, and the electrodes 592 are connected to any of the other wirings 598.

The electrodes 592 each have a shape of a plurality of quadrangles arranged in one direction with one corner of a quadrangle connected to one corner of another quadrangle as illustrated in FIGS. 36A and 36B.

The electrodes 591 each have a quadrangular shape and are arranged in a direction intersecting with the direction in which the electrodes 592 extend.

A wiring 594 connects two electrodes 591 between which the electrode 592 is positioned. The intersecting area of the electrode 592 and the wiring 594 is preferably as small as possible. Such a structure allows a reduction in the area of a region where the electrodes are not provided, reducing variation in transmittance. As a result, variation in luminance of light passing through the touch sensor 595 can be reduced.

Note that the shapes of the electrodes 591 and the electrodes 592 are not limited thereto and can be any of a variety of shapes. For example, a structure may be employed in which the plurality of electrodes 591 are arranged so that gaps between the electrodes 591 are reduced as much as possible, and the electrodes 592 are spaced apart from the electrodes 591 with an insulating layer interposed therebetween to have regions not overlapping with the electrodes 591. In this case, it is preferable to provide, between two adjacent electrodes 592, a dummy electrode electrically insulated from these electrodes because the area of regions having different transmittances can be reduced.

<Display Device>

Figure 37A:
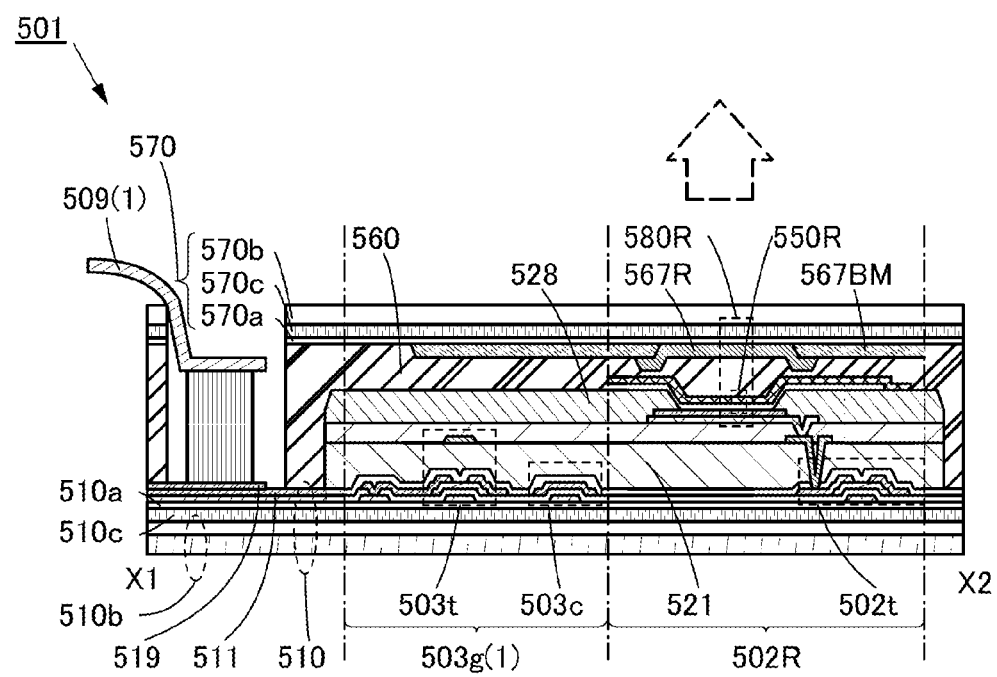
FIGS. 37A to 37C are cross-sectional views for explaining one embodiment of the present invention.

Next, the display device 501 will be described in detail with reference to FIG. 37A. FIG. 37A corresponds to a cross-sectional view taken along dashed-dotted line X1-X2 in FIG. 36B.

The display device 501 includes a plurality of pixels arranged in a matrix. Each of the pixels includes a display element and a pixel circuit for driving the display element.

In the following description, an example of using a light-emitting element that emits white light as a display element will be described; however, the display element is not limited to such an element. For example, light-emitting elements that emit light of different colors may be included so that the light of different colors can be emitted from adjacent pixels.

Note that in this specification and the like, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescent (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element including a carbon nanotube, and the like. Other than the above, the display element, the display device, the light-emitting element, or the light-emitting device may include a display medium whose contrast, luminance, reflectivity, transmittance, or the like is changed by electrical or magnetic effect. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. In the case of a transflective liquid crystal display or a reflective liquid crystal display, some of or all of pixel electrodes have a function of reflective electrodes. For example, some or all of pixel electrodes are formed to contain aluminum, silver, or the like. In such a case, a memory circuit such as an SRAM can be provided under the reflective electrodes, leading to lower power consumption. Note that in the case of using an LED, graphene or graphite may be provided under an electrode or a nitride semiconductor of the LED. Graphene or graphite may be a multilayer film in which a plurality of layers are stacked. The provision of graphene or graphite enables easy formation of a nitride semiconductor film thereover, such as an n-type GaN semiconductor layer including crystals. Furthermore, a p-type GaN semiconductor layer including crystals or the like can be provided thereover, and thus the LED can be formed. Note that an MN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

For the substrate 510 and the substrate 570, for example, a flexible material with a vapor permeability of lower than or equal to $10^{-5}$ g/(m$^2$·day), preferably lower than or equal to $10^{-6}$ g/(m$^2$·day) can be favorably used. Alternatively, materials whose thermal expansion coefficients are substantially equal to each other are preferably used for the substrate 510 and the substrate 570. For example, the coefficients of linear expansion of the materials are preferably lower than or equal to $1\times10^{-3}$/K, further preferably lower than or equal to $5\times10^{-5}$/K, and still further preferably lower than or equal to $1\times10^{-5}$/K.

Note that the substrate 510 is a stacked body including an insulating layer 510a for preventing impurity diffusion into the light-emitting element, a flexible substrate 510b, and an adhesive layer 510c for attaching the insulating layer 510a and the flexible substrate 510b to each other. The substrate 570 is a stacked body including an insulating layer 570a for preventing impurity diffusion into the light-emitting element, a flexible substrate 570b, and an adhesive layer 570c for attaching the insulating layer 570a and the flexible substrate 570b to each other.

For the adhesive layer 510c and the adhesive layer 570c, for example, materials that include polyester, polyolefin, polyamide (e.g., nylon, aramid), polyimide, polycarbonate, polyurethane, an acrylic resin, an epoxy resin, or a resin having a siloxane bond such as silicone can be used.

A sealing layer 560 is provided between the substrate 510 and the substrate 570. The sealing layer 560 preferably has a refractive index higher than that of air. In the case where light is extracted to the sealing layer 560 side as illustrated in FIG. 37A, the sealing layer 560 also serves as a layer (hereinafter, also referred to as an optical bonding layer) that optically bonds two components (here, the substrates 510 and 570) between which the sealing layer 560 is sandwiched.

A sealant may be formed in the peripheral portion of the sealing layer 560. With the use of the sealant, a light-emitting element 550R can be provided in a region surrounded by the substrate 510, the substrate 570, the sealing layer 560, and the sealant. Note that an inert gas (such as nitrogen or argon) may be used instead of the sealing layer 560. A drying agent may be provided in the inert gas so as to adsorb moisture or the like. For example, an epoxy-based resin or a glass frit is preferably used as the sealant. As a material used for the sealant, a material which is impermeable to moisture or oxygen is preferably used.

The display device 501 includes a pixel 502R. The pixel 502R includes a light-emitting module 580R.

The pixel 502R includes the light-emitting element 550R and a transistor 502$t$ that can supply electric power to the light-emitting element 550R. Note that the transistor 502$t$ functions as part of the pixel circuit. The light-emitting module 580R includes the light-emitting element 550R and a coloring layer 567R.

The light-emitting element 550R includes a lower electrode, an upper electrode, and an EL layer between the lower electrode and the upper electrode. As the light-emitting element 550R, any of the light-emitting elements described in any of the above Embodiments can be used, for example.

A microcavity structure may be employed between the lower electrode and the upper electrode so as to increase the intensity of light having a specific wavelength.

In the case where the sealing layer 560 is provided on the light extraction side, the sealing layer 560 is in contact with the light-emitting element 550R and the coloring layer 567R.

The coloring layer 567R is positioned in a region overlapping with the light-emitting element 550R. Accordingly, part of light emitted from the light-emitting element 550R passes through the coloring layer 567R and is emitted to the outside of the light-emitting module 580R as indicated by an arrow in FIG. 37A.

The display device 501 includes a light-blocking layer 567BM on the light extraction side. The light-blocking layer 567BM is provided so as to surround the coloring layer 567R.

The coloring layer 567R is a coloring layer having a function of transmitting light in a particular wavelength region. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an inkjet method, an etching method using a photolithography technique, or the like.

An insulating layer 521 is provided in the display device 501. The insulating layer 521 covers the transistor 502$t$. The insulating layer 521 covers unevenness caused by the pixel circuit to provide a flat surface. The insulating layer 521 may have a function of suppressing impurity diffusion. This can prevent the reliability of the transistor 502$t$ or the like from being lowered by impurity diffusion.

The light-emitting element 550R is formed over the insulating layer 521. A partition 528 is provided so as to overlap with an end portion of the lower electrode of the light-emitting element 550R. Note that a spacer for controlling the distance between the substrate 510 and the substrate 570 may be formed over the partition 528.

A gate line driver circuit 503$g$(1) includes a transistor 503$t$ and a capacitor 503$c$. Note that the driver circuit can be formed in the same process and over the same substrate as those of the pixel circuits.

The wirings 511 through which signals can be supplied are provided over the substrate 510. The terminal 519 is provided over the wirings 511. The FPC 509(1) is connected to the terminal 519. The FPC 509(1) is configured to supply a video signal, a clock signal, a start signal, a reset signal, or the like. Note that the FPC 509(1) may be provided with a printed wiring board (PWB).

Figure 37B:
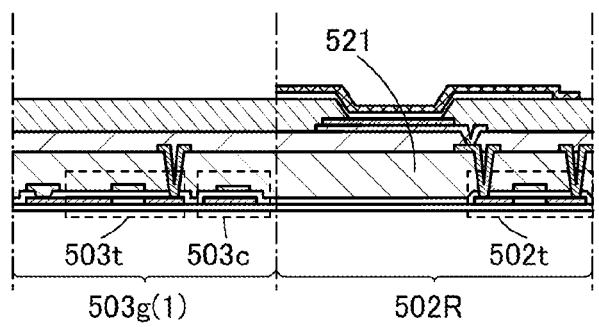

In the display device 501, transistors with any of a variety of structures can be used. FIG. 37A illustrates an example of using bottom-gate transistors; however, the present invention is not limited to this example, and top-gate transistors may be used in the display device 501 as illustrated in FIG. 37B.

The description in the above embodiment can be referred to for the structures of the transistor 502$t$ and 503$t$.

<Touch Sensor>

Figure 37C:
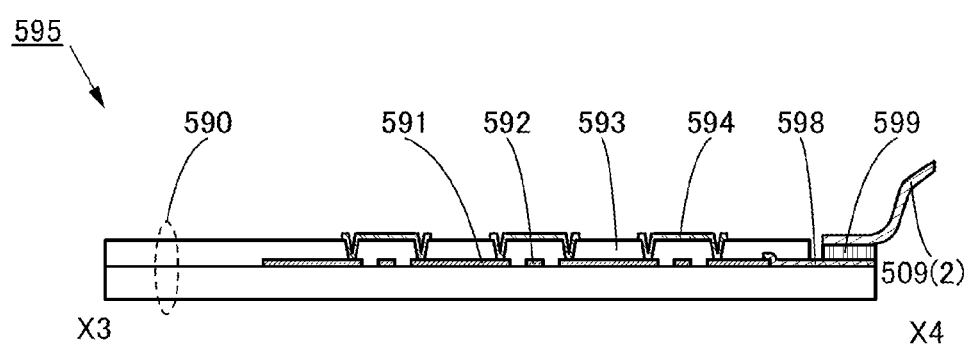

Next, the touch sensor 595 will be described in detail with reference to FIG. 37C. FIG. 37C corresponds to a cross-sectional view taken along dashed-dotted line X3-X4 in FIG. 36B.

The touch sensor 595 includes the electrodes 591 and the electrodes 592 provided in a staggered arrangement on the substrate 590, an insulating layer 593 covering the electrodes 591 and the electrodes 592, and the wiring 594 that connects the adjacent electrodes 591 to each other.

The electrodes 591 and the electrodes 592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film containing graphene oxide. As a reducing method, a method with application of heat or the like can be employed.

The electrodes 591 and the electrodes 592 may be formed by, for example, depositing a light-transmitting conductive material on the substrate 590 by a sputtering method and then removing an unnecessary portion by any of various pattern forming techniques such as photolithography.

Examples of a material for the insulating layer 593 are a resin such as an acrylic resin or an epoxy resin, a resin having a siloxane bond such as silicone, and an inorganic insulating material such as silicon oxide, silicon oxynitride, or aluminum oxide.

Openings reaching the electrodes 591 are formed in the insulating layer 593, and the wiring 594 connects the adjacent electrodes 591. A light-transmitting conductive material can be favorably used as the wiring 594 because the aperture ratio of the touch panel can be increased. Moreover, a material with higher conductivity than the conductivities of the electrodes 591 and 592 can be favorably used for the wiring 594 because electric resistance can be reduced.

One electrode 592 extends in one direction, and a plurality of electrodes 592 are provided in the form of stripes. The wiring 594 intersects with the electrode 592.

Adjacent electrodes 591 are provided with one electrode 592 provided therebetween. The wiring 594 connects the adjacent electrodes 591.

Note that the plurality of electrodes 591 are not necessarily arranged in the direction orthogonal to one electrode 592 and may be arranged to intersect with one electrode 592 at an angle of more than 0 degrees and less than 90 degrees.

The wiring 598 is connected to any of the electrodes 591 and 592. Part of the wiring 598 functions as a terminal. For the wiring 598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 593 and the wiring 594 may be provided to protect the touch sensor 595.

A connection layer 599 connects the wiring 598 to the FPC 509(2).

As the connection layer 599, any of anisotropic conductive films (ACF), anisotropic conductive pastes (ACP), and the like can be used.

<Description 2 of Touch Panel>

Figure 38A:
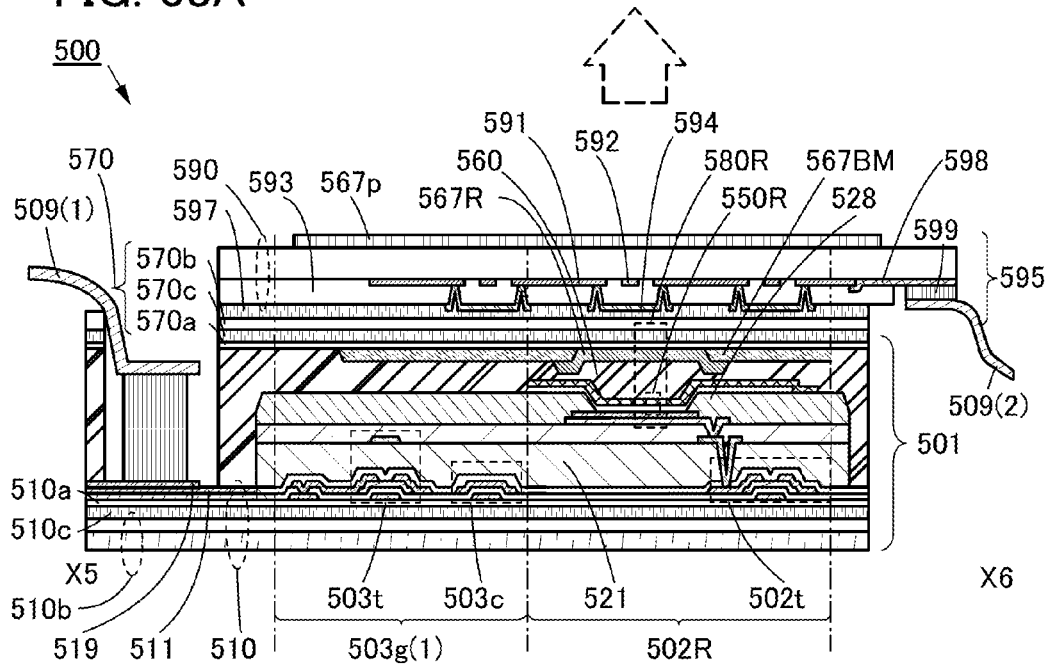
FIGS. 38A and 38B are cross-sectional views for explaining one embodiment of the present invention.

Next, the touch panel 500 will be described in detail with reference to FIG. 38A. FIG. 38A corresponds to a cross-sectional view taken along dashed-dotted line X5-X6 in FIG. 36A.

In the touch panel 500 illustrated in FIG. 38A, the display device 501 described with reference to FIG. 37A and the touch sensor 595 described with reference to FIG. 37C are attached to each other.

The touch panel 500 illustrated in FIG. 38A includes an adhesive layer 597 and an anti-reflective layer 567p in addition to the components described with reference to FIGS. 37A and 37C.

The adhesive layer 597 is provided in contact with the wiring 594. Note that the adhesive layer 597 attaches the substrate 590 to the substrate 570 so that the touch sensor 595 overlaps with the display device 501. The adhesive layer 597 preferably has a light-transmitting property. A heat curable resin or an ultraviolet curable resin can be used for the adhesive layer 597. For example, an acrylic resin, an urethane-based resin, an epoxy-based resin, or a siloxane-based resin can be used.

The anti-reflective layer 567p is positioned in a region overlapping with pixels. As the anti-reflective layer 567p, a circularly polarizing plate can be used, for example.

Next, a touch panel having a structure different from that illustrated in FIG. 38A will be described with reference to FIG. 38B.

Figure 38B:
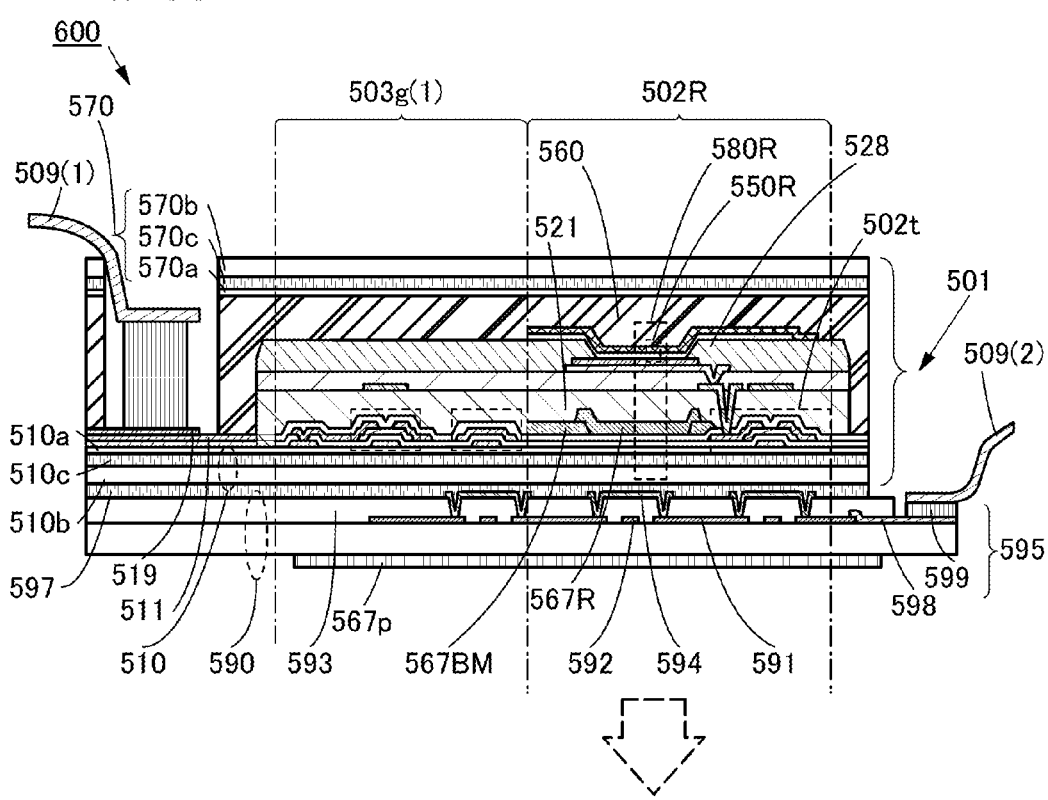

FIG. 38B is a cross-sectional view of a touch panel 600. The touch panel 600 illustrated in FIG. 38B differs from the touch panel 500 illustrated in FIG. 38A in the position of the touch sensor 595 relative to the display device 501. Different parts are described in detail below, and the above description of the touch panel 500 is referred to for the other similar parts.

The coloring layer 567R is positioned in a region overlapping with the light-emitting element 550R. The light-emitting element 550R illustrated in FIG. 38B emits light to the side where the transistor 502t is provided. Accordingly, part of light emitted from the light-emitting element 550R passes through the coloring layer 567R and is emitted to the outside of the light-emitting module 580R as indicated by an arrow in FIG. 38B.

The touch sensor 595 is provided on the substrate 510 side of the display device 501.

The adhesive layer 597 is provided between the substrate 510 and the substrate 590 and attaches the touch sensor 595 to the display device 501.

As illustrated in FIG. 38A or 38B, light may be emitted from the light-emitting element to one of or both of upper and lower sides of the substrate.

The display device and the electronic device described in this embodiment has any structure described in the above embodiments, so that external correction can be performed in parallel with display operation. Thus, the display device and the electronic device with small variation in luminance and small display unevenness can be obtained. Alternatively, the display device and the electronic device which are capable of high definition display can be obtained.

The structure described in this embodiment can be used in appropriate combination with the structure described in any of the other embodiments.

Embodiment 7

In this embodiment, a display module and an electronic device that can be formed using the display device described in the above embodiment are described.

<External View of Display Device>

Figure 39:
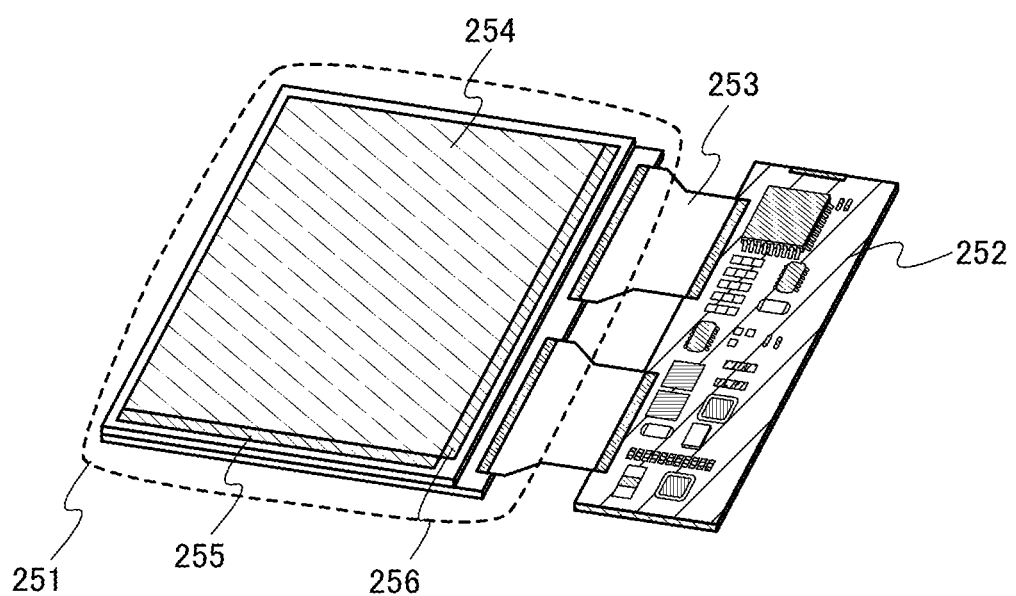
FIG. 39 is a perspective view for explaining one embodiment of the present invention.

FIG. 39 is a perspective view illustrating an example of an external view of a display device. The display device in FIG. 39 includes a panel 251; a circuit board 252 including a controller, a power supply circuit, an image processing circuit, an image memory, a CPU, and the like; and a connection portion 253. The panel 251 includes a pixel portion 254 including a plurality of pixels, a driver circuit 255 that selects pixels row by row, and a driver circuit 256 that controls input of a video signal to the pixels in a selected row.

A variety of signals and power supply potentials are input from the circuit board 252 to the panel 251 through the connection portion 253. As the connection portion 253, a flexible printed circuit (FPC) or the like can be used. In the case where a COF tape is used as the connection portion 253, part of circuits in the circuit board 252 or part of the driver circuit 255 or the driver circuit 256 included in the panel 251 may be formed on a chip separately prepared, and the chip may be connected to the COF tape by a chip-on-film (COF) method.

<Structural Example of Electronic Device>

The display device described in any of the above embodiments can be used for display devices, laptops, or image reproducing devices provided with recording media (typically devices which reproduce the content of recording media such as DVDs (digital versatile disc) and have displays for displaying the reproduced images). In addition to the above examples, as an electronic device which can include the display device described in the above embodiment, mobile phones, portable game machines, portable information terminals, e-book readers, cameras such as video cameras and digital still cameras, goggle-type displays (head mounted displays), navigation systems, audio reproducing devices (e.g., car audio components and digital audio players), copiers, facsimiles, printers, multifunction printers, automated teller machines (ATM), vending machines, and the like can be given. Specific examples of such an electronic device are illustrated in FIGS. 40A to 40F.

Figure 40A:
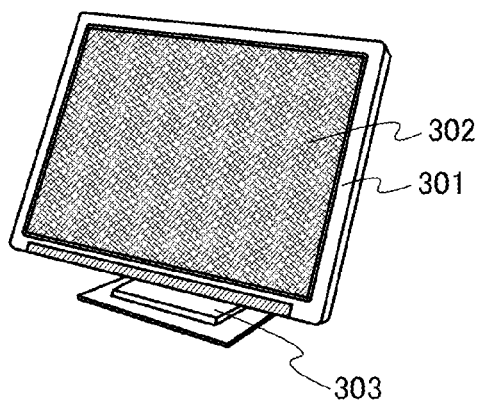
FIGS. 40A to 40F illustrate electronic devices.

FIG. 40A illustrates a display device including a housing 301, a display portion 302, a supporting base 303, and the like. The display device described in any of the above embodiments can be used in the display portion 302. Note that a display device includes all display devices for displaying information, such as display devices for personal computers, for receiving television broadcast, and for displaying advertisement, in its category.

Figure 40B:
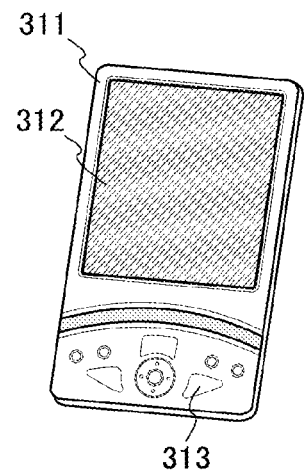

FIG. 40B illustrates a portable information terminal including a housing 311, a display portion 312, an operation key 313, and the like. The display device described in any of the above embodiments can be used in the display portion 312.

Figure 40C:
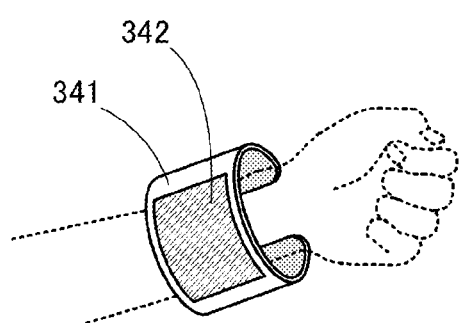

FIG. 40C illustrates a display device including a housing 341 having a curved surface, a display portion 342, and the like. When a flexible substrate is used in the display device described in any of the above embodiments, it is possible to use the display device in the display portion 342 supported by the housing 341 having a curved surface. Consequently, it is possible to provide a user-friendly display device that is flexible and lightweight.

Figure 40D:
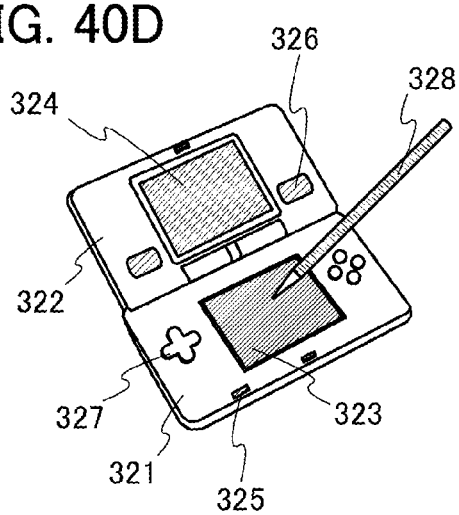

FIG. 40D illustrates a portable game machine including a housing 321, a housing 322, a display portion 323, a display portion 324, a microphone 325, speakers 326, an operation key 327, a stylus 328, and the like. The display device described in any of the above embodiments can be used in the display portion 323 or the display portion 324. When the display device described in any of the above embodiments is used in the display portion 323 or 324, it is possible to provide a user-friendly portable game machine with quality that hardly deteriorates. Although the portable game machine illustrated in FIG. 40D includes the two display portions 323 and 324, the number of display portions included in the portable game machine is not limited to two.

Figure 40E:
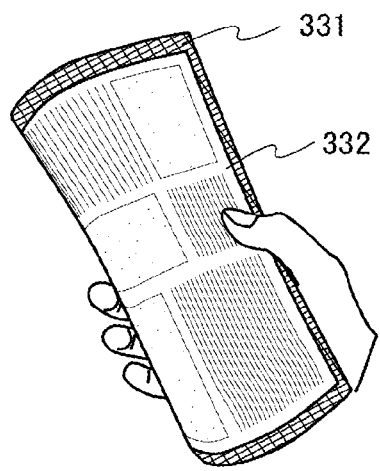

FIG. 40E illustrates an e-book reader including a housing 331, a display portion 332, and the like. The display device described in any of the above embodiments can be used in the display portion 332. When a flexible substrate is used, the display device can have flexibility, so that it is possible to provide a user-friendly e-book reader which is flexible and lightweight.

Figure 40F:
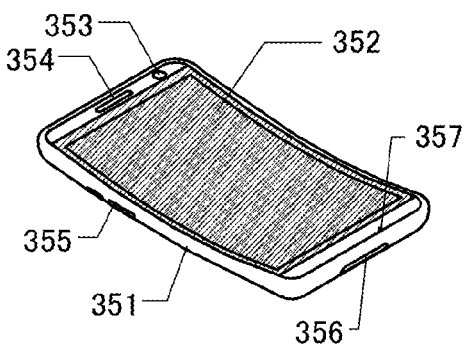

FIG. 40F illustrates a mobile phone including a display portion 352, a microphone 357, a speaker 354, a camera 353, an external connection port 356, and an operation button 355 in a housing 351. The display device described in any of the above-described embodiments can be used in the display portion 352. When the display device described in any of the above embodiments is provided over a flexible substrate, the display device can be used as the display portion 352 having a curved surface as illustrated in FIG. 40F.

By using the display device described in any of the above embodiments in the electronic device of this embodiment, external correction can be performed in parallel with display operation. Thus, an electronic device with small variation in luminance and small display unevenness can be obtained. An electronic device capable of high definition display can be obtained.

The structure described above in this embodiment can be combined as appropriate with any of the structures described in the other embodiments.

(Supplementary Notes on the Description in this Specification and the Like)

The following are notes on the description of the above embodiments and structures in the embodiments.

<Notes on One Embodiment of the Present Invention Described in Embodiments>

One embodiment of the present invention can be constituted by appropriately combining the structure described in an embodiment with any of the structures described the other embodiments. In addition, in the case where a plurality of structure examples are described in one embodiment, some of the structure examples can be combined as appropriate.

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

In each Embodiment, one embodiment of the present invention has been described; however, one embodiment of the present invention is not limited to the described embodiments. For example, a structure in which a light-emitting element is used as an example of a display element is described in the above embodiment; however, one embodiment of the invention is not limited to that structure. Another display element, e.g., a liquid crystal element, may be used depending on conditions. A structure in which data on the threshold voltage is read out in the blanking period is described in the above embodiments; however, one embodiment of the present invention is not limited thereto. Data on transistors may be read out in a period other than the blanking period depending on conditions. Furthermore, a structure in which data on current characteristics of driving transistors in pixels is read out is described in the above embodiments; however, one embodiment of the present invention is not limited thereto. Depending on conditions, data on current characteristics of transistors other than the driving transistors may be read out, for example. Alternatively, depending on circumstances or conditions, data on current characteristics of the transistors is not necessarily read out. Alternatively, depending on circumstances or conditions, external correction is not necessarily performed.

<Notes on the Description for Drawings>

In this specification and the like, terms for explaining arrangement, such as "over" and "under", are used for convenience to describe the positional relation between components with reference to drawings. Furthermore, the positional relation between components is changed as appropriate in accordance with a direction in which the components are described. Therefore, the terms for explaining arrangement are not limited to those used in this specification and may be changed to other terms as appropriate depending on the situation.

The term "over" or "below" does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is concerned with a plurality of functions or a case in which a plurality of circuits are concerned with one function. Therefore, the segmentation of blocks in the block diagram is not limited by the components described in the specification, and can be differently determined as appropriate depending on situations.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as plan views (also referred to as layout views) and perspective views, some of components might not be illustrated for clarity of the drawings.

<Notes on Expressions that can be Rephrased>

In this specification or the like, in describing connections of a transistor, one of a source and a drain is referred to as "one of a source and a drain" (or a first electrode or a first terminal), and the other of the source and the drain is referred to as "the other of the source and the drain" (or a second electrode or a second terminal). This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit a function of the component. For example, an "electrode" is used as part of a "wiring" in some cases, and vice versa. Further, the term "electrode" or "wiring" can also mean a combination of a plurality of "electrodes" and "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and the potential applied to a wiring or the like is changed depending on the reference potential, in some cases.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

<Notes on Definitions of Terms>

The following are definitions of the terms that are not mentioned in the above embodiments.

[Switch]

In this specification and the like, a switch is conducting (on state) or not conducting (off state) to determine whether current flows therethrough or not. Alternatively, a switch has a function of selecting and changing a current path.

Examples of a switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

An example of a mechanical switch is a switch formed using a micro electro mechanical system (MEMS) technology, such as a digital micromirror device (DMD). Such a switch includes an electrode which can be moved mechanically, and operates by controlling conduction and non-conduction in accordance with movement of the electrode.

[Channel Length]

In this specification and the like, the channel length refers to, for example, a distance between a source and a drain in a region where a semiconductor (or a portion where a current flows in a semiconductor when a transistor is on) and a gate overlap with each other or a region where a channel is formed in a plan view of the transistor.

In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

[Channel Width]

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed in a plan view of the transistor.

In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

[Pixel]

In this specification and the like, one pixel refers to one element whose brightness can be controlled, for example. Therefore, for example, one pixel expresses one color element by which brightness is expressed. Accordingly, in the case of a color display device formed of color elements of R (red), G (green), and B (blue), the smallest unit of an image is formed of three pixels of an R pixel, a G pixel, and a B pixel.

Note that the number of color elements is not limited to three, and more color elements may be used. For example, RGBW (W: white), RGB added with yellow, cyan, or magenta, and the like may be employed.

This application is based on Japanese Patent Application serial no. 2014-240703 filed with Japan Patent Office on Nov. 28, 2014, the entire contents of which are hereby incorporated by reference.

What is claimed is:

1. A semiconductor device comprising:
    a first pixel comprising a first transistor and a first light-emitting element electrically connected to the first transistor; and
    a second pixel comprising a second transistor and a second light-emitting element electrically connected to the second transistor,
    wherein the semiconductor device is configured to perform a first operation of inputting a reading signal for reading out data on current characteristics of the first transistor to the first pixel when the first pixel is displayed in black, and
    wherein the semiconductor device is configured to perform a second operation of reading out the data and inputting a video signal to the second pixel.

2. The semiconductor device according to claim 1, further comprising:
a driver circuit,
wherein the driver circuit is configured to supply the reading signal and the video signal.

3. The semiconductor device according to claim 1, further comprising:
a reading circuit on the outside of a pixel portion including the first pixel and the second pixel,
wherein the reading circuit is configured to read out the data.

4. The semiconductor device according to claim 1, wherein the inputting of the video signal is performed in a period in which the reading out of the data is performed.

5. The semiconductor device according to claim 1, wherein the reading out of the data is performed from a period when the second operation is performed until the first pixel is selected in a next frame period.

6. The semiconductor device according to claim 1, wherein the data is a current flowing through the first transistor or a threshold voltage of the first transistor.

7. A display device comprising:
the semiconductor device according to claim 1; and
at least one of a CPU, an image processing circuit, and a memory.

8. An electronic device comprising:
the semiconductor device according to claim 1; and
at least one of a housing, a microphone, a speaker, and an operation key.

9. A semiconductor device comprising:
a first pixel comprising a first transistor and a first light-emitting element electrically connected to the first transistor;
a second pixel comprising a second transistor and a second light-emitting element electrically connected to the second transistor; and
a third pixel comprising a third transistor and a third light-emitting element electrically connected to the third transistor,
wherein the first pixel and the third pixel are electrically connected to the same selection line,
wherein the semiconductor device is configured to perform a first operation of inputting a reading signal for reading out data on current characteristics of the first transistor to the first pixel and inputting a signal for making a non-display state to the third pixel when the first pixel and the third pixel are displayed in black, and
wherein the semiconductor device is configured to perform a second operation of reading out the data and inputting a video signal to the second pixel.

10. The semiconductor device according to claim 9, further comprising:
a driver circuit,
wherein the driver circuit is configured to supply the reading signal, the signal for making the non-display state, and the video signal.

11. The semiconductor device according to claim 9, further comprising:
a reading circuit on the outside of a pixel portion including the first pixel, the second pixel, and the third pixel,
wherein the reading circuit is configured to read out the data.

12. The semiconductor device according to claim 9,
wherein the first transistor and the third transistor are electrically connected to the same wiring, and
wherein the reading out of the data is performed through the wiring.

13. The semiconductor device according to claim 9, wherein the inputting of the video signal is performed in a period in which the reading out of the data is performed.

14. The semiconductor device according to claim 9, wherein the reading out of the data is performed from a period when the second operation is performed until the first pixel is selected in a next frame period.

15. The semiconductor device according to claim 9, wherein the data is a current flowing through the first transistor or a threshold voltage of the first transistor.

16. A display device comprising:
the semiconductor device according to claim 9; and
at least one of a CPU, an image processing circuit, and a memory.

17. An electronic device comprising:
the semiconductor device according to claim 9; and
at least one of a housing, a microphone, a speaker, and an operation key.

18. The semiconductor device according to claim 1, wherein a state where the first pixel is displayed in black indicates a non-display state or a state of a zero gray level.

19. The semiconductor device according to claim 9, wherein a state where the first pixel and the third pixel are displayed in black indicates a non-display state or a state of a zero gray level.

* * * * *